(12) United States Patent
Chang et al.

(10) Patent No.: US 12,336,226 B2
(45) Date of Patent: Jun. 17, 2025

(54) SEMICONDUCTOR DEVICE STRUCTURE INCLUDING STACKED NANOSTRUCTURES

(71) Applicant: Taiwan Semiconductor Manufacturing Company, Ltd., Hsinchu (TW)

(72) Inventors: Jung-Hung Chang, Changhua County (TW); Zhi-Chang Lin, Zhubei (TW); Shih-Cheng Chen, New Taipei (TW); Chien-Ning Yao, Hsinchu (TW); Tsung-Han Chuang, Tainan (TW); Kai-Lin Chuang, Chia-Yi (TW); Kuo-Cheng Chiang, Zhubei (TW); Chih-Hao Wang, Baoshan Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 489 days.

(21) Appl. No.: 17/686,139

(22) Filed: Mar. 3, 2022

(65) Prior Publication Data
US 2023/0113269 A1    Apr. 13, 2023

Related U.S. Application Data

(60) Provisional application No. 63/255,129, filed on Oct. 13, 2021.

(51) Int. Cl.
H10D 30/67    (2025.01)
H01L 21/02    (2006.01)
(Continued)

(52) U.S. Cl.
CPC ..... *H10D 30/6757* (2025.01); *H01L 21/0259* (2013.01); *H10D 30/014* (2025.01);
(Continued)

(58) Field of Classification Search
CPC .......... H01L 29/78696; H01L 29/0653; H01L 29/0665; H01L 29/42392; H01L 29/78618;
(Continued)

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |

(Continued)

OTHER PUBLICATIONS

U.S. Office Action for U.S. Appl. No. 17/685,584, dated Apr. 17, 2025.

*Primary Examiner* — Ida M Soward
(74) *Attorney, Agent, or Firm* — Birch, Stewart, Kolasch & Birch, LLP

(57) ABSTRACT

A semiconductor device structure is provided. The semiconductor device structure includes a plurality of first nanostructures stacked over a substrate in a vertical direction. The semiconductor device structure also includes a first bottom layer formed adjacent to the first nanostructures, and a first dielectric liner layer formed over the first bottom layer and adjacent to the first nanostructures. The semiconductor device structure further includes a first source/drain (S/D) structure formed over the first dielectric liner layer, and the first S/D structure is isolated from the first bottom layer by the first dielectric liner layer.

20 Claims, 46 Drawing Sheets

(51) Int. Cl.
*H10D 30/01* (2025.01)
*H10D 30/43* (2025.01)
*H10D 62/10* (2025.01)
*H10D 62/13* (2025.01)
*H10D 64/01* (2025.01)
*H10D 84/01* (2025.01)
*H10D 84/03* (2025.01)
*H10D 84/85* (2025.01)

(52) U.S. Cl.
CPC .......... *H10D 30/43* (2025.01); *H10D 30/6713* (2025.01); *H10D 30/6735* (2025.01); *H10D 62/116* (2025.01); *H10D 62/121* (2025.01); *H10D 62/151* (2025.01); *H10D 64/017* (2025.01); *H10D 84/0167* (2025.01); *H10D 84/017* (2025.01); *H10D 84/0188* (2025.01); *H10D 84/038* (2025.01); *H10D 84/85* (2025.01); *H10D 30/019* (2025.01); *H10D 30/435* (2025.01); *H10D 62/119* (2025.01)

(58) Field of Classification Search
CPC ............. H01L 29/0673; H01L 29/7853; H01L 29/7854; H01L 29/78687; H01L 27/092; H01L 2924/13061; H10D 30/019; H10D 30/43; H10D 30/435; H10D 62/119
See application file for complete search history.

(56) References Cited

U.S. PATENT DOCUMENTS

| | | | |
|---|---|---|---|
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,837,414 B1 | 12/2017 | Balakrishnan et al. | |
| 10,170,638 B1 * | 1/2019 | Reznicek | H01L 29/0649 |
| 10,236,217 B1 | 3/2019 | Ando et al. | |
| 10,453,824 B1 * | 10/2019 | Mochizuki | H01L 21/32139 |
| 10,468,311 B2 * | 11/2019 | Reznicek | H01L 27/0688 |
| 10,522,616 B2 * | 12/2019 | Cho | H01L 29/0673 |
| 11,810,964 B2 * | 11/2023 | Suh | H01L 29/66439 |
| 12,159,912 B2 * | 12/2024 | Chang | H01L 29/78696 |
| 2017/0110554 A1 * | 4/2017 | Tak | H01L 29/42392 |
| 2017/0222006 A1 * | 8/2017 | Suh | H01L 29/42376 |
| 2018/0301564 A1 * | 10/2018 | Kwon | H01L 29/0653 |
| 2019/0221638 A1 * | 7/2019 | Reznicek | H01L 29/66439 |
| 2019/0221640 A1 * | 7/2019 | Reznicek | H01L 29/167 |
| 2022/0059703 A1 * | 2/2022 | More | H01L 21/823418 |
| 2022/0181498 A1 * | 6/2022 | Kim | H01L 29/0847 |
| 2023/0009820 A1 * | 1/2023 | Yen | H01L 29/66545 |
| 2023/0028900 A1 | 1/2023 | Lin et al. | |
| 2023/0037957 A1 | 2/2023 | Thomas et al. | |
| 2023/0068065 A1 * | 3/2023 | Khaderbad | H01L 29/42392 |
| 2023/0113269 A1 | 4/2023 | Chang et al. | |
| 2023/0197856 A1 | 6/2023 | Chen et al. | |
| 2024/0372007 A1 * | 11/2024 | More | H01L 29/7848 |

* cited by examiner

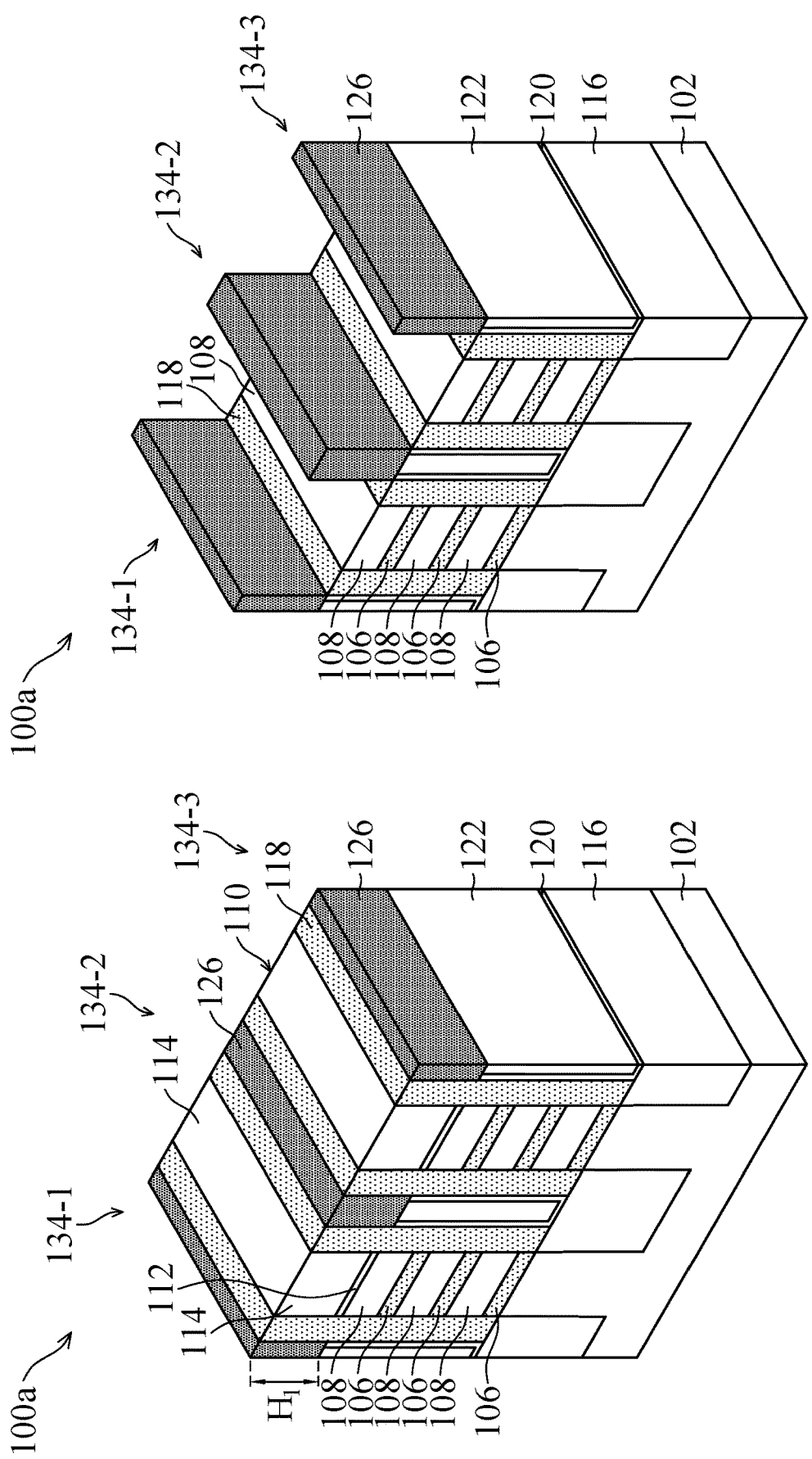

SEMICONDUCTOR DEVICE STRUCTURE INCLUDING STACKED NANOSTRUCTURES

CROSS REFERENCE TO RELATED APPLICATIONS

This application claims the benefit of U.S. Provisional Application No. 63/255,129 filed on Oct. 13, 2021, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

Although existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A to 2L illustrate perspective views of intermediate stages of manufacturing a semiconductor structure, in accordance with some embodiments.

FIG. 3A-1-3O-1 show cross-sectional representations of various stages of forming the semiconductor device structure along line $X_1$-$X_1'$ and $X_2$-$X_2'$ shown in FIG. 2K, in accordance with some embodiments of the disclosure.

FIG. 3A-2-3O-2 show cross-sectional representations of various stages of forming the semiconductor device structure along line Y-Y' shown in FIG. 2K, in accordance with some embodiments of the disclosure.

FIG. 3A'-2-3O'-2 show cross-sectional representations of various stages of forming a semiconductor device structure.

FIGS. 4A-1-4D-1 show cross-sectional representations of various stages of forming a semiconductor device structure, in accordance with some embodiments of the disclosure.

FIGS. 4A-2-4D-2 show cross-sectional representations of various stages of forming the semiconductor device structure, in accordance with some embodiments of the disclosure.

FIGS. 4A'-2-4D'-2 show cross-sectional representations of various stages of forming the semiconductor device structure.

FIGS. 5A-1-5K-1 show cross-sectional representations of various stages of forming a semiconductor device structure, in accordance with some embodiments of the disclosure.

FIGS. 5A-2-5K-2 show cross-sectional representations of various stages of forming the semiconductor device structure, in accordance with some embodiments of the disclosure.

FIGS. 5A'-2-5K'-2 show cross-sectional representations of various stages of forming the semiconductor device structure.

FIGS. 6A-1-6D-1 show cross-sectional representations of various stages of forming a semiconductor device structure, in accordance with some embodiments of the disclosure.

FIGS. 6A-2-6D-2 show cross-sectional representations of various stages of forming the semiconductor device structure, in accordance with some embodiments of the disclosure.

FIGS. 6A'-2-6D'-2 show cross-sectional representations of various stages of forming the semiconductor device structure.

DETAILED DESCRIPTION

Figure 1:
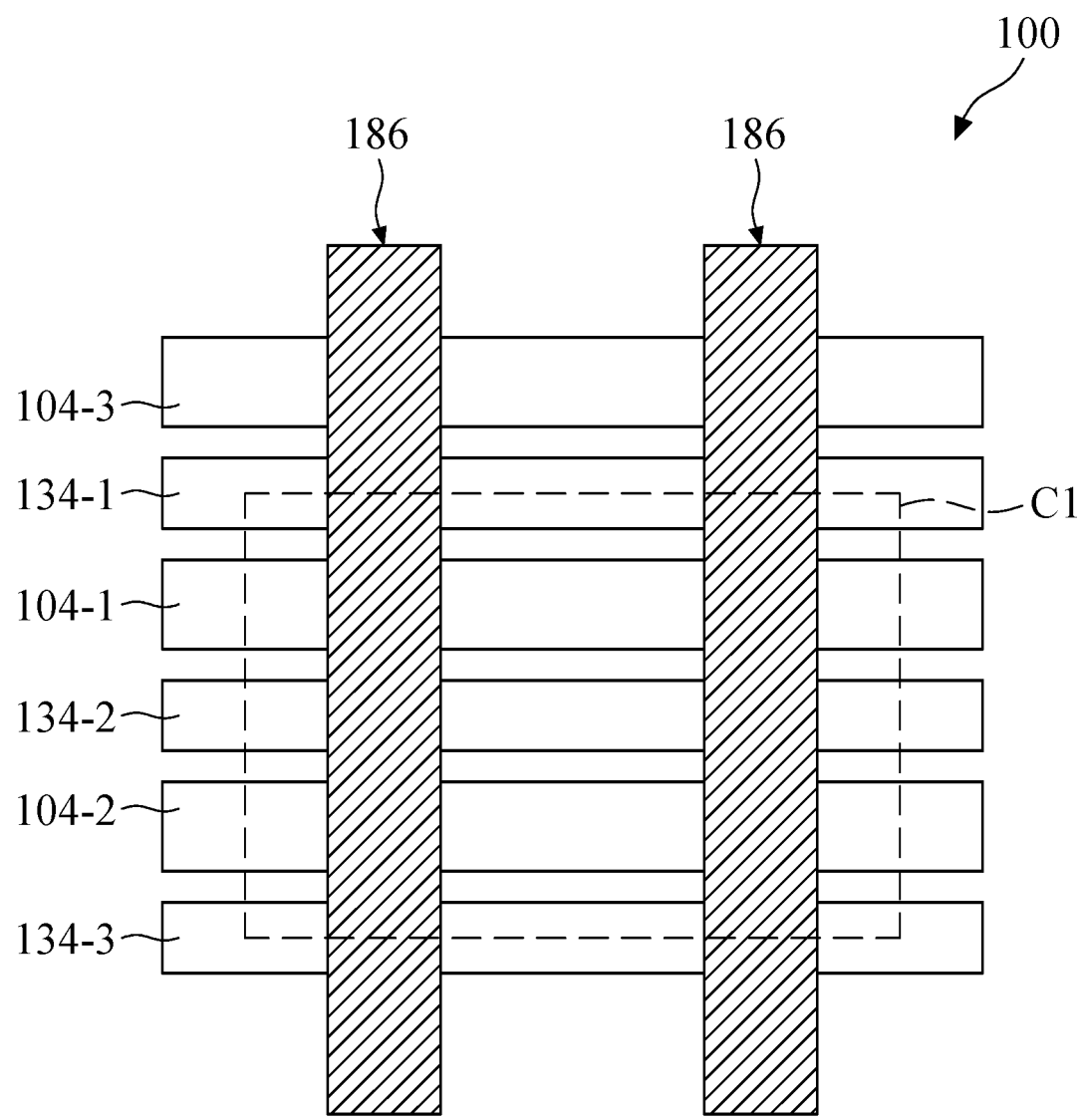
FIG. 1 shows a top view of a semiconductor structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. The semiconductor device structure may include nanostructures formed over a substrate and a gate structure wraps around the nanostructures. The dielectric liner layer is formed adjacent to the nanostructure, and the S/D structure is formed over the dielectric liner layer. The dielectric liner layer is used to define the effective (or active) number of the nanostructures to control the effective width of the channel. In addition, the insulating layer may be formed over the dielectric liner layer to insulate the S/D structure and the underlying layers to further define the effective (or active) number of the nanostructures.

FIG. 1 shows a top view of a semiconductor structure 100, in accordance with some embodiments. FIG. 1 has been simplified for the sake of clarity to better understand the inventive concepts of the present disclosure. Additional features may be added in the semiconductor structure 100, and some of the features described below may be replaced, modified, or eliminated.

The semiconductor structure 100 may include multi-gate devices and may be included in a microprocessor, a memory, or other IC devices. For example, the semiconductor structure 100 may be a portion of an IC chip that include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or combinations thereof.

FIGS. 2A to 2L illustrate perspective views of intermediate stages of manufacturing a semiconductor structure 100a in accordance with some embodiments. More specifically, FIGS. 2A to 2L illustrate diagrammatic perspective views of intermediate stages of manufacturing the semiconductor structure 100a shown in the dotted line block $C_1$ of FIG. 1.

Figure 2B:
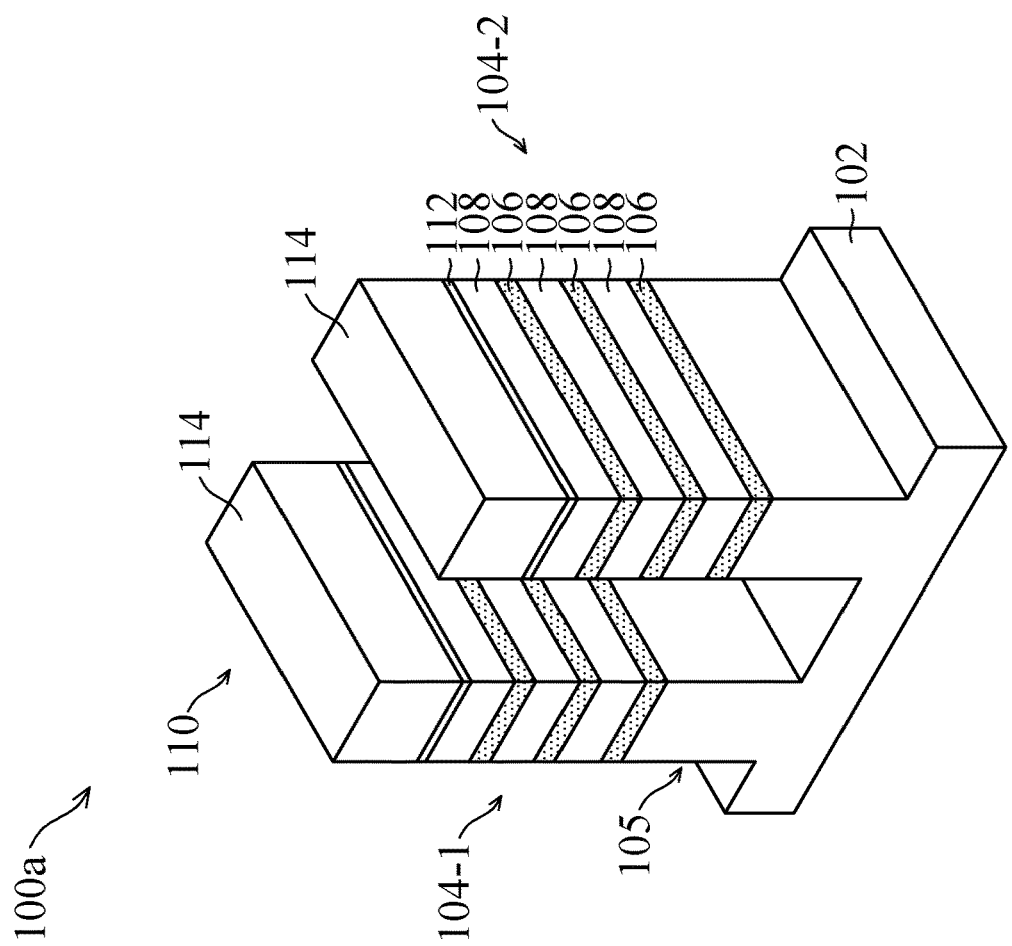
Figure 2A:
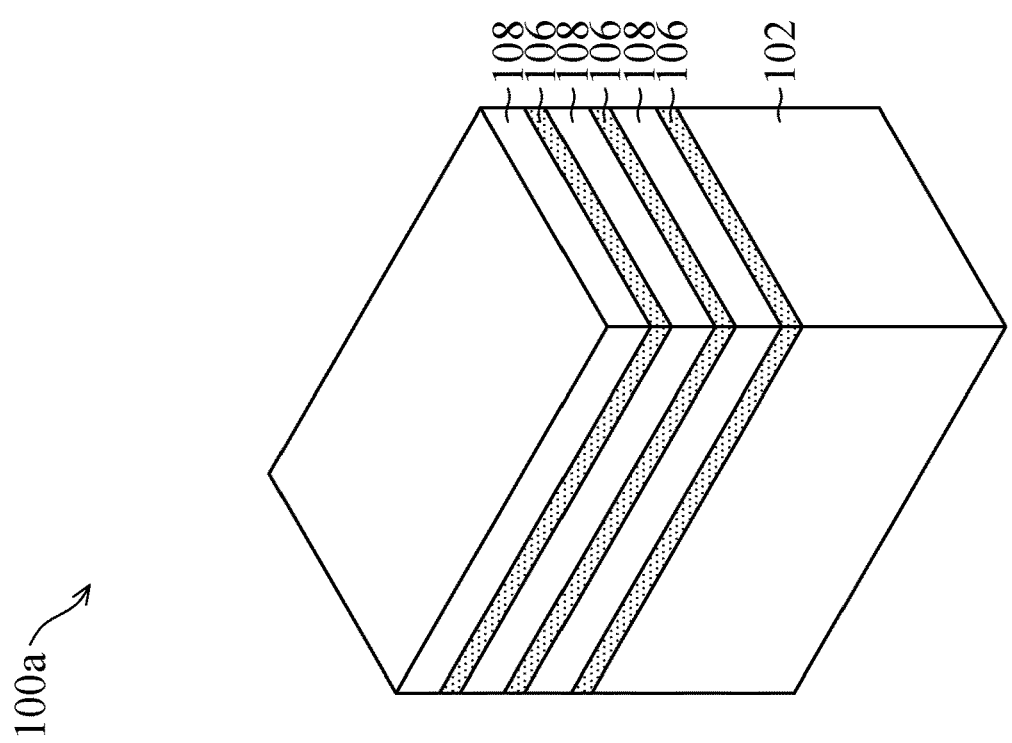

As shown in FIG. 2A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of first semiconductor layers 106 and a number of second semiconductor layers 108 are sequentially alternately formed over the substrate 102. The first semiconductor layers 106 and the second semiconductor layers 108 are vertically stacked to form a stacked nanostructures structure (or a stacked nanosheet or a stacked nanowire).

In some embodiments, the first semiconductor layers 106 and the second semiconductor layers 108 independently include silicon (Si), germanium (Ge), silicon germanium ($Si_{1-x}Ge_x$, $0.1<x<0.7$, the value x is the atomic percentage of germanium (Ge) in the silicon germanium), indium arsenide (InAs), indium gallium arsenide (InGaAs), indium antimonide (InSb), or another applicable material. In some embodiments, the first semiconductor layer 106 and the second semiconductor layer 108 are made of different materials.

The first semiconductor layers 106 and the second semiconductor layers 108 are made of different materials having different lattice constant. In some embodiments, the first semiconductor layer 106 is made of silicon germanium ($Si_{1-x}Ge_x$, $0.1<x<0.7$), and the second semiconductor layer 108 is made of silicon (Si). In some other embodiments, the first semiconductor layer 106 is made of silicon (Si), and the second semiconductor layer 108 is made of silicon germanium ($Si_{1-x}Ge_x$, $0.1<x<0.7$).

In some embodiments, the first semiconductor layers 106 and the second semiconductor layers 108 are formed by a selective epitaxial growth (SEG) process, a chemical vapor deposition (CVD) process (e.g. low-pressure CVD (LPCVD), plasma enhanced CVD (PECVD)), a molecular epitaxy process, or another applicable process. In some embodiments, the first semiconductor layers 106 and the second semiconductor layers 108 are formed in-situ in the same chamber.

In some embodiments, the thickness of each of the first semiconductor layers 106 is in a range from about 1.5 nanometers (nm) to about 20 nm. Terms such as "about" in conjunction with a specific distance or size are to be interpreted as not to exclude insignificant deviation from the specified distance or size and may include for example deviations of up to 20%. In some embodiments, the first semiconductor layers 106 are substantially uniform in thickness. In some embodiments, the thickness of each of the second semiconductor layers 108 is in a range from about 1.5 nm to about 20 nm. In some embodiments, the second semiconductor layers 108 are substantially uniform in thickness.

Then, as shown in FIG. 2B, the first semiconductor layers 106 and the second semiconductor layers 108 are patterned to form fin structures 104-1 and 104-2, in accordance with some embodiments of the disclosure. In some embodiments, the fin structures 104-1 and 104-2 include base fin structures 105 and the semiconductor material stacks, including the first semiconductor layers 106 and the second semiconductor layers 108, formed over the base fin structure 105.

In some embodiments, the patterning process includes forming mask structures 110 over the semiconductor material stack, and etching the semiconductor material stack and the underlying substrate 102 through the mask structure 110. In some embodiments, the mask structures 110 are a multilayer structure including a pad oxide layer 112 and a nitride layer 114 formed over the pad oxide layer 112. The pad oxide layer 112 may be made of silicon oxide, which may be formed by thermal oxidation or CVD, and the nitride layer 114 may be made of silicon nitride, which may be formed by CVD, such as LPCVD or plasma-enhanced CVD (PECVD).

Figures 2C, 2D:
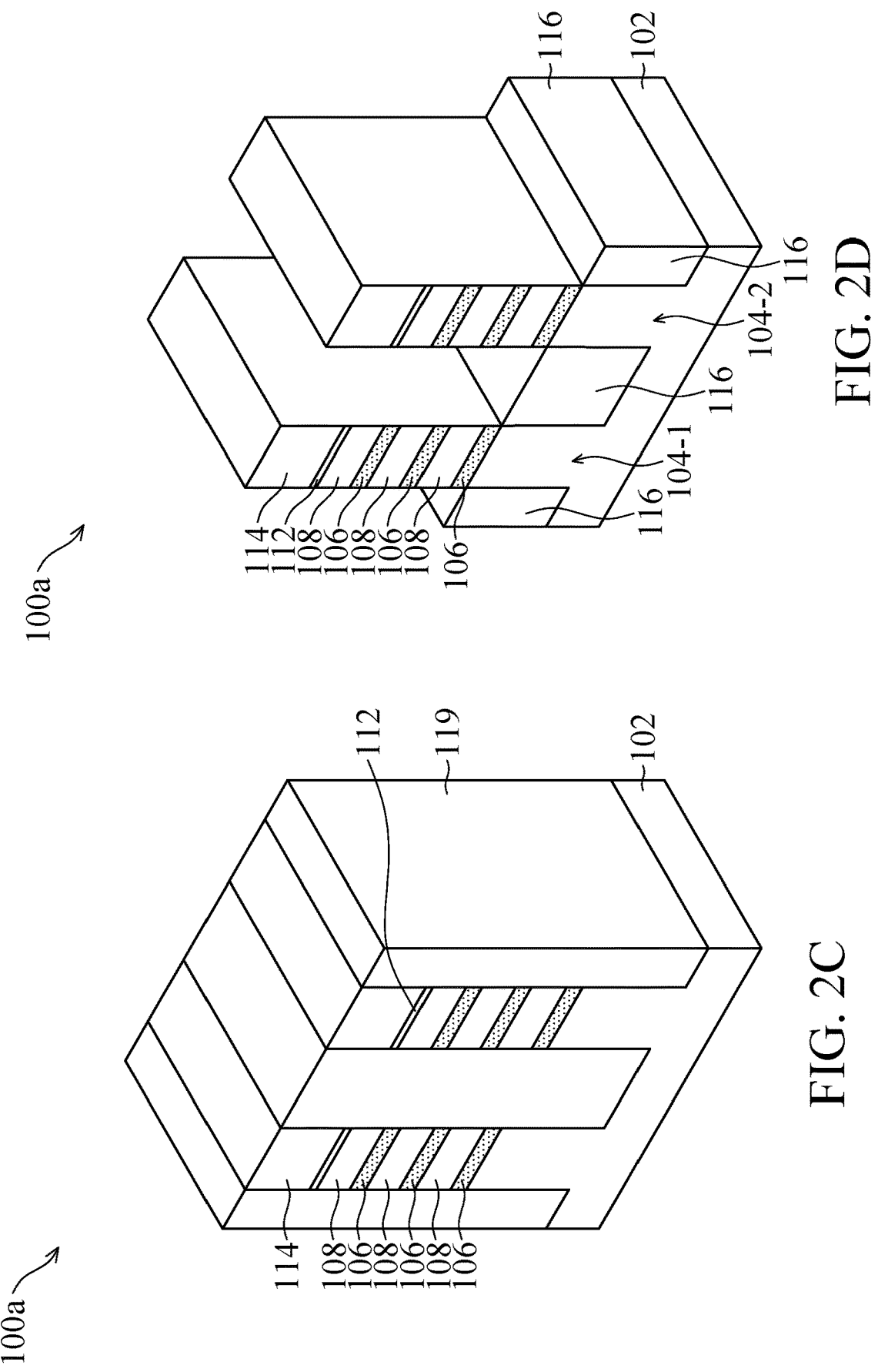

Afterwards, as shown in FIG. 2C, a liner (not shown) is formed to cover the fin structures 104-1 and 104-2, and an insulating layer 119 is formed around the fin structures 104-1 and 104-2 over the liner, in accordance with some embodiments of the disclosure. In some embodiments, the liner is made of an oxide layer and a nitride layer. In some embodiments, the liner is omitted. In some embodiments, the insulating layer 119 is made of silicon oxide, silicon nitride, silicon oxynitride (SiON), another suitable insulating material, or a combination thereof.

Afterwards, as shown in FIG. 2D, the insulating layer 119 is recessed to form an isolation structure 116, in accordance with some embodiments. The isolation structure 116 is configured to electrically isolate active regions (e.g. the fin structures 104-1 and 104-2) of the semiconductor structure and is also referred to as shallow trench isolation (STI) feature in accordance with some embodiments.

Figure 2F:
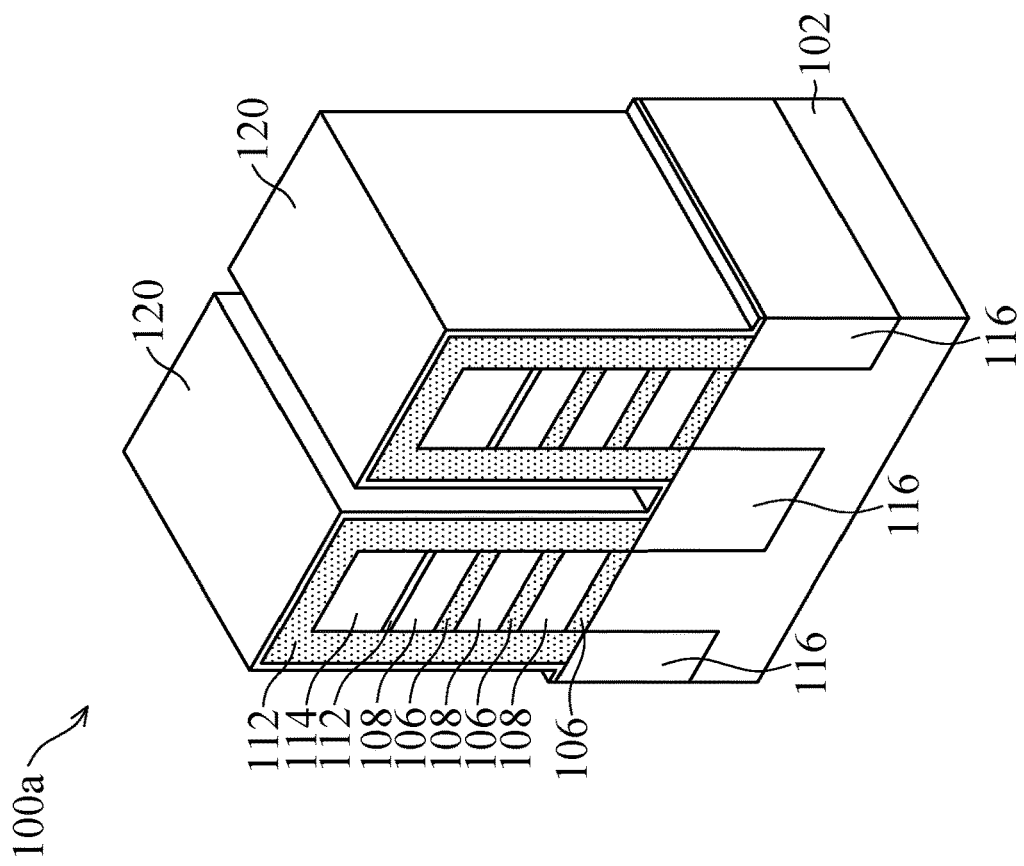
Figure 2E:
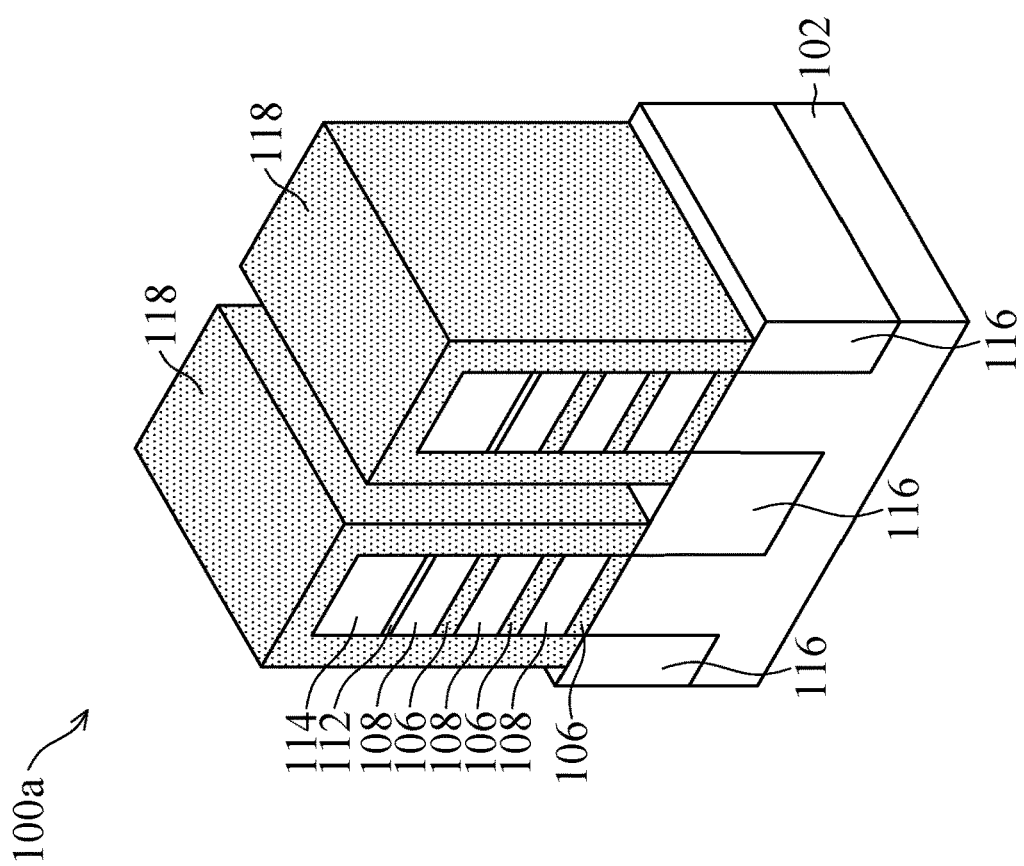

Afterwards, as shown in FIG. 2E, the isolation structure 116 is formed, cladding layers 118 are formed over the top surfaces and the sidewalls of the fin structures 104-1 and 104-2 over the isolation structure 116, in accordance with some embodiments. In some embodiments, the cladding layers 118 are made of semiconductor materials. In some embodiments, the cladding layers 118 are made of silicon germanium (SiGe). In some embodiments, the cladding layers 118 and the first semiconductor layers 106 are made of the same semiconductor material.

The cladding layer 118 may be formed by performing an epitaxy process, such as Vapor phase epitaxy (VPE) and/or ultra high vacuum chemical vapor deposition (UHV) CVD, molecular beam epitaxy, other applicable epitaxial growth processes, or combinations thereof. After the cladding layers 118 are deposited, an etching process may be performed to remove the portion of the cladding layer 118 not formed on the sidewalls of the fin structures 104-1 and 104-2, for example, using a plasma dry etching process. In some embodiments, the portions of the cladding layers 118 formed on the top surface of the fin structures 104-1 and 104-2 are partially or completely removed by the etching process, such that the thickness of the cladding layer 118 over the top surface of the fin structures 104-1 and 104-2 is thinner than the thickness of the cladding layer 118 on the sidewalls of the fin structures 104-1 and 104-2.

Before the cladding layers 118 are formed, a semiconductor liner (not shown) may be formed over the fin structures 104-1 and 104-2. The semiconductor liner may be a Si layer and may be incorporated into the cladding layers 118 during the epitaxial growth process for forming the cladding layers 118.

Next, as shown in FIG. 2F, a liner layer 120 is formed over the cladding layers 118 and the isolation structure 116, in accordance with some embodiments. In some embodiments, the liner layer 120 is made of a low k dielectric material having a k value lower than 7. In some embodiments, the liner layer 120 is made of SiN, SiCN, SiOCN, SiON, or the like. The liner layer 120 may be deposited using CVD, PVD, ALD, HDPCVD, MOCVD, RPCVD, PECVD, LPCVD, ALCVD, APCVD, other applicable methods, or combinations thereof. In some embodiments, the liner layer 120 has a thickness in a range from about 2 nm to about 8 nm.

Figure 2H:
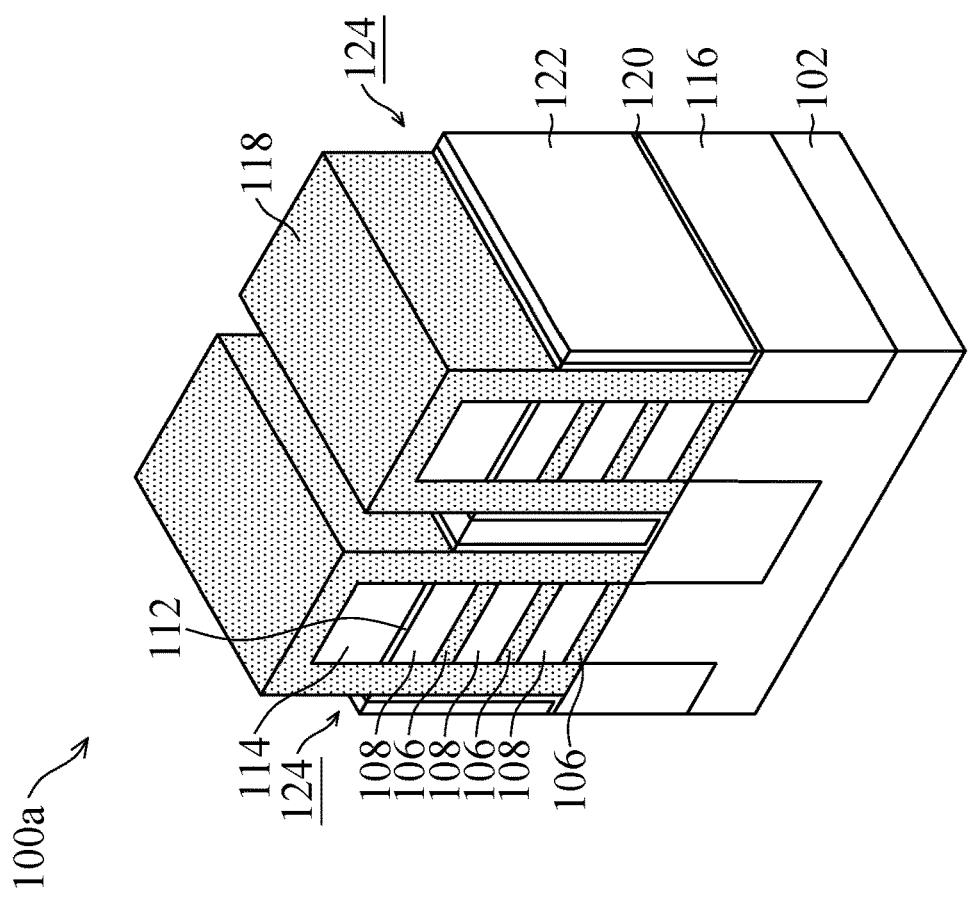
Figure 2G:
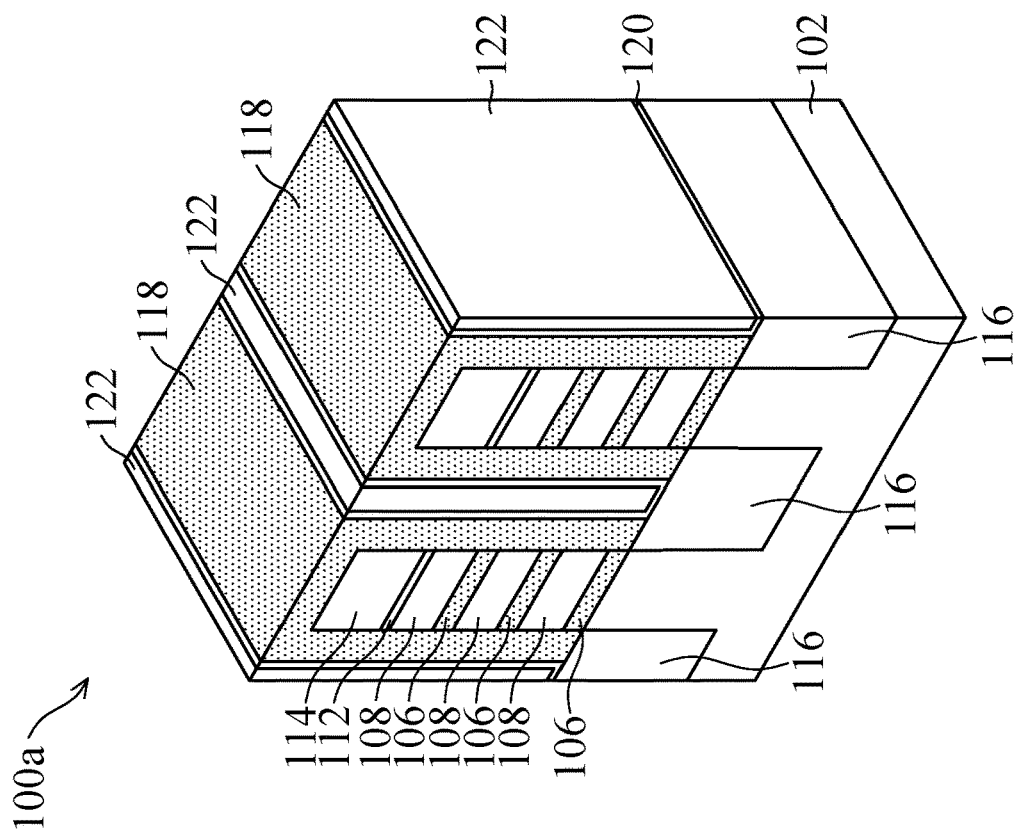

Next, as shown in FIG. 2G, a filling layer 122 is formed over the liner layer 120, in accordance with some embodiments. After the liner layer 120 is formed, the filling layer 122 is formed over the liner layer 120 to completely fill the spaces between the adjacent fin structures 104-1 and 104-2, and a polishing process is performed until the top surfaces of the cladding layers 118 are exposed, in accordance with some embodiments.

In some embodiments, the filling layer 122 and the liner layer 120 are both made of oxide but are formed by different methods. In some embodiments, the filling layer 122 is made of SiN, SiCN, SiOCN, SiON, or the like. The filling layer 122 may be deposited using a flowable CVD (FCVD) process that includes, for example, depositing a flowable material (such as a liquid compound) and converting the flowable material to a solid material by a suitable technique, such as thermal annealing and/or ultraviolet radiation treating.

Next, as shown in FIG. 2H, recesses 124 are formed between the fin structures 104-1 and 104-2, in accordance with some embodiments. In some embodiments, the filling layer 122 and the liner layer 120 are recessed by performing an etching process. In some embodiments, the filling layer 122 are formed using a flowable CVD process, so that the resulting filling layer 122 can have a relatively flat top surface after the etching process is performed.

Afterwards, as shown in FIG. 2I, a cap layer 126 is formed in the recesses 124, thereby forming dielectric features 134, in accordance with some embodiments. In some embodiments, the dielectric features 134 include dielectric features 134-1, 134-2, and 134-3 at opposite sides of the fin structures 104-1 and 104-2. In some embodiments, the cap layer 126 is made of a high k dielectric material, such as $HfO_2$, $ZrO_2$, $HfAlO_x$, $HfSiO_x$, $Al_2O_3$, or the like. The dielectric materials for forming the cap layer 126 may be formed by performing ALD, CVD, PVD, oxidation-based deposition process, other suitable process, or combinations thereof. After the cap layers 126 are formed, a CMP process is performed until the mask structures 110 are exposed in accordance with some embodiments. In some embodiments, the cap layer 126 has a height $H_1$ in a range of about 5 nm to about 30 nm. The cap layers 126 should be thick enough to protect the dielectric features 134 during the subsequent etching processes, so that the dielectric features may be used to separate the adjacent source/drain structures formed afterwards.

Next, as shown in FIG. 2J, the mask structures 110 over the fin structures 104-1 and 104-2 and the top portions of the cladding layers 118 are removed to expose the top surfaces of the topmost second semiconductor material layers 108, in accordance with some embodiments. In some embodiments, the top surfaces of the cladding layers 118 are substantially level with the top surfaces of the topmost second semiconductor layers 108.

The mask structures 110 and the cladding layers 118 may be recessed by performing one or more etching processes that have higher etching rate to the mask structures 110 and the cladding layers 118 than the dielectric features 134, such that the dielectric features 134 are only slightly etched during the etching processes. The selective etching processes can be dry etching, wet etching, reactive ion etching, or other applicable etching methods.

Figure 2L:
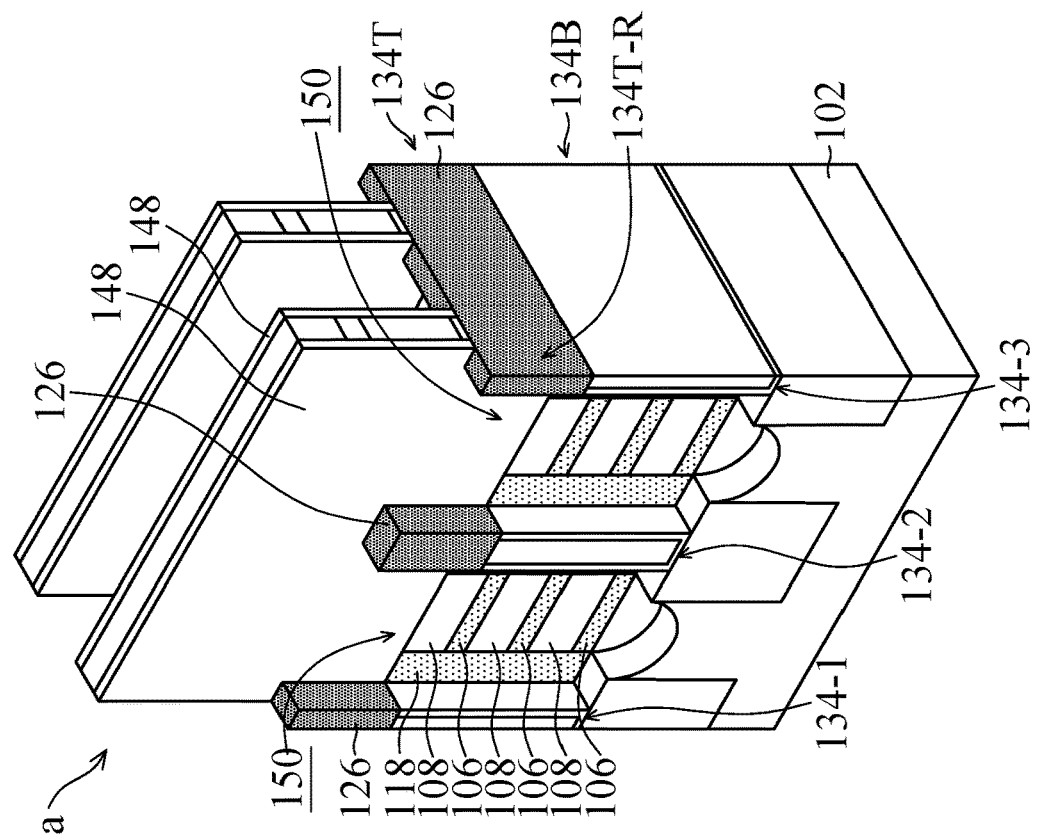
Figure 2K:
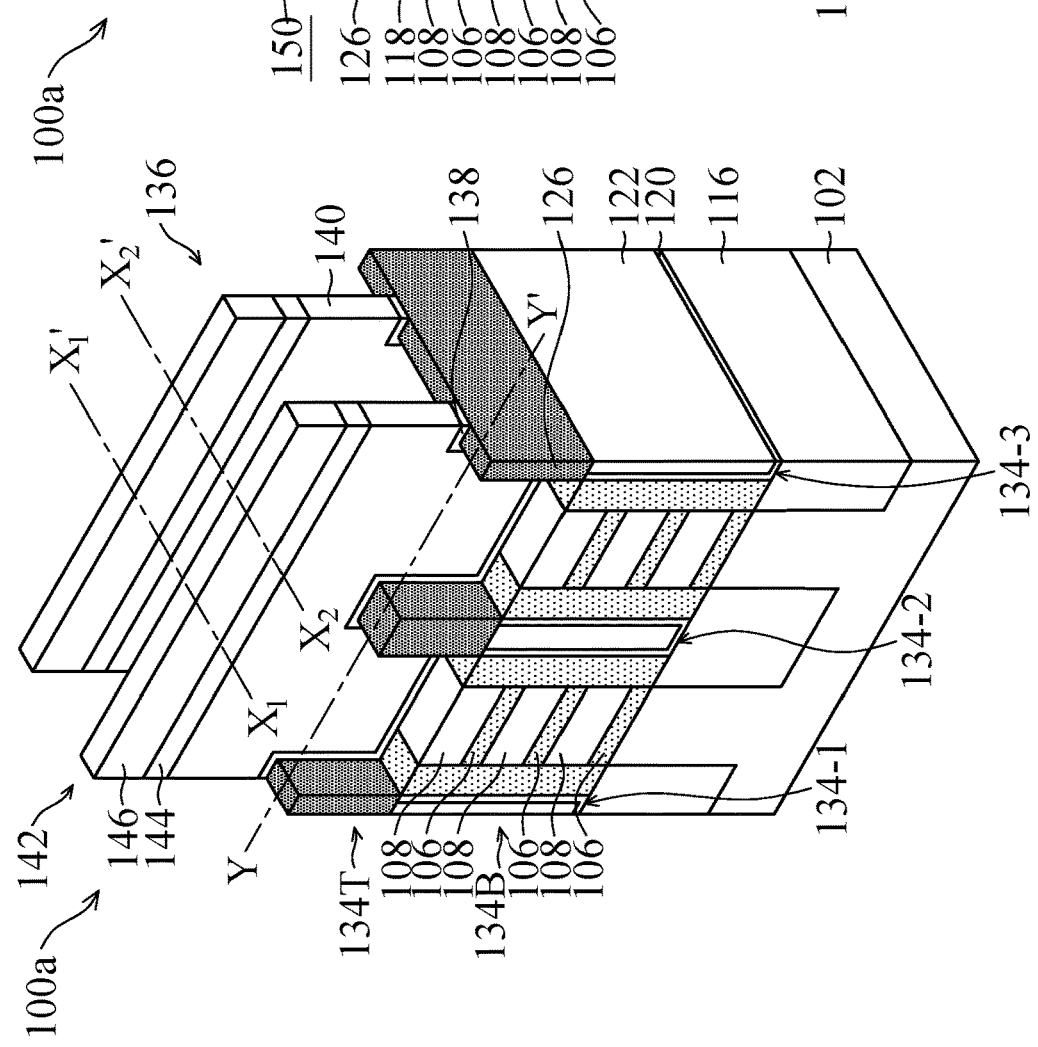

Afterwards, as shown in FIG. 2K, dummy gate structures 136 are formed across the fin structure 104-1 and 104-2 and the dielectric features 134, in accordance with some embodiments. The dummy gate structures 136 may be used to define the source/drain regions and the channel regions of the resulting semiconductor structure 100.

In some embodiments, the dummy gate structure 136 includes a dummy gate dielectric layer 138 and a dummy gate electrode layer 140. In some embodiments, the dummy gate dielectric layer 138 is made of one or more dielectric materials, such as silicon oxide, silicon nitride, silicon oxynitride (SiON), HfO$_2$, HfZrO, HfSiO, HfTiO, HfAlO, or a combination thereof. In some embodiments, the dummy gate dielectric layer 138 is formed using thermal oxidation, CVD, ALD, physical vapor deposition (PVD), another suitable method, or a combination thereof.

In some embodiments, the dummy gate electrode layer 140 is made of conductive material includes polycrystalline-silicon (poly-Si), poly-crystalline silicon-germanium (poly-SiGe), or a combination thereof. In some embodiments, the dummy gate electrode layer 140 is formed using CVD, PVD, or a combination thereof.

In some embodiments, hard mask layers 142 are formed over the dummy gate structures 136. In some embodiments, the hard mask layers 142 include multiple layers, such as an oxide layer 144 and a nitride layer 146. In some embodiments, the oxide layer 144 is silicon oxide, and the nitride layer 146 is silicon nitride.

The formation of the dummy gate structures 136 may include conformally forming a dielectric material as the dummy gate dielectric layers 138. Afterwards, a conductive material may be formed over the dielectric material as the dummy gate electrode layers 140, and the hard mask layer 142 may be formed over the conductive material. Next, the dielectric material and the conductive material may be patterned through the hard mask layer 142 to form the dummy gate structures 136.

In some embodiments, the dielectric feature 134 includes a bottom portion 134B and a top portion 134T over the bottom portion 134B. The bottom portion 134B includes the liner layer 120 and the filling layer 122, and the top portion 134T includes the cap layer 126. The cap layers 126 may be configured to protect the dielectric features during the subsequent etching processes.

Since the dielectric features 134 are self-aligned to the spaces between the fin structures 104-1 and 104-2, complicated alignment processes are not required when forming the dielectric features 134. In addition, the width of the dielectric features 134 may be determined by the widths of the spaces between the fin structures 104-1 and 104-2 and the thicknesses of the cladding layer 118. In some embodiments, the dielectric features 134 have substantially the same width. Meanwhile, in some embodiments, the spaces between the fin structures 104-1 and 104-2 have different widths, and the dielectric features 134 also have different widths. As shown in FIG. 1, the dielectric features 134 are formed between the fin structures 104-1 and 104-2 and are substantially parallel to the fin structures 104-1 and 104-2 in accordance with some embodiments.

Afterwards, as shown in FIG. 2L, after the dummy gate structures 136 are formed, gate spacers 148 are formed along and covering opposite sidewalls of the dummy gate structure 136, in accordance with some embodiments. In some embodiments, the gate spacers 148 also cover some portions of the top surfaces and the sidewalls of the dielectric features 134.

Afterwards, source/drain (S/D) recesses 150 are formed adjacent to the gate spacers 148. More specifically, the fin structures 104-1 and 104-2 and the cladding layers 118 not covered by the dummy gate structures 136 and the gate spacers 148 are recessed. In addition, in some embodiments, the top portions 134T of the dielectric features 134 are also recessed to have recessed portions 134T_R at the source/drain regions in accordance with some embodiments. In some other embodiments, the cap layers 126 are completely removed.

The gate spacers 148 may be configured to separate source/drain structures (formed afterwards) from the dummy gate structure 136. In some embodiments, the gate spacers 148 are made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), and/or a combination thereof.

In some embodiments, the fin structures 104-1 and 104-2 and the cladding layers 118 are recessed by performing an etching process. The etching process may be an anisotropic etching process, such as dry plasma etching, and the dummy gate structure 136 and the gate spacers 148 may be used as etching masks during the etching process.

Figures 1, 3A:
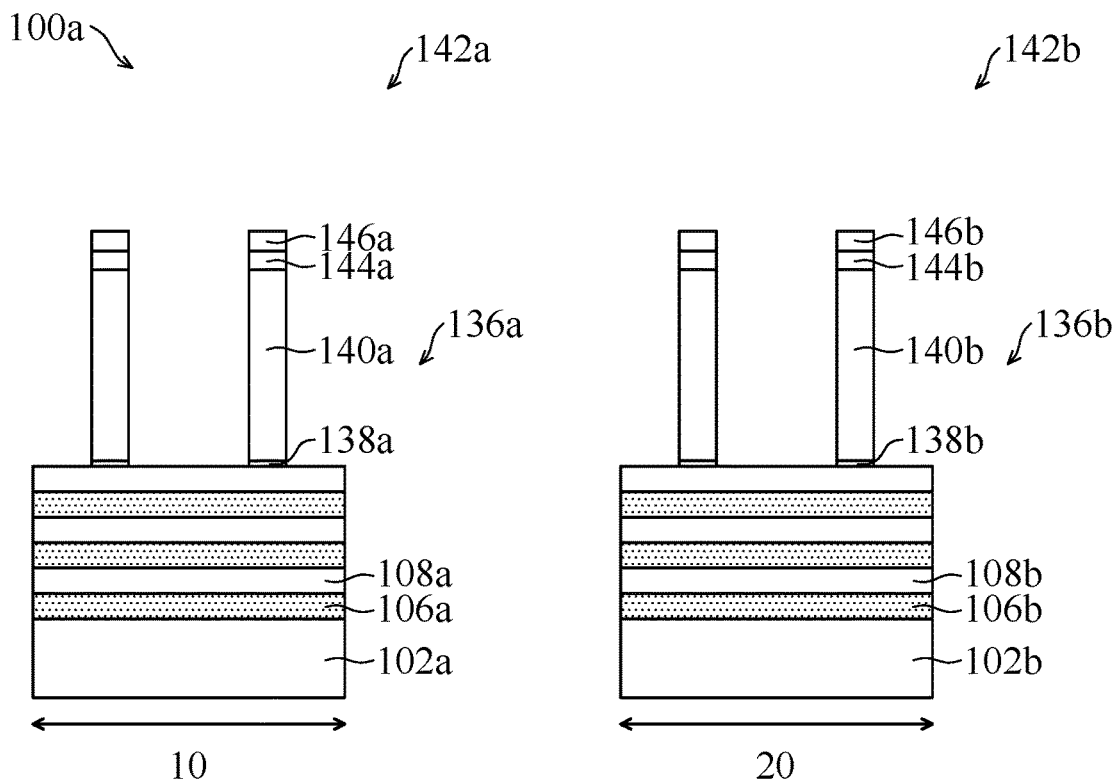
Figures 2, 3A:
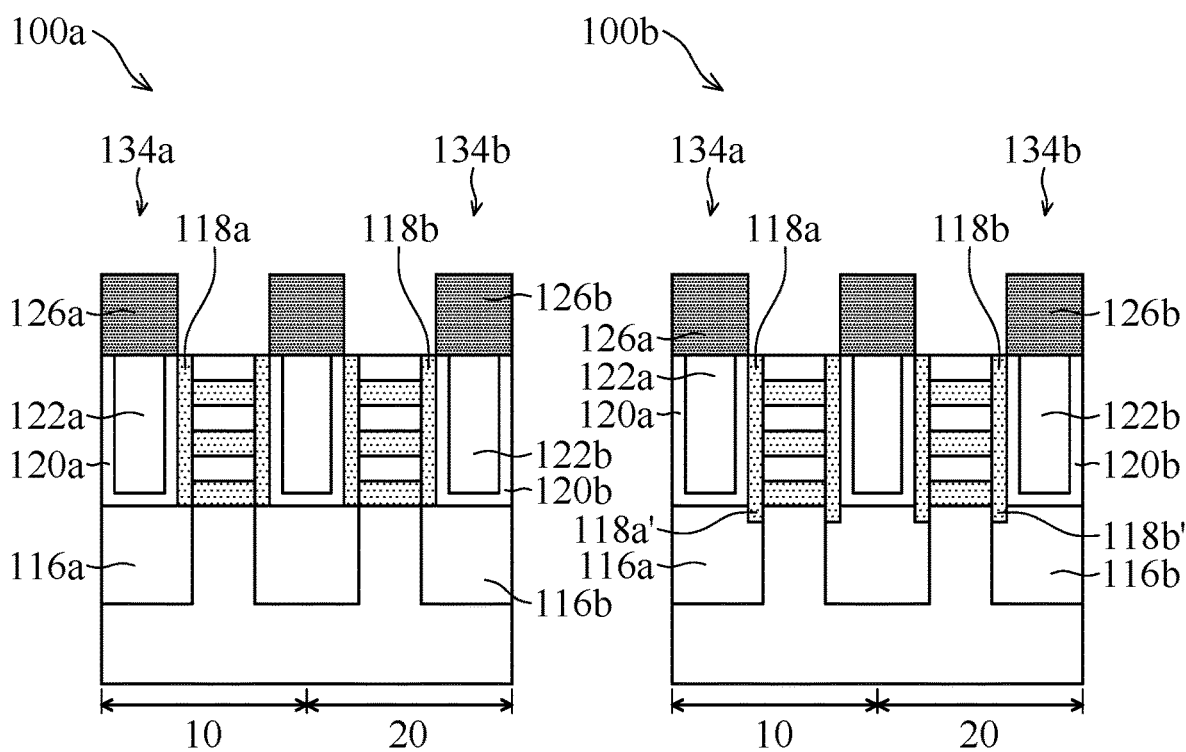
Figures 1, 3B:
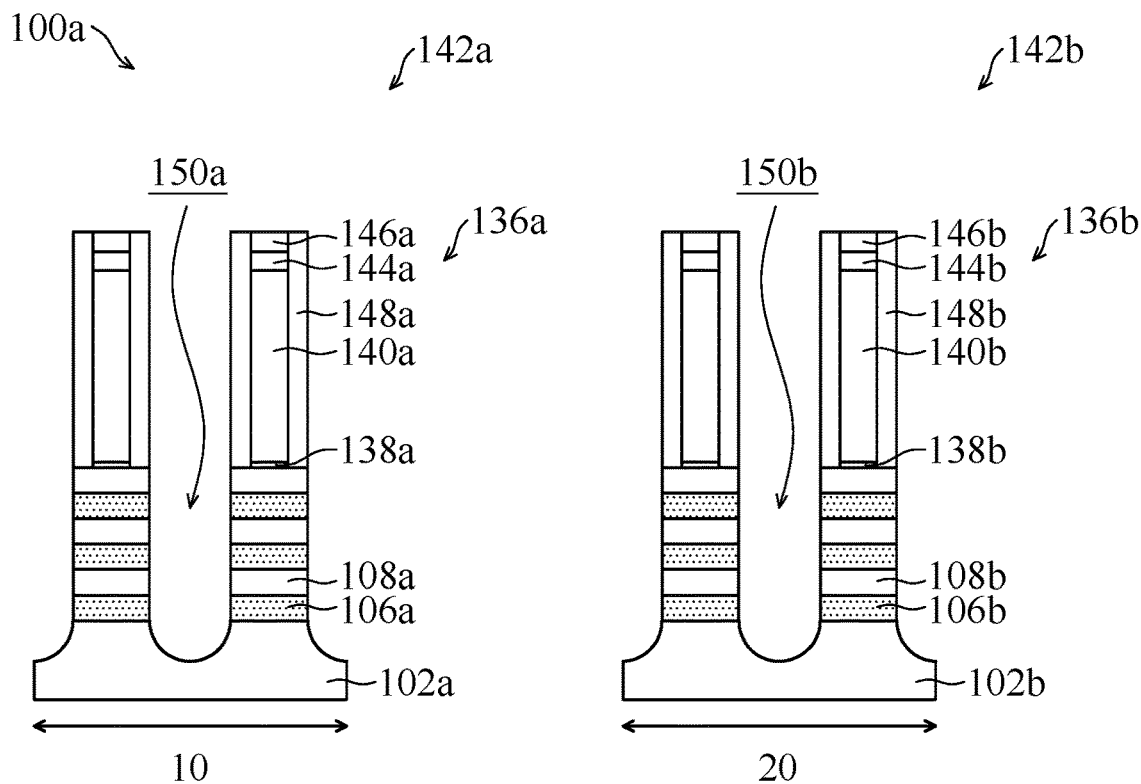
Figures 2, 3B:
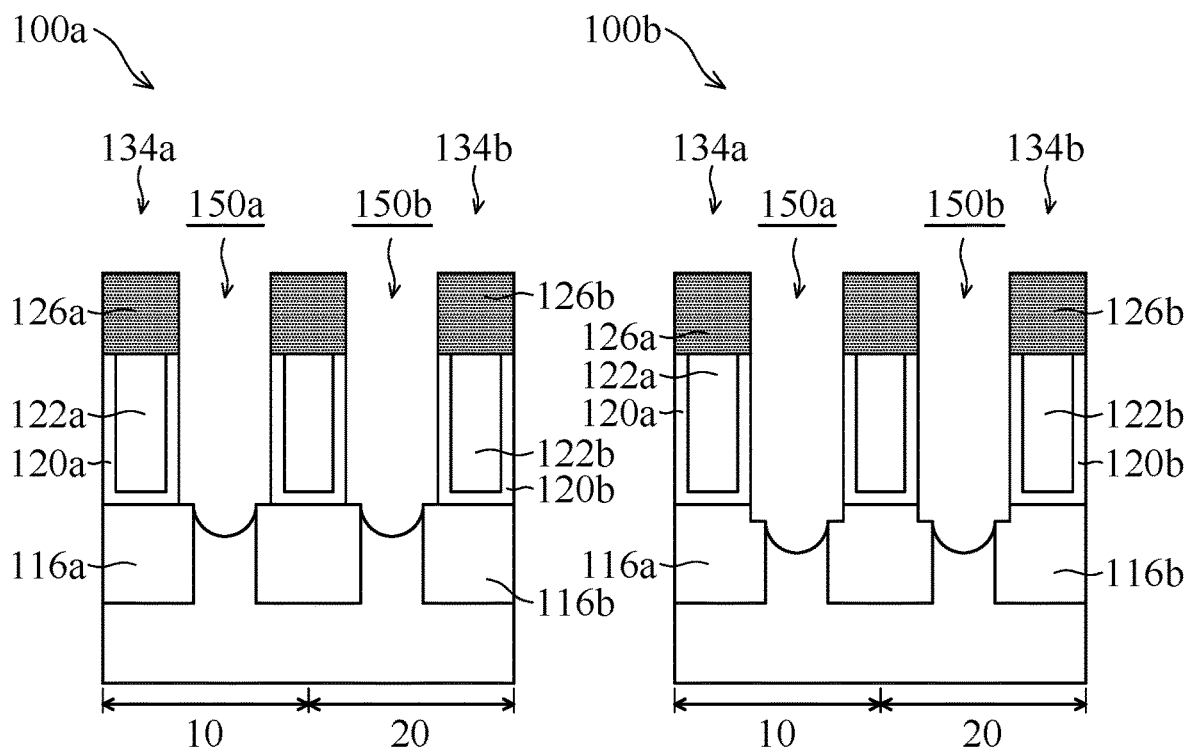
Figures 1, 3C:
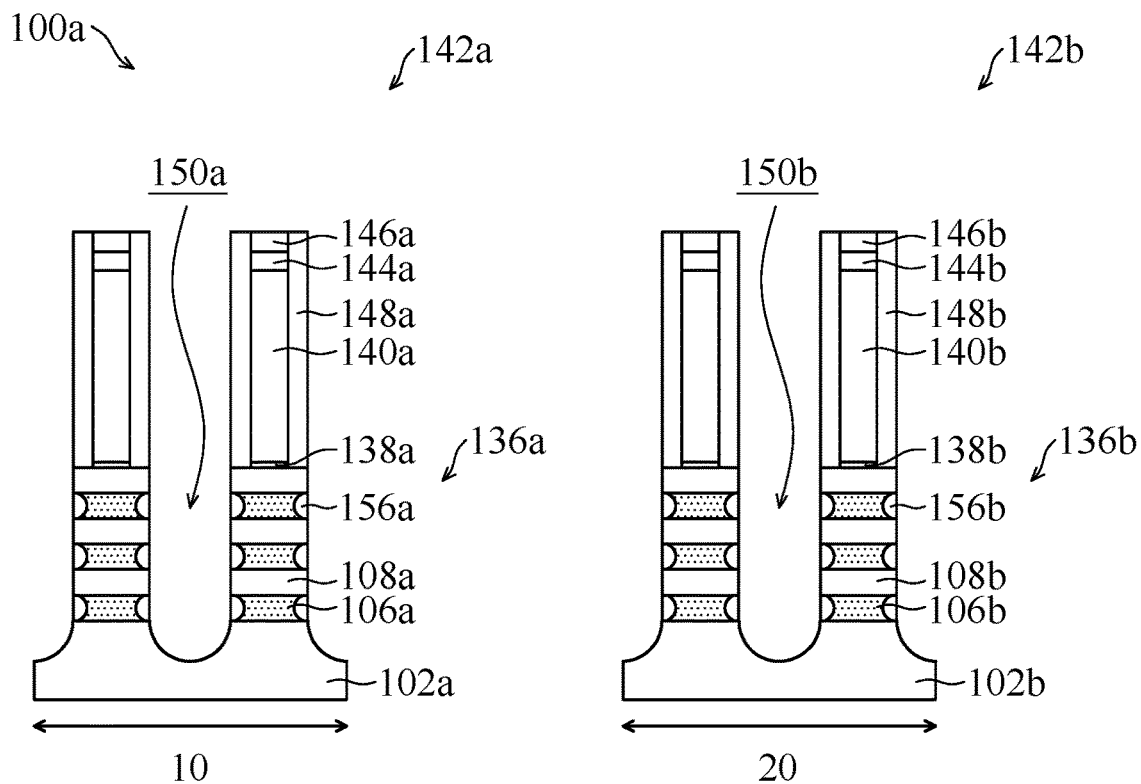
Figures 2, 3C:
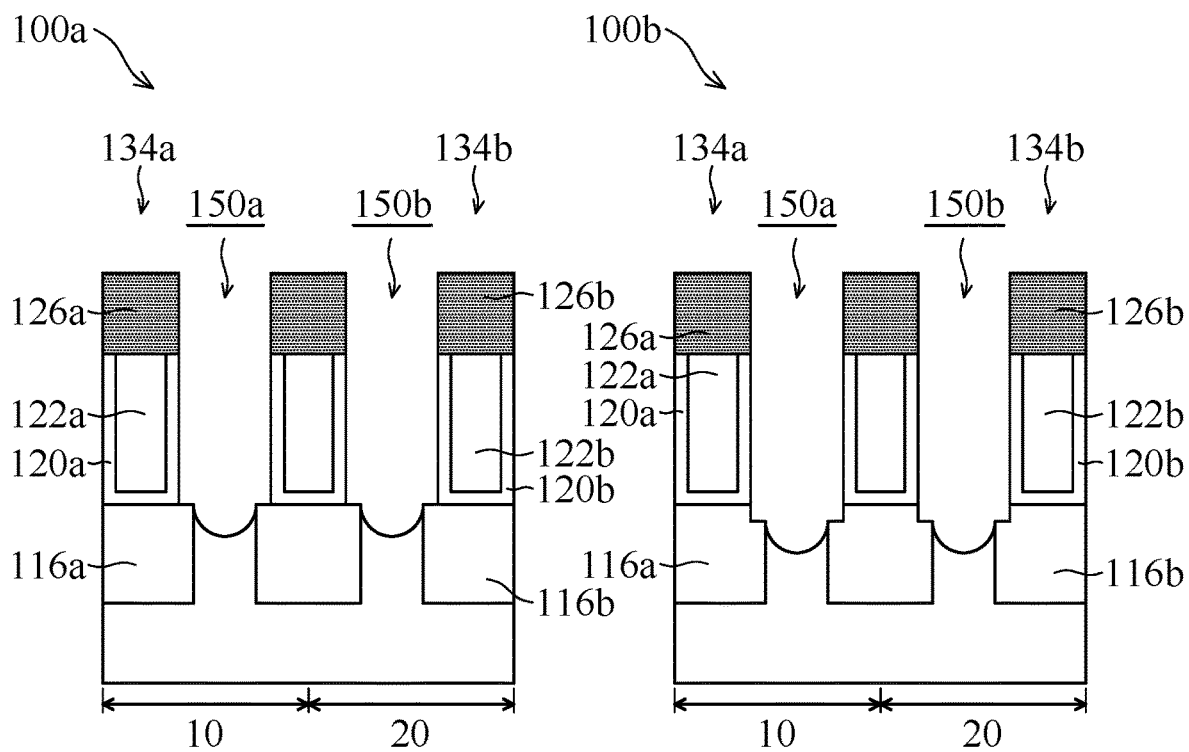
Figures 1, 3D:
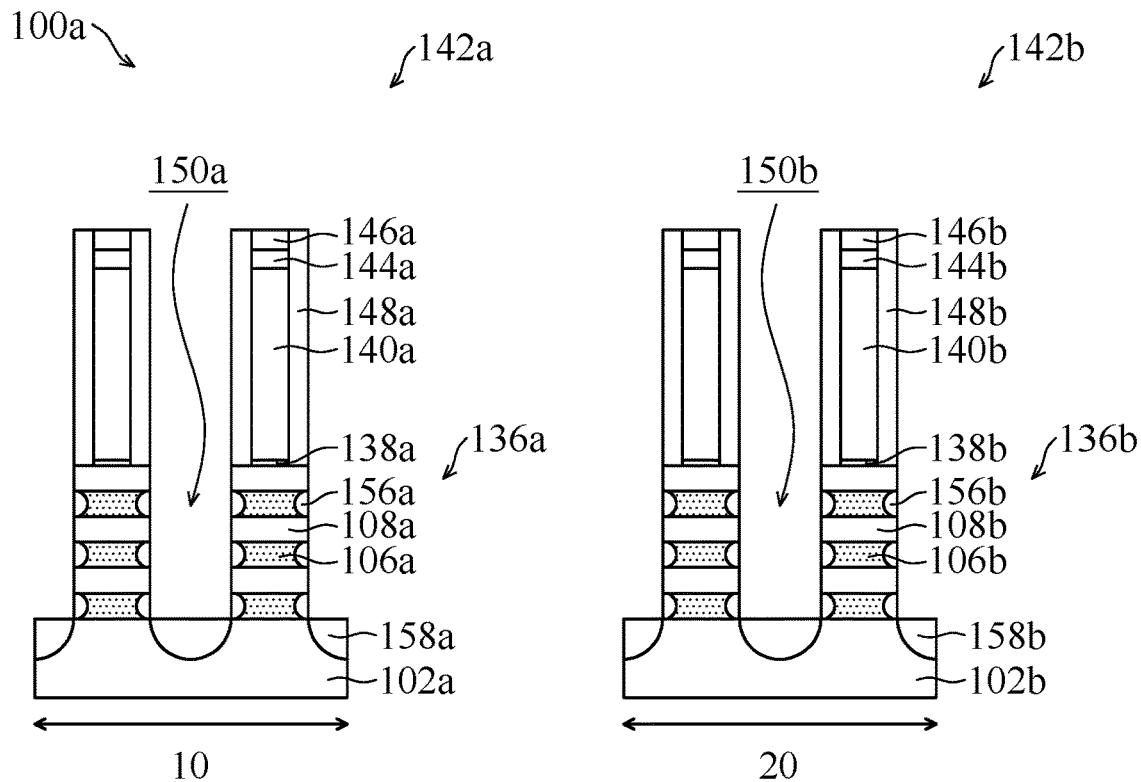
Figures 2, 3D:
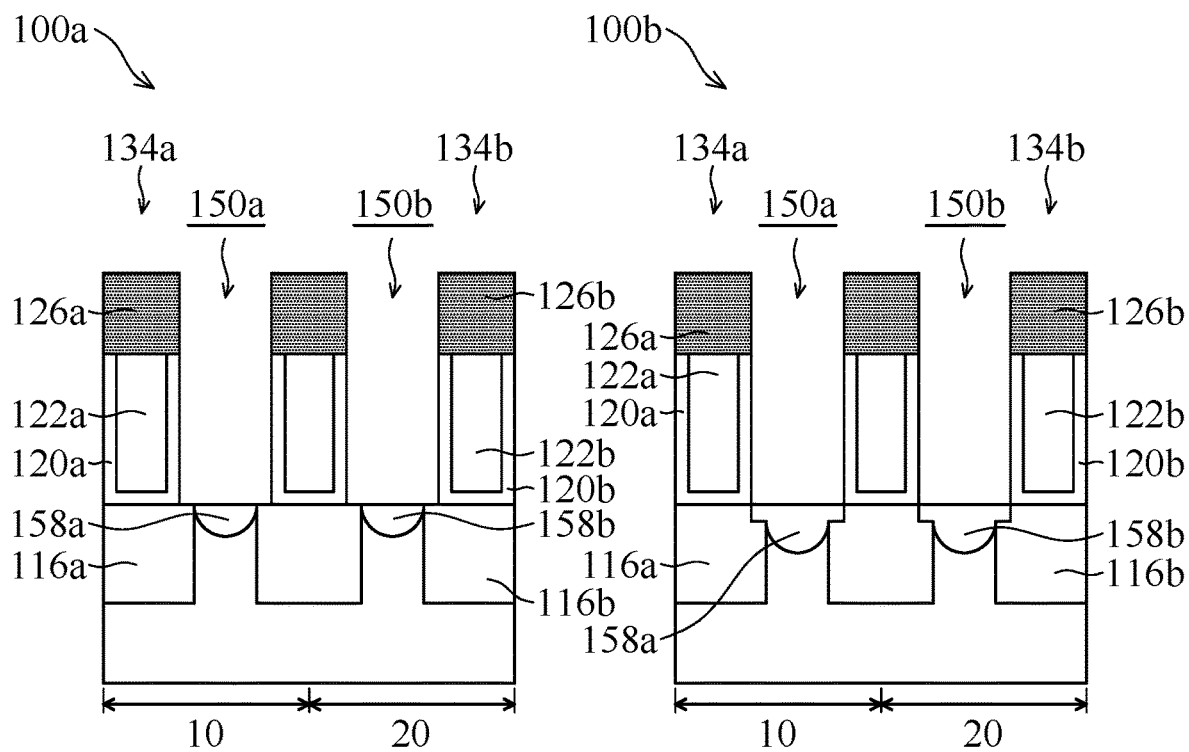
Figures 1, 3E:
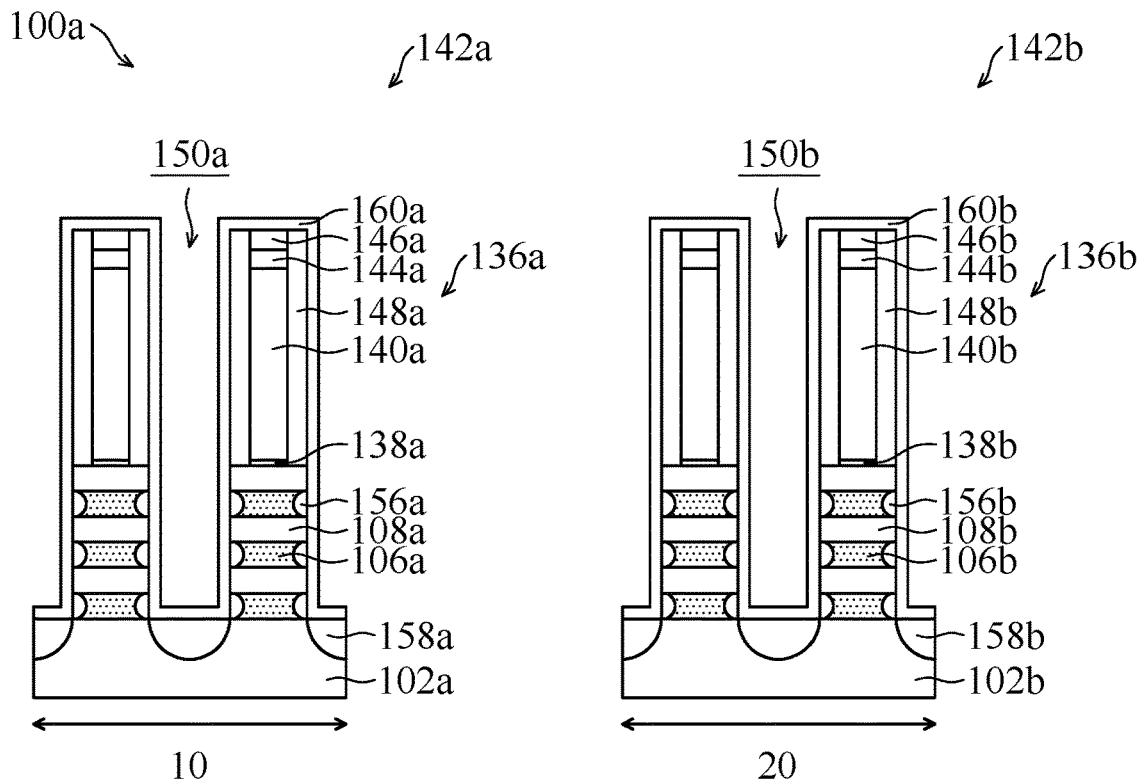
Figures 2, 3E:
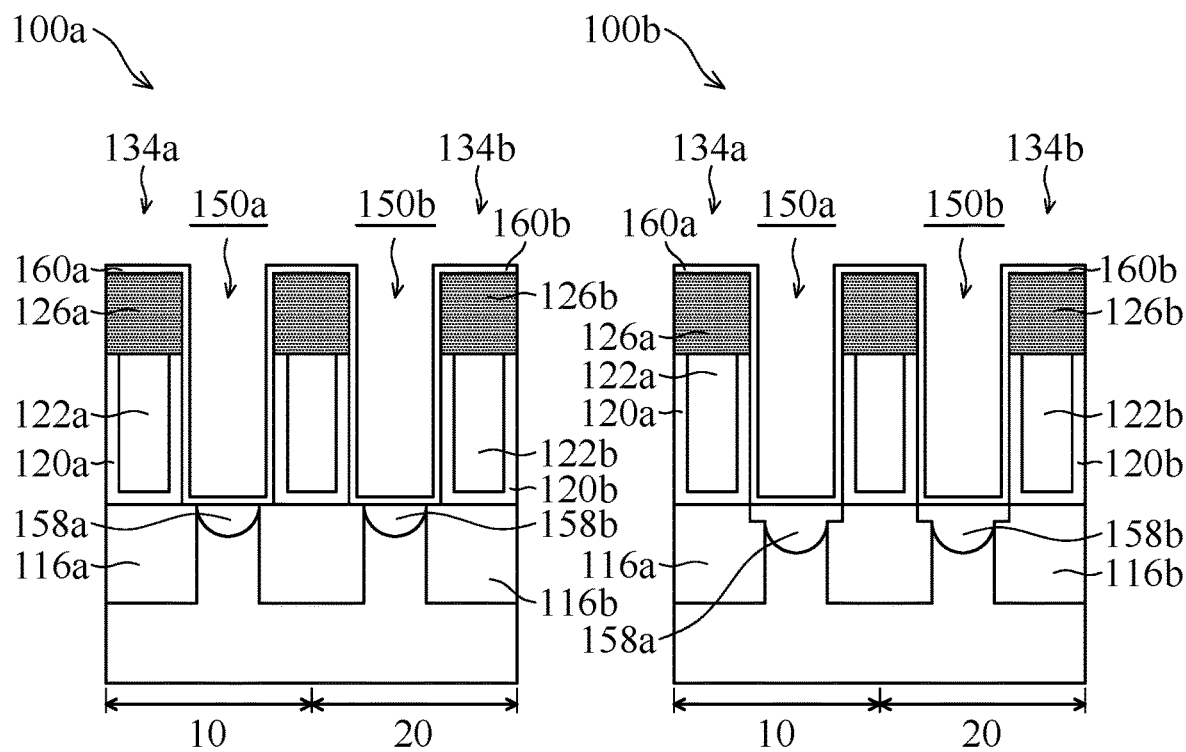
Figures 1, 3F:
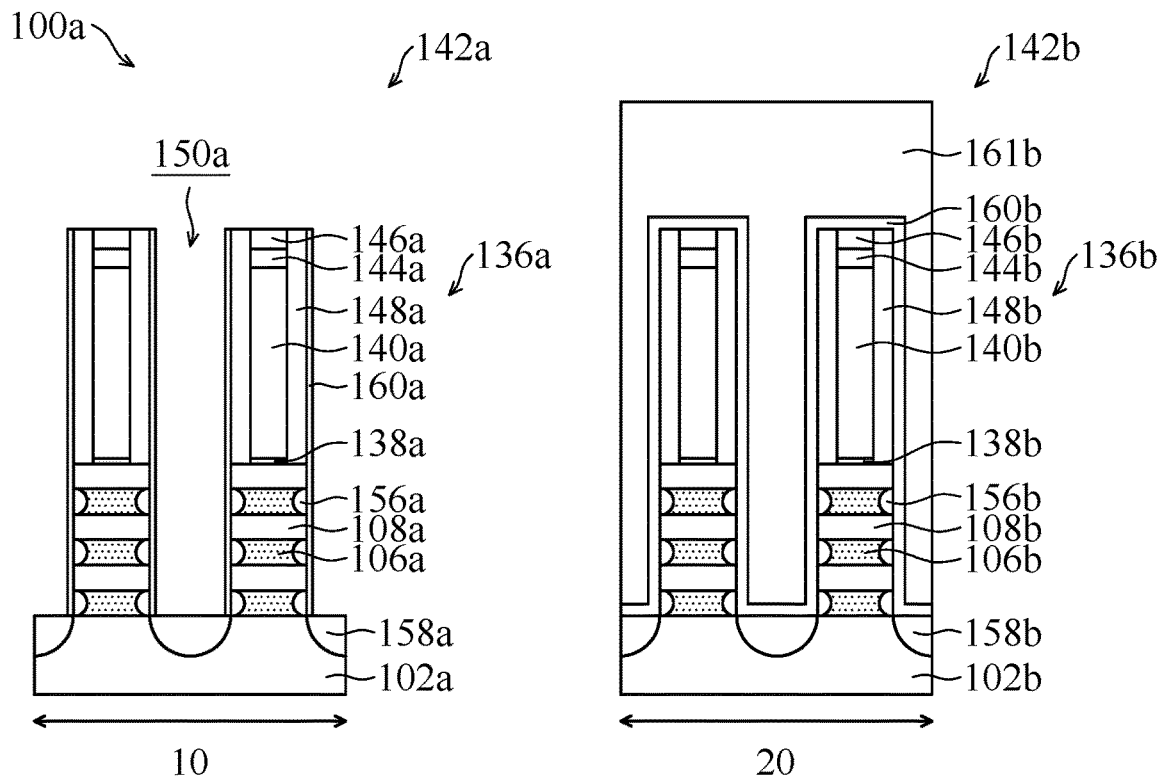
Figures 2, 3F:
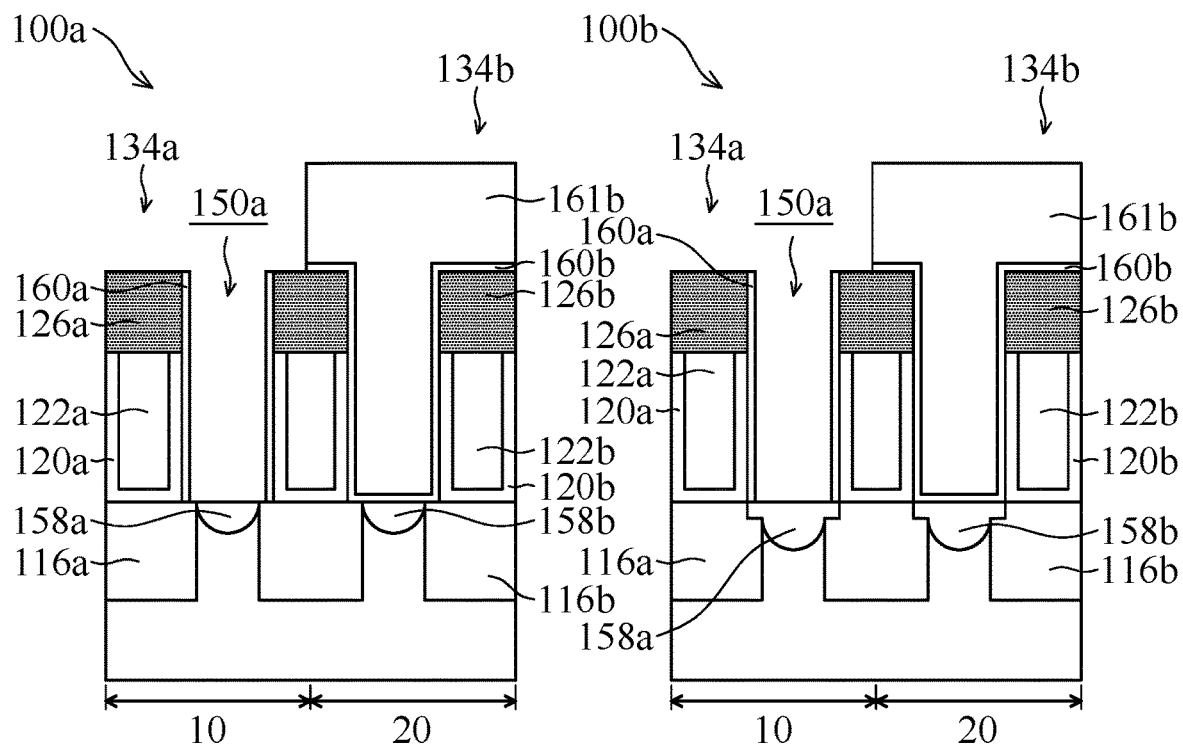
Figures 1, 3G:
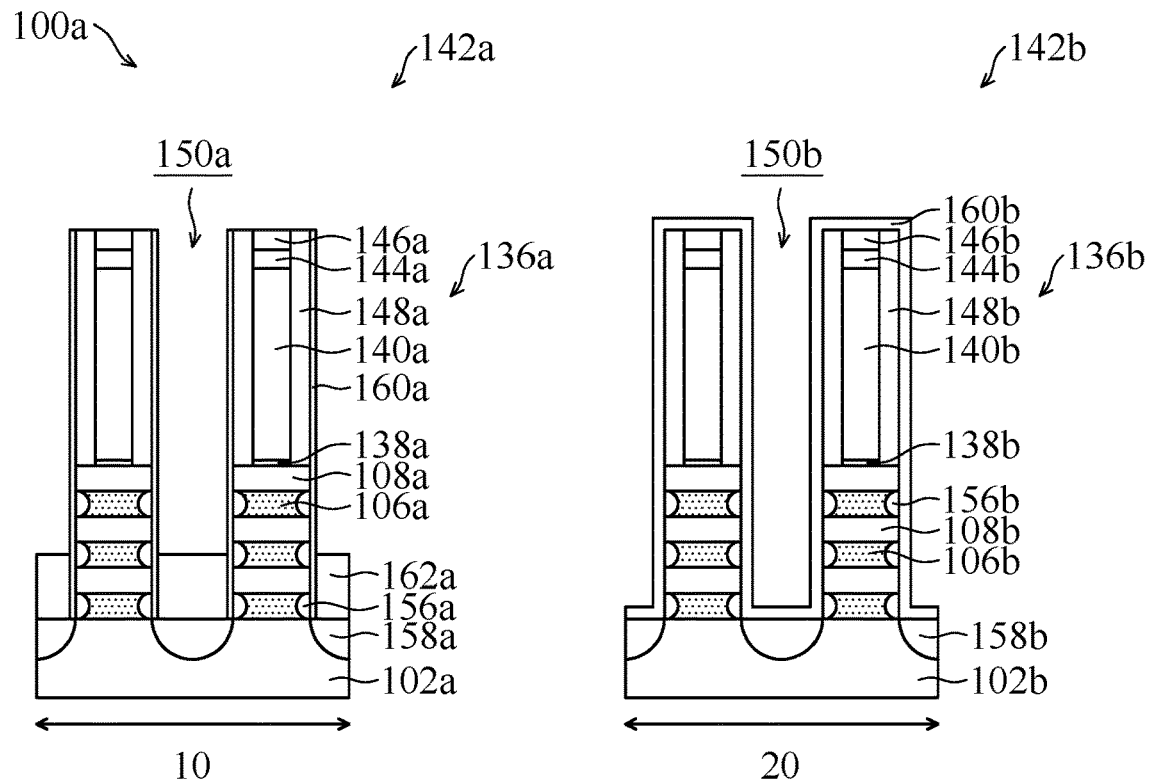
Figures 2, 3G:
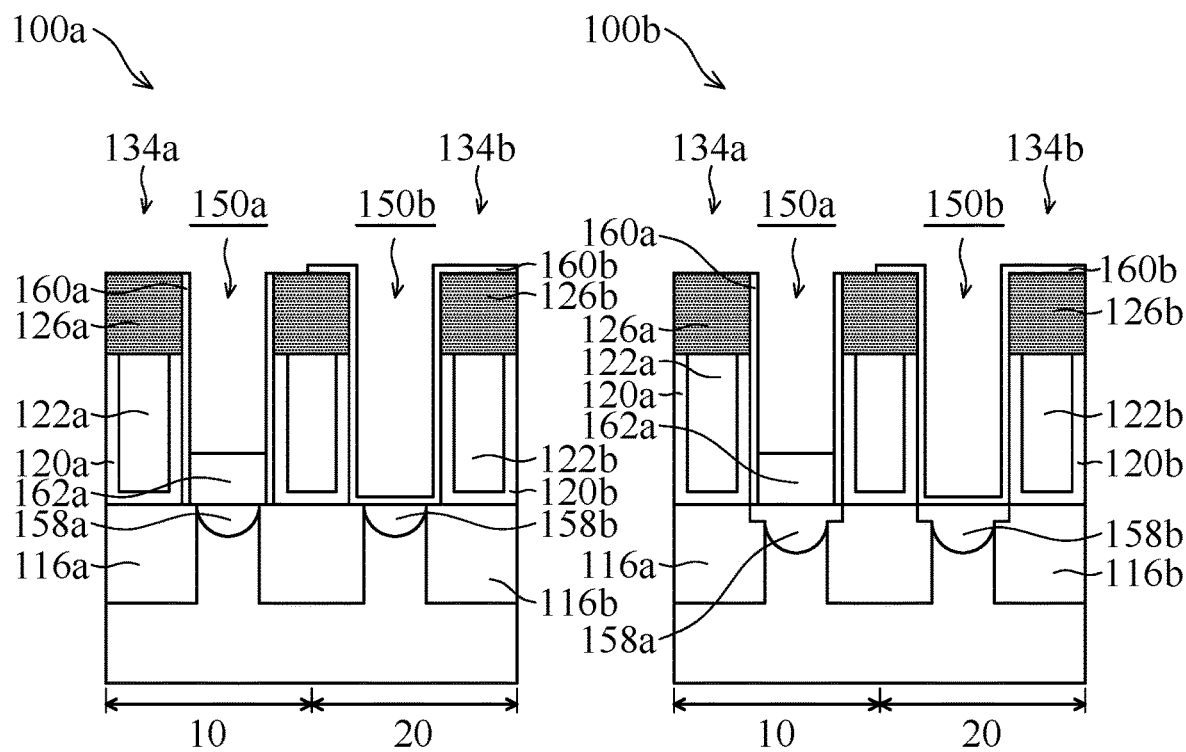
Figures 1, 3H:
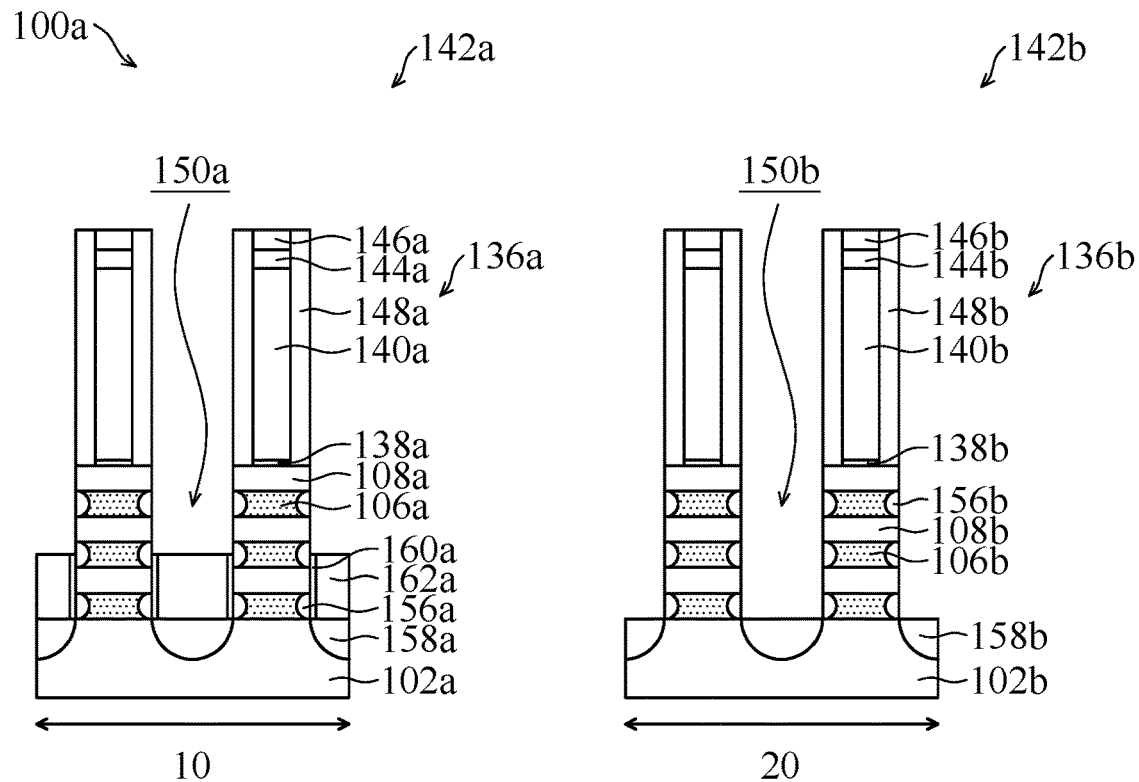
Figures 2, 3H:
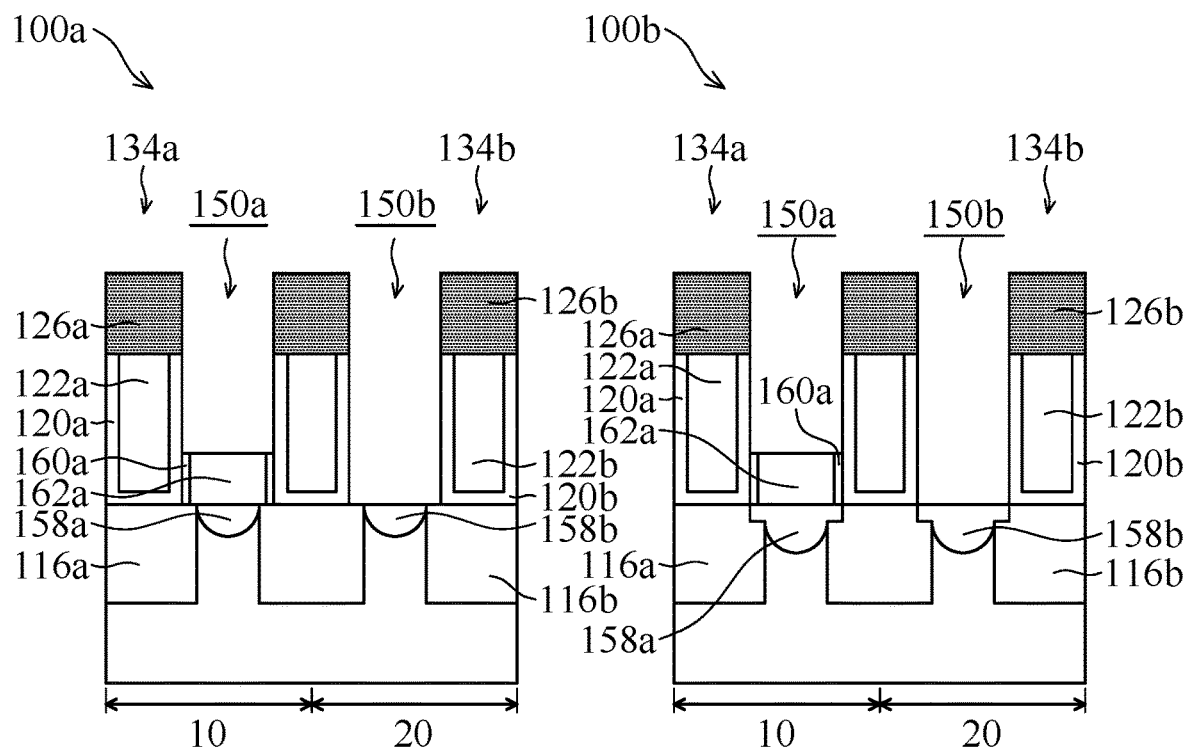
Figures 1, 3I:
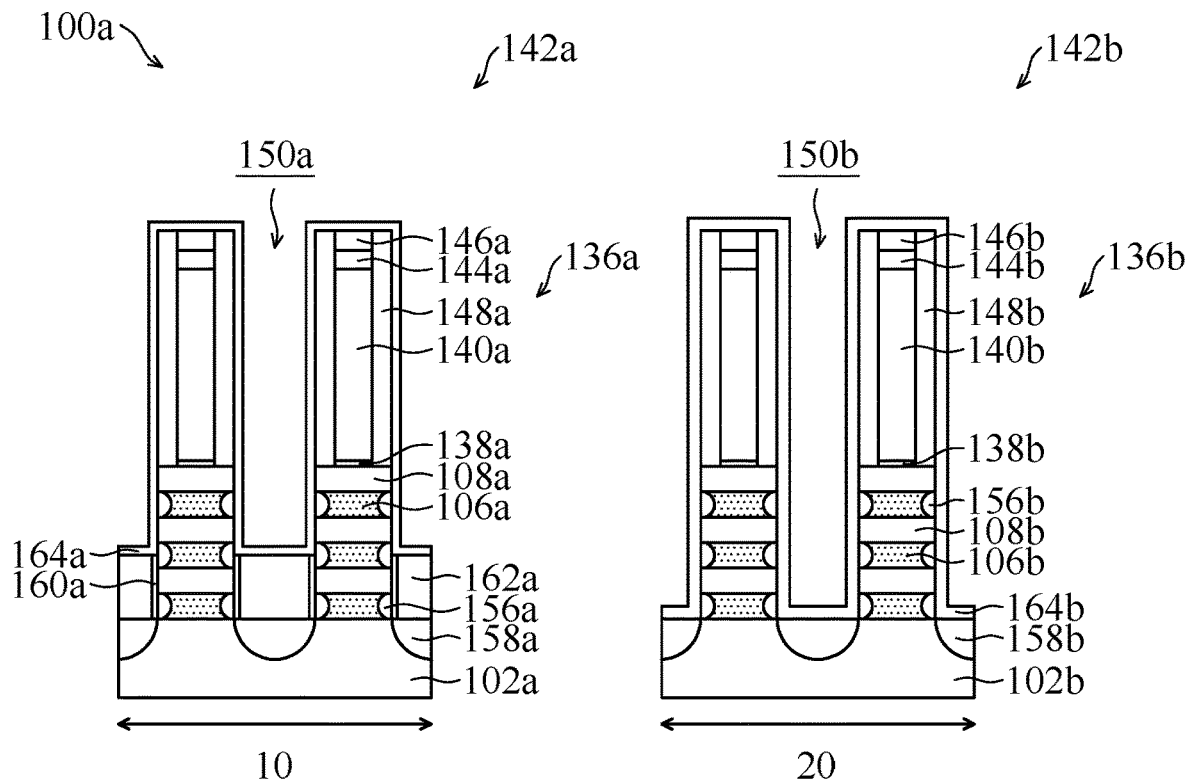
Figures 2, 3I:
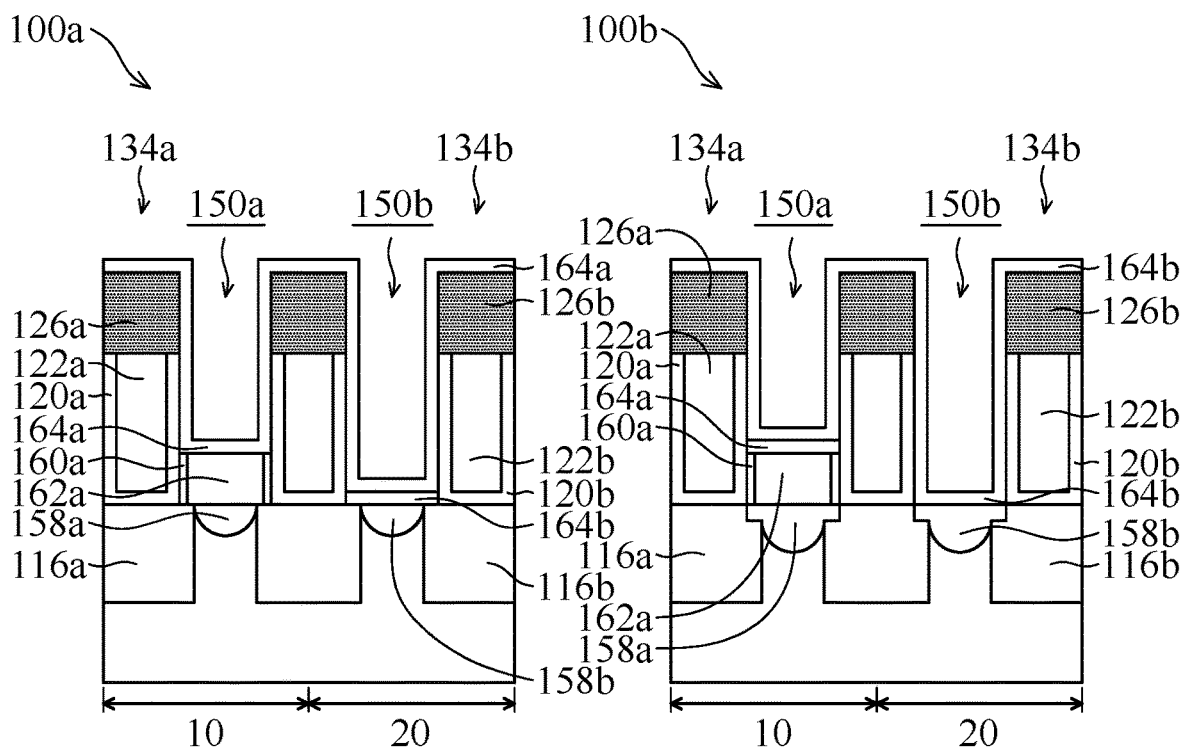
Figures 1, 3J:
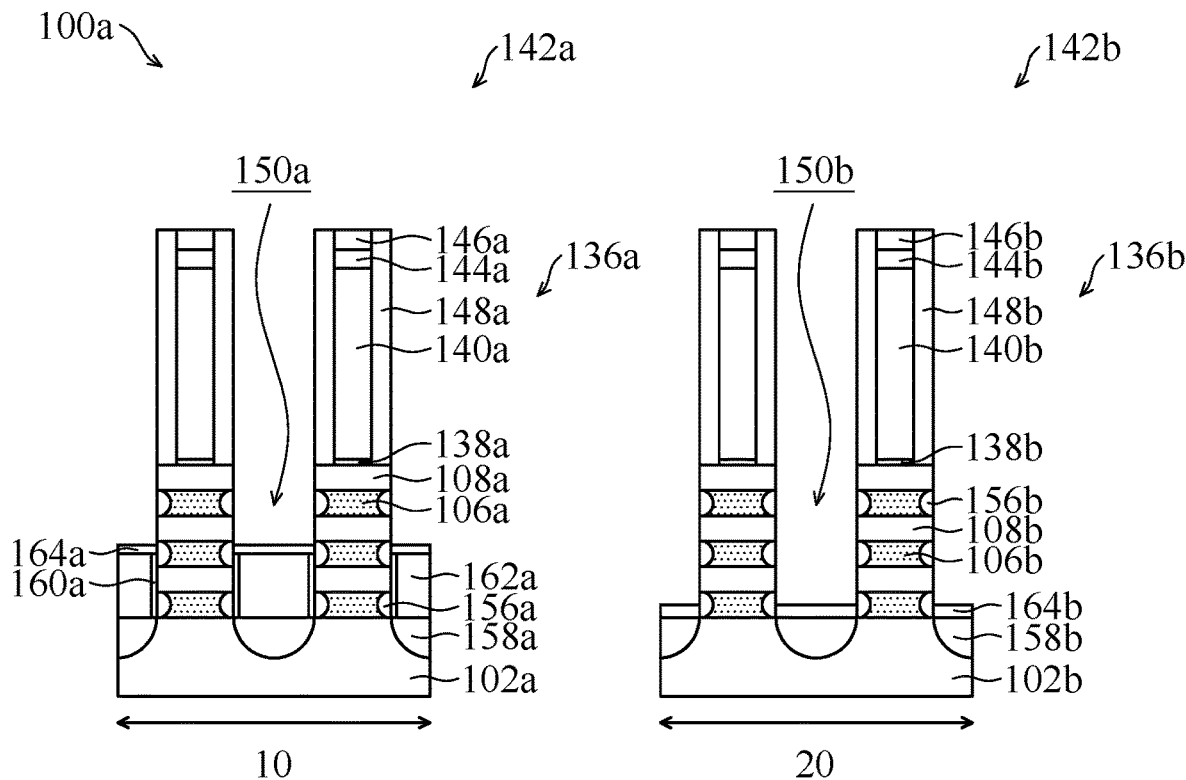
Figures 2, 3J:
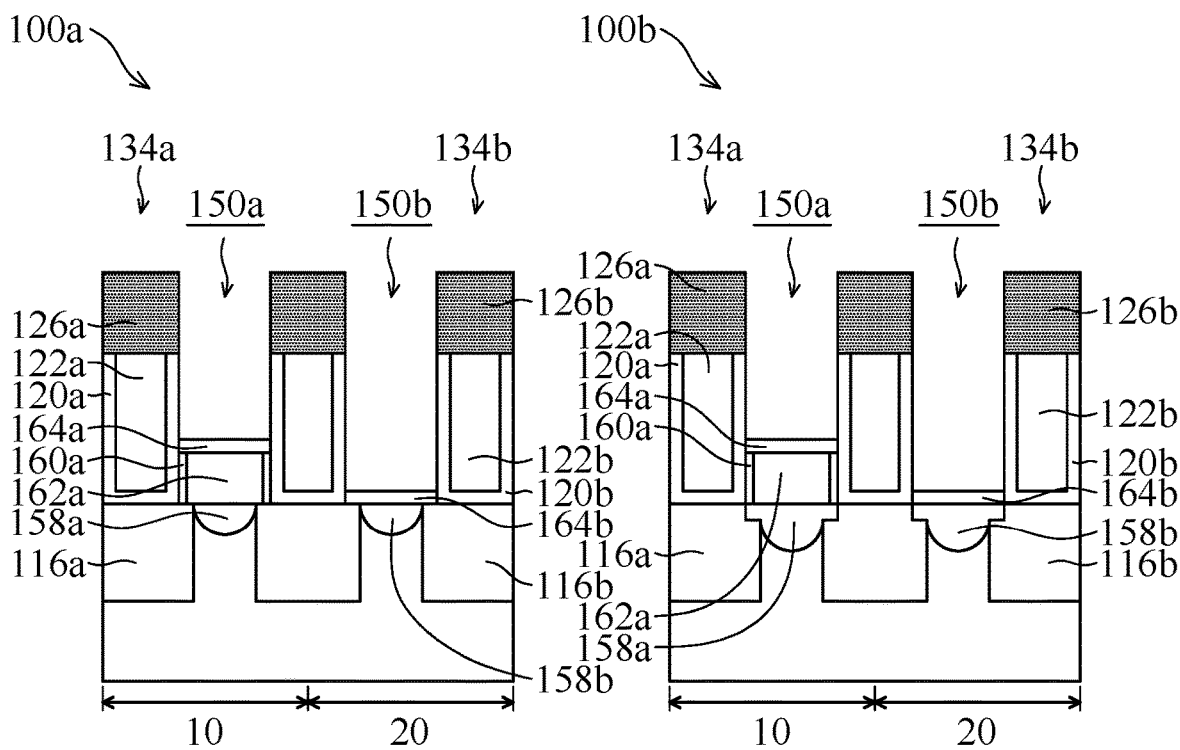
Figures 1, 3K:
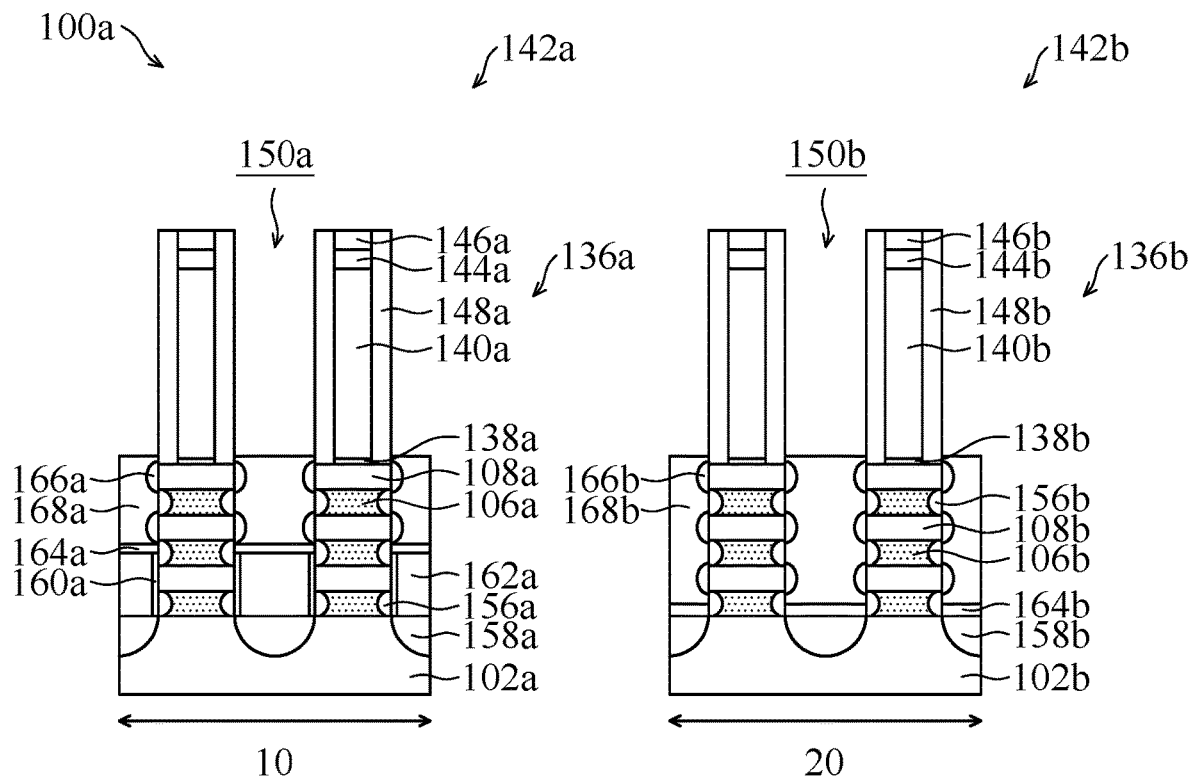
Figures 2, 3K:
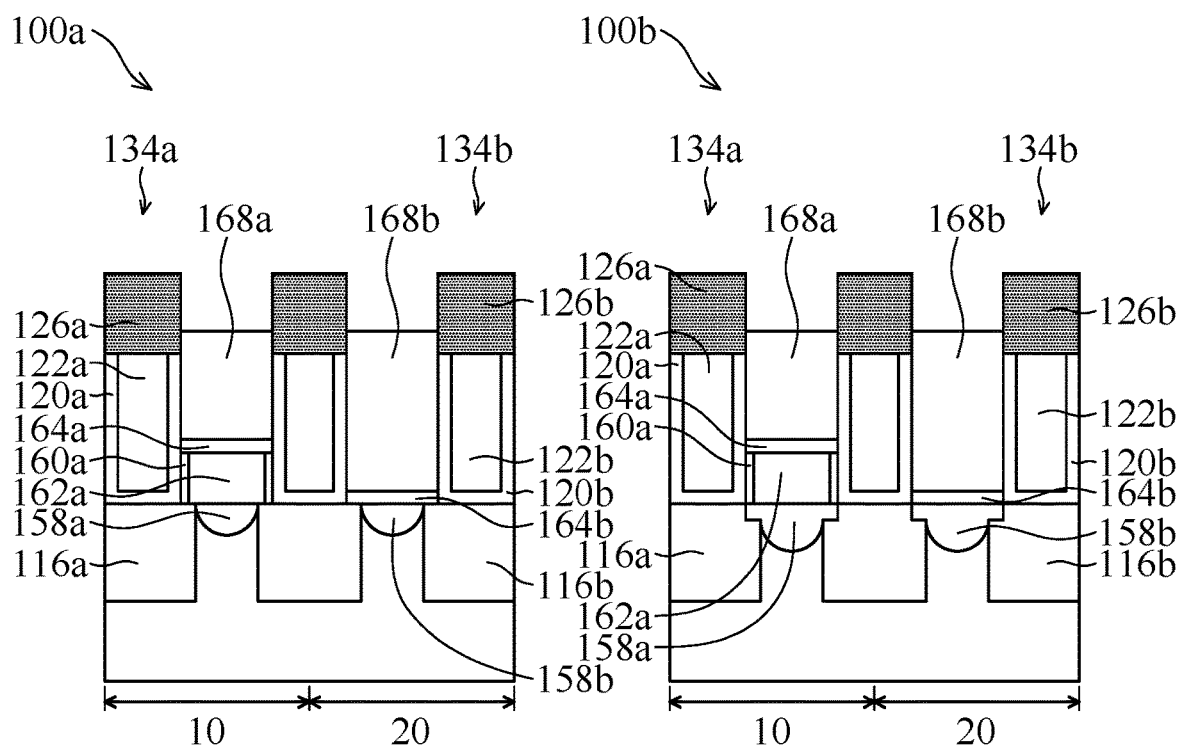
Figures 1, 3L:
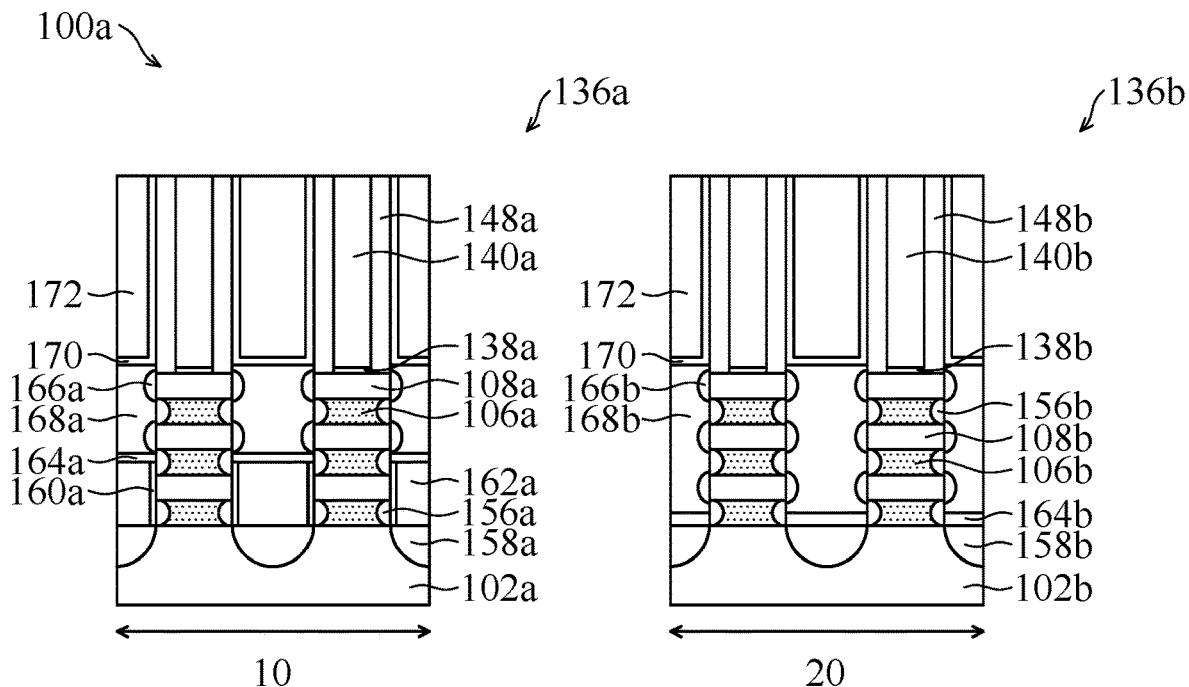
Figures 2, 3L:
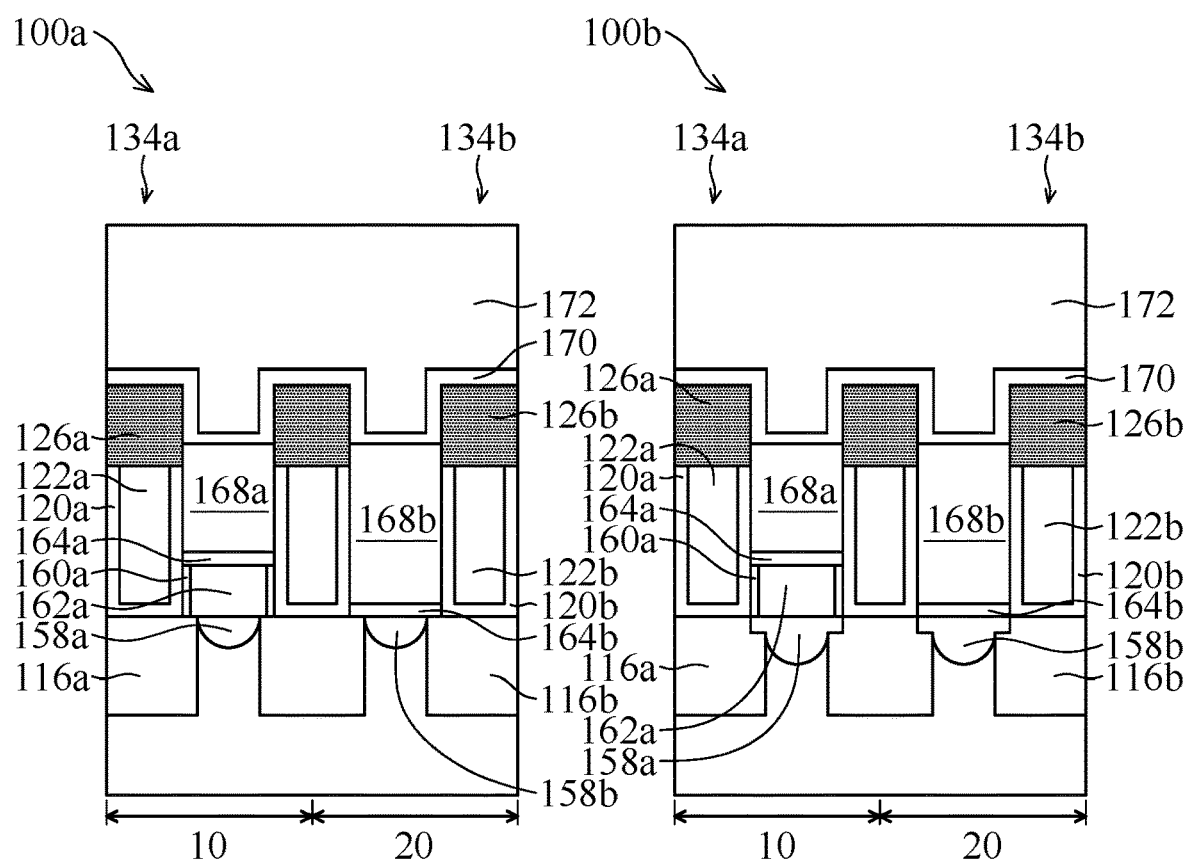
Figures 1, 3M:
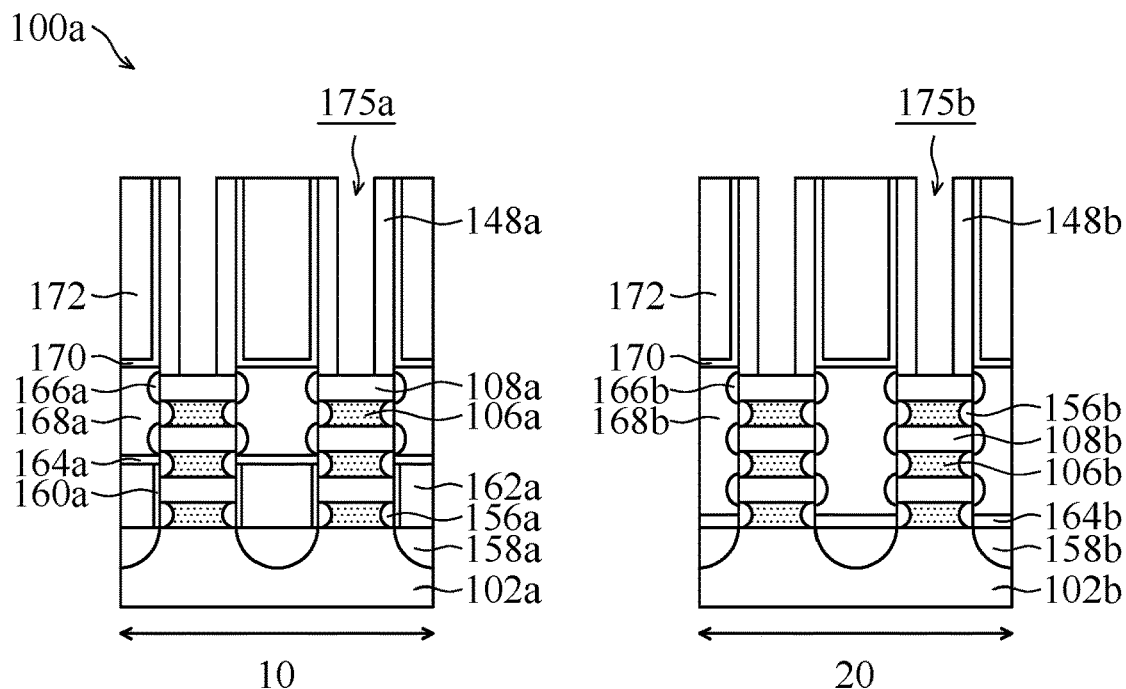
Figures 2, 3M:
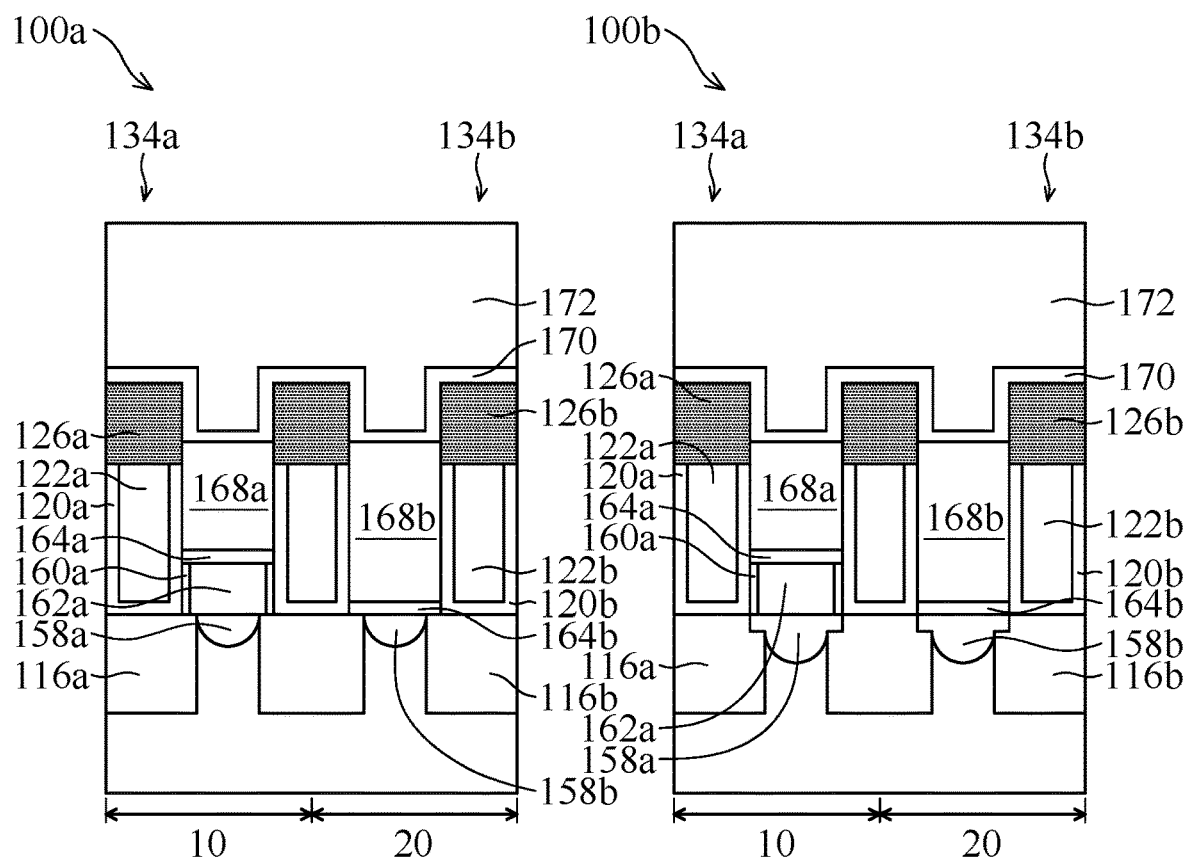
Figures 1, 3N:
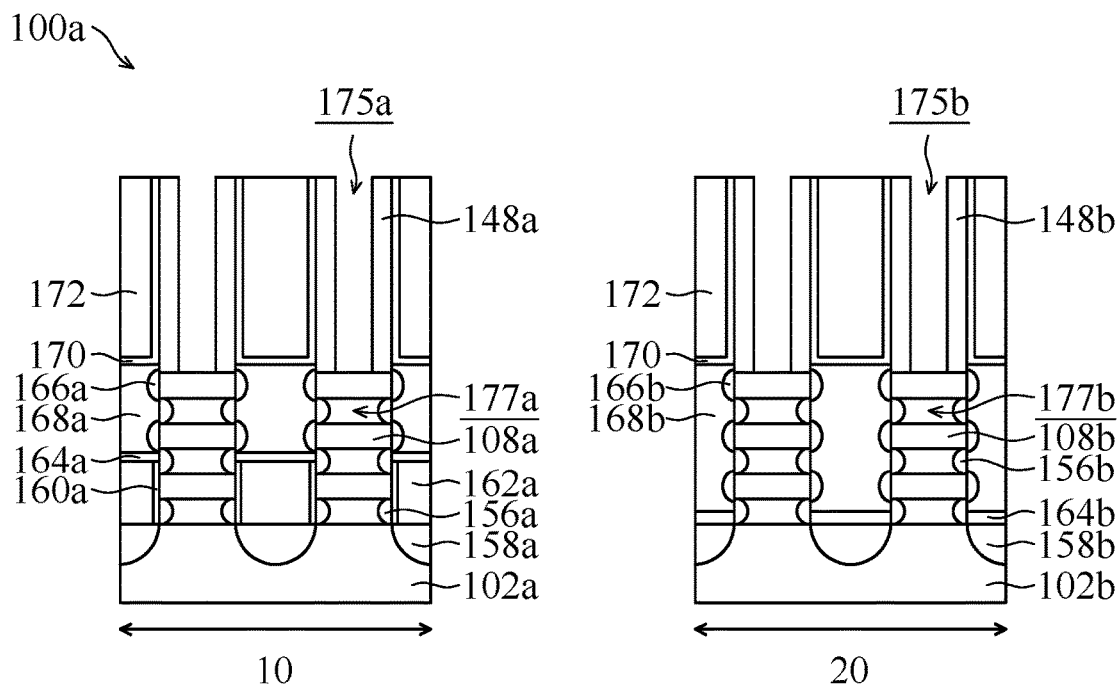
Figures 2, 3N:
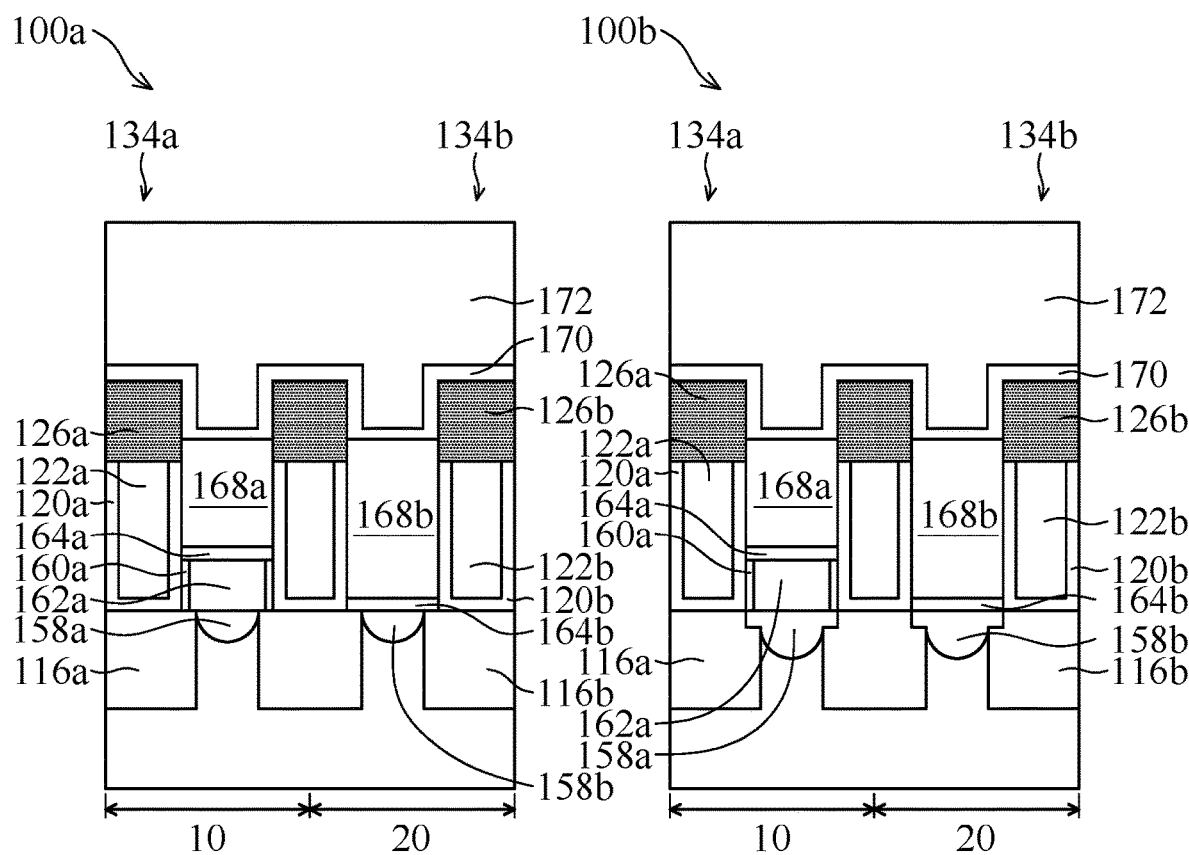
Figures 1, 3O:
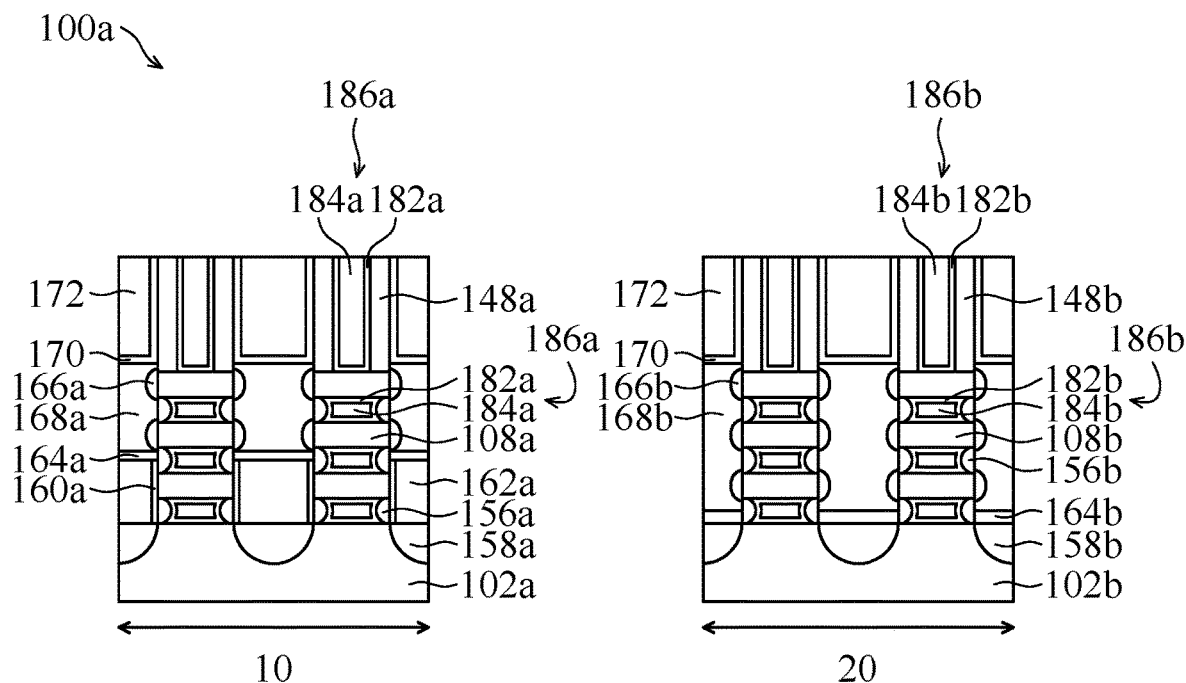
Figures 2, 3O:
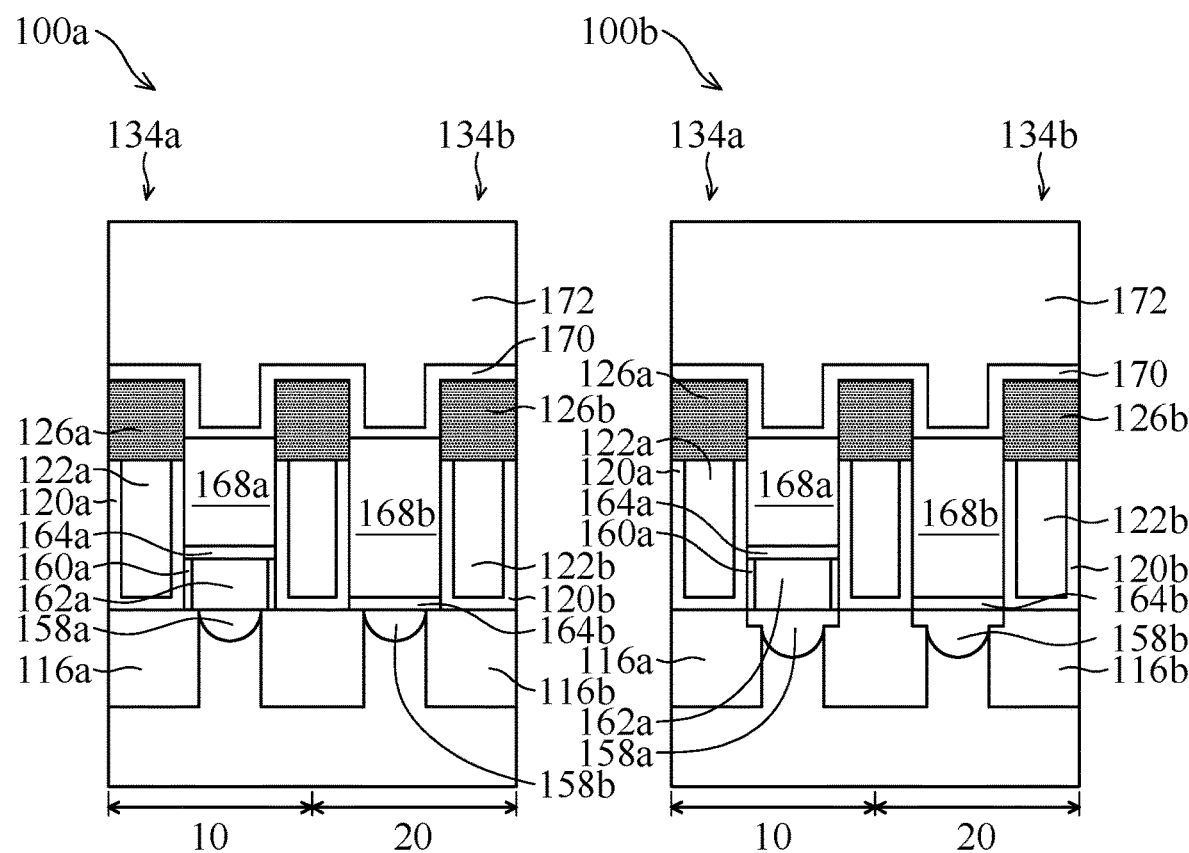

FIG. 3A-1-3O-1 show cross-sectional representations of various stages of forming the semiconductor device structure 100a along line X$_1$-X$_1$' and X$_2$-X$_2$' shown in FIG. 2K, in accordance with some embodiments of the disclosure. FIG. 3A-2-3O-2 show cross-sectional representations of various stages of forming the semiconductor device structure 100a along line Y-Y' shown in FIG. 2K, in accordance with some embodiments of the disclosure. FIG. 3A'-2-3O'-2 show cross-sectional representations of various stages of forming a semiconductor device structure 100b.

As shown in FIG. 3A-1, the substrate 102 includes a first region 10 and a second region 20. The first dummy gate structure 136a includes a first dummy gate dielectric layer 138a and a first dummy gate electrode layer 140a over the first region 10 of the first substrate 102a. The second dummy gate structure 136b includes a second dummy gate dielectric layer 138b and a second dummy gate electrode layer 140b over the second region 20 of the second substrate 102b.

As shown in FIG. 3A-2, a first cladding layer 118a is formed over the first region 10, and a second cladding layer 118b is formed over the second region 20, in accordance with some embodiments of the disclosure. A first dielectric feature 134a includes a first liner layer 120a, a first filling layer 122a and a first cap layer 126a over the first region 10. A second dielectric feature 134b includes a second liner layer 120b, a second filling layer 122b and a second cap layer 126b over the second region 20.

The semiconductor structure 100b of FIG. 3A'-2 is similar to, or the same as, the semiconductor structure 100a of FIG. 3A-2, the difference between the FIG. 3A'-2 and FIG. 3A-2 is that, the first cladding layer 118a extends into the first isolation structure 116a and the second cladding layer 118b extends into the second isolation structure 116b. In other words, a portion of the first cladding layer 118a is below the top surface of the first isolation structure 116a and a portion of the second cladding layer 118b is below the top surface of the second isolation structure 116b. In some embodiments, the first isolation structure 116a and the second isolation layer 116b are recessed to form recesses, and then the first cladding layer 118a and the second cladding layer 118b are formed in the recesses. Therefore, a portion of the first cladding layer 118a and a portion of the second cladding layer 118b are below the top surfaces of the first isolation structure 116a and the second isolation layer 116b.

Next, as shown in FIG. 3B-1, a first S/D recess 150a is formed over the first region 10 and a second S/D recess 150b is formed over the second region 20, in accordance with some embodiments of the disclosure. More specifically, a portion of the first semiconductor layers 106 and a portion of the second semiconductor layers 108 are removed to form the first S/D recess 150a and the second S/D recess 150b.

Afterwards, as shown in FIG. 3B-2, the bottom surface of the first S/D recess 150a is lower than the top surface of the isolation structure 116a, and the bottom surface of the second S/D recess 150b is lower than the top surface of the second isolation structure 116b, in accordance with some embodiments of the disclosure.

The semiconductor structure 100b of FIG. 3B'-2 is similar to, or the same as, the semiconductor structure 100a of FIG. 3B-2, the difference between the FIG. 3B'-2 and FIG. 3B-2 is that, the first S/D recess 150a has an extending portion extends into a portion of the first isolation structure 116a, and the second S/D recess 150b has an extending portion extends into a portion of the second isolation structure 116b.

Afterwards, as shown in FIG. 3C-1, a portion of the first semiconductor layers 106a over the first region 10 is removed to form a number of notches, and first inner spacers 156a are formed in the notches, in accordance with some embodiments of the disclosure. In addition, a portion of the first semiconductor layers 106b over the second region 20 is removed to form a notch, and second inner spacers 156b are formed in the notches. The first inner spacers 156a and the second inner spacers 156b are configured to as a barrier between an S/D structure (formed later) and a gate structure (formed later). The first inner spacers 156a and the second inner spacers 156b can reduce the parasitic capacitance between the S/D structure (formed later) and the gate structure (formed later).

FIGS. 3C-2 and 3C'-2 is similar to, or the same as, FIGS. 3B-2 and 3B'-2, in accordance with some embodiments of the disclosure.

Next, as shown in FIG. 3D-1, a first bottom layer 158a is formed in the first S/D recess 150a over the first region 10, and a second bottom layer 158b is formed in the second S/D recess 150b over the second region 20, in accordance with some embodiments of the disclosure. In some embodiments, the first bottom layer 158a is called as EPI layer or called as $L_0$ EPI layer.

As shown in FIG. 3D-2, the top surface of the first bottom layer 158a is substantially level with the bottom surface of the one first inner spacer 156a. In addition, the top surface of the second bottom layer 158b is substantially level with the bottom surface of the one second inner spacer 156b. The top surface of the first bottom layer 158a is higher than the top surface of the first isolation structure 116a. The top surface of the second bottom layer 158b is higher than the top surface of the second isolation structure 116b.

The first bottom layer 158a and the second bottom layer 158b are used to define the locations of a first dielectric liner layer 160a (formed later) and a first insulating layer 164a (formed later), and to further define the effective nanostructure number (e.g. nanosheet number) and to achieve multi-nanostructures (e.g. multi-nanosheets) co-exist.

In some embodiments, the first bottom layer 158a and the second bottom layer 158b are simultaneously formed, and the top surface of the first bottom layer 158a and the top surface of the second bottom layer 158b are in the same level.

In some embodiments, the first bottom layer 158a and the second bottom layer 158b independently include un-doped Si, un-doped SiGe or a combination thereof. In some embodiments, the first bottom layer 158a and the second bottom layer 158b independently are formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

As shown in FIG. 3D'-2, the first bottom layer 158a has an extending portion extends into a portion of the first isolation structure 116a, and the second bottom layer 158b also has an extending portion extends into a portion of the second isolation structure 116b.

Next, as shown in FIG. 3E-1, a first dielectric liner layer 160a and a second dielectric liner layer 160b are formed over the first dummy gate structure 136a, the second dummy gate structure 136b, the first bottom layer 158a and the second bottom layer 158b, in accordance with some embodiments of the disclosure. More specifically, the first dielectric liner layer 160a and the second dielectric liner layer 160b are conformally over the first gate spacer 148a, the second gate spacer 148b, the outer sidewalls of the first semiconductor layers 106a, 106b and the second semiconductor layers 108a, 108b.

In some embodiments, the first dielectric liner layer 160a and the second dielectric liner layer 160b independently made of SiN, SiOC, SiOCN or another applicable material. In some embodiments, the first dielectric liner layer 160a and the second dielectric liner layer 160b independently formed by a deposition process, such as CVD process, ALD process, another applicable process, or a combination thereof.

As shown in FIG. 3E-2, the first dielectric liner layer 160a is formed over the first cap layer 126a, the first liner layer 120a, and the first bottom layer 158a, in accordance with some embodiments of the disclosure. The second dielectric liner layer 160b is formed over the second cap layer 126b, and the second liner layer 120b and the second bottom layer 158b.

FIG. 3E'-2, is similar to, or the same as, FIG. 3E-2, the difference is that the first bottom layer 158a and the second bottom layer 158b have extending portions extends into the first isolation structure 116a and the second isolation structure 116b.

Afterwards, as shown in FIG. 3F-1, a second PR layer 161b is formed over the second bottom layer 158b over the second region 20, and a portion of the first dielectric liner layer 160a is removed, in accordance with some embodiments of the disclosure. As a result, the vertical portion of the first dielectric liner layer 160a is left, but the horizontal portion of the first dielectric liner layer 160a is removed to expose the top surface of the first bottom layer 158a.

As shown in FIG. 3F-2, the second PR layer 161b is formed to cover the second bottom layer 158b, the second dielectric liner layer 160b over the second region 20. The horizontal portion of the first dielectric liner layer 160a is removed by an etching process, such as a wet etching process or a dry etching process. In some embodiments, the portion of the first dielectric liner layer 160a is removed by a plasma etching to etch the horizontal portion. As a result, the vertical portion of the first dielectric liner layer 160a is remaining.

FIG. 3F'-2, is similar to, or the same as, FIG. 3F-2, the difference is that the first bottom layer 158a and the second bottom layer 158b have extending portions extends into the first isolation structure 116a and the second isolation structure 116b.

Next, as shown in FIG. 3G-1, a first top layer 162a is formed over the first bottom layer 158a and the first dielectric liner layer 160a, in accordance with some embodiments of the disclosure. Next, the second PR layer 161b over the second region 20 is removed after the first top layer 162a is formed. The top surface of the first top layer 162a is lower than the top surface of one of the first inner spacers 156a and higher than the bottom surface of the one first inner spacer 156a.

The first top layer 162a includes un-doped Si, un-doped SiGe or a combination thereof. The first top layer 162a and the first bottom layer 158a may be made of the same material or different materials. If the first top layer 162a and the first bottom layer 158a are made of different materials, an interface is between the first top layer 162a and the first bottom layer 158a. In some embodiments, the interface is substantially the bottom surface of one of the first inner spacers 156a. In some embodiments, the first top layer 162a is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

As shown in FIG. 3G-2, the first top layer 162a is formed over the first bottom layer 158a and the first dielectric liner layer 160a, in accordance with some embodiments of the disclosure.

FIG. 3G'-2, is similar to, or the same as, FIG. 3G-2, the difference is that the first bottom layer 158a and the second bottom layer 158b have extending portions extend into the first isolation structure 116a and the second isolation structure 116b.

Afterwards, as shown in FIG. 3H-1, a portion of the first dielectric liner layer 160a is removed which is not coved by the first top layer 162a and the second dielectric liner layer 160b are removed, in accordance with some embodiments of the disclosure. The remaining first dielectric liner layer 160a is formed on opposite sidewalls of the first top layer 162a. The remaining first dielectric liner layer 160a is in direct contact with one of the first inner spacers 156a. The top surface of the first dielectric liner layer 160a is lower than the top surface of one of the inner spacers 156a. The inner surface of the first dielectric liner layer 160a is aligned with an outer surface of one of the first inner spacers 156a. The top surface of the first top layer 162a over the first region 10 is higher than the top surface of the second bottom layer 158b over the second region 20.

As shown in FIG. 3H-2, the portion of the first dielectric liner layer 160a is removed, and therefore the remaining first dielectric liner layer 160a is between the first top layer 162a and the first liner layer 120a, in accordance with some embodiments of the disclosure. The first dielectric liner layer 160a is in direct contact with first liner layer 120b of the first dielectric feature 134a.

FIG. 3H'-2, is similar to, or the same as, FIG. 3H-2, the difference is that the second bottom layer 158b with extending portion is over the second region 20, and the first bottom layer 158a with the extending portion is below the first top layer 162a.

Next, as shown in FIG. 3I-1, a first insulating layer 164a and a second insulating layer 164b are formed over the first top layer 162a and the second bottom layer 158b, in accordance with some embodiments of the disclosure. More specifically, the first insulating layer 164a and a second insulating layer 164b are conformally formed on the first gate spacer 148a, the second gate spacer 148b, the sidewalls of one of the first inner spacers 156a, the sidewalls of one of the second inner spacers 156b, the first top layer 162a and the second bottom layer 158b.

As shown in FIG. 3I-2, the first insulating layer 164a and the second insulating layer 164b are formed over the first cap layer 126a, the second cap layer 126b, sidewalls of the first liner layer 120a, sidewalls of the second liner layer 120b, the first top layer 162a and the second bottom layer 158b, in accordance with some embodiments of the disclosure.

FIG. 3I'-2, is similar to, or the same as, FIG. 3I-2, the difference is that the first insulating layer 164a is formed over the first bottom layer 158a with the extending portion, and the second insulating layer 164b is formed over the second bottom layer 158b with the extending portion.

The first insulating layer 164a and the first dielectric liner layer 160a are made of different materials. In some embodiments, the first insulating layer 164a and the second insulating layer 164b are independently made of SiN, SiON, SiOCN, SiOC, SiCN, SiOx, AlOx, HfOx or another applicable material. In some embodiments, the first insulating layer 164a and the second insulating layer 164b are independently formed by a deposition process, such as CVD process, ALD process, another applicable process, or a combination thereof. In some embodiments, the first insulating layer 164a and the second insulating layer 164b are formed by an ALD or an ALD-like process. In some embodiments, the ALD process is performed at a pressure in a range from about 1 Torr to about 8 Torr. In some embodiments, the ALD process is performed at a temperature in a range from about 350 Celsius degrees to about 600 Celsius degrees. In some embodiments, the ALD process is performed by using a gas including $SiH_4$, $SiCl_2H_2$, $NH_3$, Ar, $N_2$, or applicable gas.

Afterwards, as shown in FIG. 3J-1, a portion of the first insulating layer 164a and a portion of the second insulating layer 164b are removed, in accordance with some embodiments of the disclosure. More specifically, a treatment process is performed on first insulating layer 164a and the second insulating layer 164b and then an etching process is performed to remove a portion of the first insulating layer 164a and a portion of the second insulating layer 164b. As a result, the first insulating layer 164a is formed over the first top layer 162a over the first region 10, and the second insulating layer 164b is formed over the second bottom layer 158b over the second region 20.

The first insulating layer 164a is higher than the second insulating layer 164b. More specifically, the top surface of the first insulating layer 164a is higher than the top surface of the second insulating layer 164b. The top surface of the first insulating layer 164a is higher than the bottom surface of one of the first inner spacers 156a and lower than one of the top surface of one of the first inner spacers 156a. The top surface of the first insulating layer 164a is substantially level with one of the top surface of one of the first inner spacers 156a. The first insulating layer 164a is higher than the bottommost second semiconductor layer 108a over the first region 10. The second insulating layer 164b is lower than the bottommost second semiconductor layer 108b over the second region 20. One of the first inner spacers 156a is in direct contact with the first insulating layer 164a, and one of the second inner spacers 156b is in direct contact with the second insulating layer 164b.

In some embodiments, the property of bottom portions of the first insulating layer 164a is modified by the treatment process, and therefore the bottom portions which are directly over the first top layer 162a and the second insulating layer 164b are not easily removed by the etching process after the treatment process. In other words, the vertical portion of the first insulating layer 164a become weak after the treatment process, and therefore the vertical portions are easily removed by the etching process. The etching rate of the bottom portions of the first insulating layer 164a is smaller than that of the vertical portions of the first insulating layer 164a. In some embodiments, the treatment process is performed by a plasmat process using a gas including nitride, carbon (C), Ar, Kr, Xe, SiC, $N_2$, $NH_3$, $H_2$, or another applicable material.

The height of one of the first inner spacers 156a is greater than the height of the first insulating layer 164a along a vertical direction (Z-axis). The height of one of the second inner spacers 156b is greater than the height of the second insulating layer 164b. In some embodiments, the height of one of the first inner spacers 156a is in a range from about 7 nm to about 15 nm along a vertical direction (Z-axis). In some embodiments, the height of one of the second inner spacers 156b is in a range from about 7 nm to about 15 nm along a vertical direction (Z-axis). In some embodiments, the height of the first insulating layer 164a is in a range from about 3 nm to about 8 nm along a vertical direction (Z-axis). In some embodiments, the height of the second insulating layer 164b is in a range from about 3 nm to about 8 nm along a vertical direction (Z-axis).

As shown in FIG. 3J-2, the first insulating layer 164a is formed on sidewalls of the first liner layer 120a over the first region 10, and the second insulating layer 164b is formed on sidewalls of the second liner layer 120b over the second region 20, in accordance with some embodiments of the disclosure.

FIG. 3J'-2, is similar to, or the same as, FIG. 3J-2, the difference is that the first insulating layer 164a is formed over the first bottom layer 158a with the extending portion, and the second insulating layer 164b is formed over the second bottom layer 158b with the extending portion.

Next, as shown in FIG. 3K-1, first S/D structures 166a, 168a are formed over the first insulating layer 164a, and second S/D structures 166b, 168b are formed over the second insulating layer 164b, in accordance with some embodiments of the disclosure. In some embodiments, the sub-portion 166a and the sub-portion 168a of the first S/D structures are made of the same materials but have different doping concentrations. In some other embodiments, the sub-portion 166a and the sub-portion 168a of the first S/D structures are made of different materials. The first S/D structure 166a, 168a is isolated from the first bottom layer 158a by the first insulating layer 164a over the first region 10. The second S/D structure 166b, 168b is isolated from the second bottom layer 158b by the second insulating layer 164b over the second region 20.

In some embodiments, the first height of the first S/D structure 166a, 168a is smaller than the second height of the second S/D structure 166b, 168b. The first S/D structure 166a, 168a and the second S/D structure 166b, 168b may independently include silicon germanium (SiGe), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof. The first S/D structure 166a, 168a and the second S/D structure 166b, 168b may dope with one or more dopants. In some embodiments, the first S/D structure 166a, 168a or the second S/D structure 166b, 168b is silicon (Si) doped with phosphorus (P), arsenic (As), antimony (Sb), or another applicable dopant. Alternatively, the first S/D structure 166a, 168a or the second S/D structure 166b, 168b is silicon germanium (SiGe) doped with boron (B) or another applicable dopant.

In some embodiments, the first S/D structure 166a, 168a and the second S/D structure 166b, 168b are formed by an epitaxy or epitaxial (epi) process. The epi process may include a selective epitaxial growth (SEG) process, CVD deposition techniques (e.g., vapor-phase epitaxy (VPE) and/ or ultra-high vacuum CVD (UHV-CVD)), molecular beam epitaxy, or other suitable epi processes.

In some embodiments, when an N-type FET (NFET) device is desired, the first S/D structure 166a, 168a and the second S/D structure 166b, 168b include an epitaxially growing silicon (epi Si). Alternatively, when a P-type FET (PFET) device is desired, the first S/D structure 166a, 168a and the second S/D structure 166b, 168b include an epitaxially growing silicon germanium (SiGe).

As shown in FIG. 3K-2, the first S/D structure 168a and the second S/D structure 168b are formed over the first insulating layer 164a and the second insulating layer 164b. The top surface of the first S/D structure 168a is lower than the top surface of the first cap layer 126a and higher than the top surface of the first filling layer 122a. In other words, the top surface of the first cap layer 126a is higher than the top surface of the first S/D structure 168a. The top surface of the second S/D structure 168b is lower than the top surface of the second cap layer 126b and higher than the top surface of the second filling layer 122b.

FIG. 3K'-2, is similar to, or the same as, FIG. 3K-2, the difference is that the first insulating layer 164a is formed over the first bottom layer 158a with the extending portion, and the second insulating layer 164b is formed over the second bottom layer 158b with the extending portion.

Afterwards, as shown in FIG. 3L-1, a contact etch stop layer (CESL) 170 is formed over the first S/D structure 166a, 168a and the second S/D structure 166b, 168b, and an inter-layer dielectric (ILD) layer 172 is formed over the CESL 170, in accordance with some embodiments. Next, a portion of the ILD layer 172 is removed to expose the top surface of the first dummy gate electrode layer 140a and the top surface of the second dummy gate electrode layer 140b. In some embodiments, the portion of the ILD layer 142 is removed by a planarizing process, a chemical mechanical polishing (CMP) process.

As shown in FIG. 3L-2, the CESL 170 is formed over the first cap layer 126a and the second cap layer 126b, in accordance with some embodiments of the disclosure.

FIG. 3L'-2, is similar to, or the same as, FIG. 3L-2, the difference is that the CESL 170 is formed over the first bottom layer 158a with the extending portion and the second bottom layer 158b with the extending portion.

Afterwards, as shown in FIG. 3M-1, the first dummy gate structure 136a and the second dummy gate structure 136b are removed to form a first trench 175a over the first region 10 and a second trench 175b over the second region 20, in accordance with some embodiments of the disclosure.

FIG. 3M-2, is similar to, or the same as, FIG. 3L-2. FIG. 3M'-2, is similar to, or the same as, FIG. 3L'-2, in accordance with some embodiments of the disclosure.

Next, as shown in FIG. 3N-1, the first semiconductor layer 106a over the first region 10 and the first semiconductor layers 106b over the second region 20 are removed to form a number of first gaps 177a over the first region 10 and a number of second gaps 177b over the second region 20, in accordance with some embodiments. As a result, a number of stacked structures made of the second semiconductor layers 108a/108b are obtained. A number of nanostructures (e.g. the second semiconductor layers 108a/108b) are stacked in the vertical direction.

FIG. 3N-2, is similar to, or the same as, FIG. 3L-2. FIG. 3N'-2, is similar to, or the same as, FIG. 3L'-2, in accordance with some embodiments of the disclosure.

Afterwards, as shown in FIG. 3O-1, a first gate structure 186a is formed in the first trench 175a and the first gaps 177a over the first region 10, a second gate structure 186b is formed in the second trench 175b and the second gaps 177b over the second region 20, in accordance with some embodiments. As a result, the number of nanostructures (e.g. the second semiconductor layers 108a in the first region 10) are surrounded by the first gate structure 186a in the first region 10, and the number of nanostructures (e.g. the second semiconductor layers 108b in the second region 20) are surrounded by the second gate structure 186b in the second region 20. The portion of the second semiconductor layers 108a in the first region 10 covered by the first gate structure 186a can be referred to as a channel region. The portion of the second semiconductor layers 108a in the second region 20 covered by the second gate structure 186b can be referred to as a channel region.

The first gate structure 186a includes a first gate dielectric layer 182a and a first gate electrode layer 184a. The second gate structure 186b includes a second gate dielectric layer 182b and a second gate electrode layer 184b. The first gate dielectric layer 182a is conformally formed along the main surfaces of the second semiconductor layers 108a/108b to surround the second semiconductor layers 108a/108b.

The first inner spacers 156a are between the first gate structure 186a and the first S/D structures 166a, 168a. The second inner spacers 156b are between the second gate structure 186b and the second S/D structure 166b, 168b.

In some embodiments, the first gate dielectric layer 182a and the second gate dielectric layer 182b independently include a high-k dielectric layer. In some embodiments, the high-k gate dielectric layer is made of one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the high-k gate dielectric layer is formed using chemical vapor deposition (CVD), atomic layer deposition (ALD), another suitable method, or a combination thereof.

In some embodiments, the first gate electrode layer 184a and the second gate electrode layer 184b independently include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof.

In addition, the first gate electrode layer 184a and the second gate electrode layer 184b independently include one or more layers of n-work function layer or p-work function layer. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

FIG. 3O-2, is similar to, or the same as, FIG. 3L-2. FIG. 3O'-2, is similar to, or the same as, FIG. 3L'-2, in accordance with some embodiments of the disclosure.

The location of the first dielectric liner layer 160a determinates the function of the nanostructure (e.g. the second semiconductor layers 108a in the first region 10) workable or not. The bottommost nanostructure (e.g. the second semiconductor layers 108a in the first region 10) in the first region 10 is below the top surface of the first dielectric layer 160a. Therefore, the bottommost one of nanostructures (e.g. the second semiconductor layers 108a in the first region 10) cannot perform the function of a channel of the semiconductor device structure 100b.

In addition, the first insulating layer 164a is higher than the bottommost one of nanostructures (e.g. the second semiconductor layers 108a in the first region 10), and therefore the bottommost one of nanostructures (e.g. the second semiconductor layers 108a in the first region 10 cannot as a channel of the semiconductor device structure 100a.

As mentioned above, the first dielectric liner layer 160a, the first insulating layer 164a, and the second insulating layer 164b are used to define the effective (or active) nanostructure number (e.g. nanosheet number) and to achieve multi-nanostructures (e.g. nanosheets) co-exist. In the first region 10, the first dielectric liner layer 160a and the first insulating layer 164a provide isolation functions, and therefore the first S/D structure 166a, 168a is isolated from the first top layer 162a by the first insulating layer 164a. In addition, the first S/D structure 166a, 168a is isolated from the bottom layer 158a by the first dielectric liner layer 160a.

The first dielectric liner layer 160a is adjacent one of the second semiconductor layers 108a (as nanostructure) over the first region 10, and one of the second semiconductor layers 108a (as nanostructure) is isolated from the top layer 162a by the first dielectric liner layer 160a. Therefore, the effective nanostructure number of semiconductor device structure 100a in the first region 10 is two.

In the first region 10, there are three nanostructures (e.g. three second semiconductor layers 108a in the first region 10), but the effective (or active) nanostructure number becomes two due to the formation of the first dielectric liner layer 160a and the first insulating layer 164a. In the second region 20, there are three nanostructures (e.g. three second semiconductor layers 108a in the second region 20), and the effective (or active) nanostructure number is also three.

More nanostructures (e.g. three second semiconductor layers 108a in the second region 20) can provide large effective width ($W_{eff}$) of the channel. The large effective width ($W_{eff}$) of channel can provide high speed of the semiconductor device structure. However, the larger effective width of the channel consumes more power. For high speed performance consideration, larger effective width ($W_{eff}$) is formed by having more nanostructures. For power efficiency, smaller effective width ($W_{eff}$) is formed by having fewer nanostructures. In order to fulfill different needs in a region, the effective nanostructure number can be controlled by defining the locations of the first dielectric liner layer 160a, the first insulating layer 164a and the second insulating layer 164b. The effective nanostructure number of semiconductor device structure 100a in the first region 10 is fewer than the effective nanostructure number of the semiconductor device structure 100a in the second region 20. Therefore, the semiconductor device structure 100a in the first region 10 is formed for power efficiency and the semiconductor device structure 100a in the second region 20 is formed for high speed performance.

It should be noted that the effective width ($W_{eff}$) of the channel may be controlled by adjusting the width of nanostructure along the X-direction or the Y-direction. If the semiconductor device structure with large effective width ($W_{eff}$) of the channel is designed along the X-direction or the Y-direction, it may occupy too much area. If the semiconductor device structure with small effective width ($W_{eff}$) of the channel is designed along the X-direction or the Y-direction, the process window for filling the gate structure or forming the S/D structure may be decreased. Therefore, in this disclosure, the effective width ($W_{eff}$) of the channel is controlled by defining the effective numbers of the nanostructures along the Z-direction, rather than in the X-direction or the Y-direction.

Figures 1, 4A:
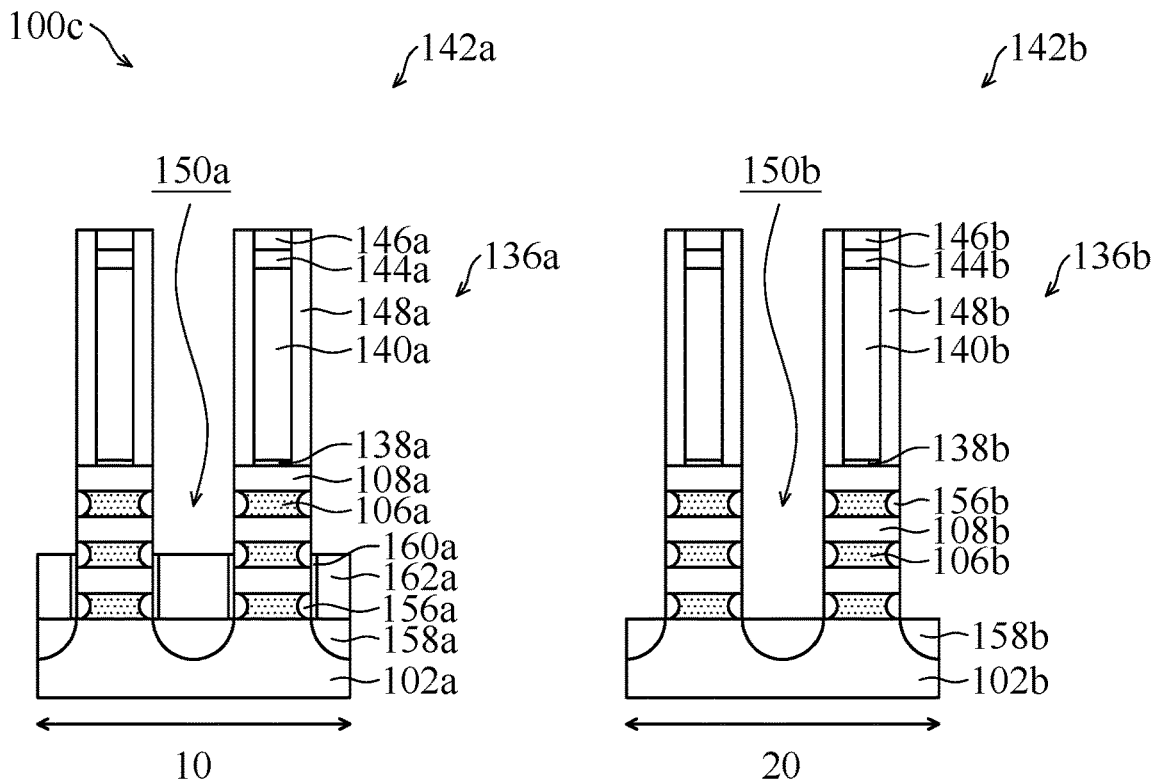
Figures 2, 4A:
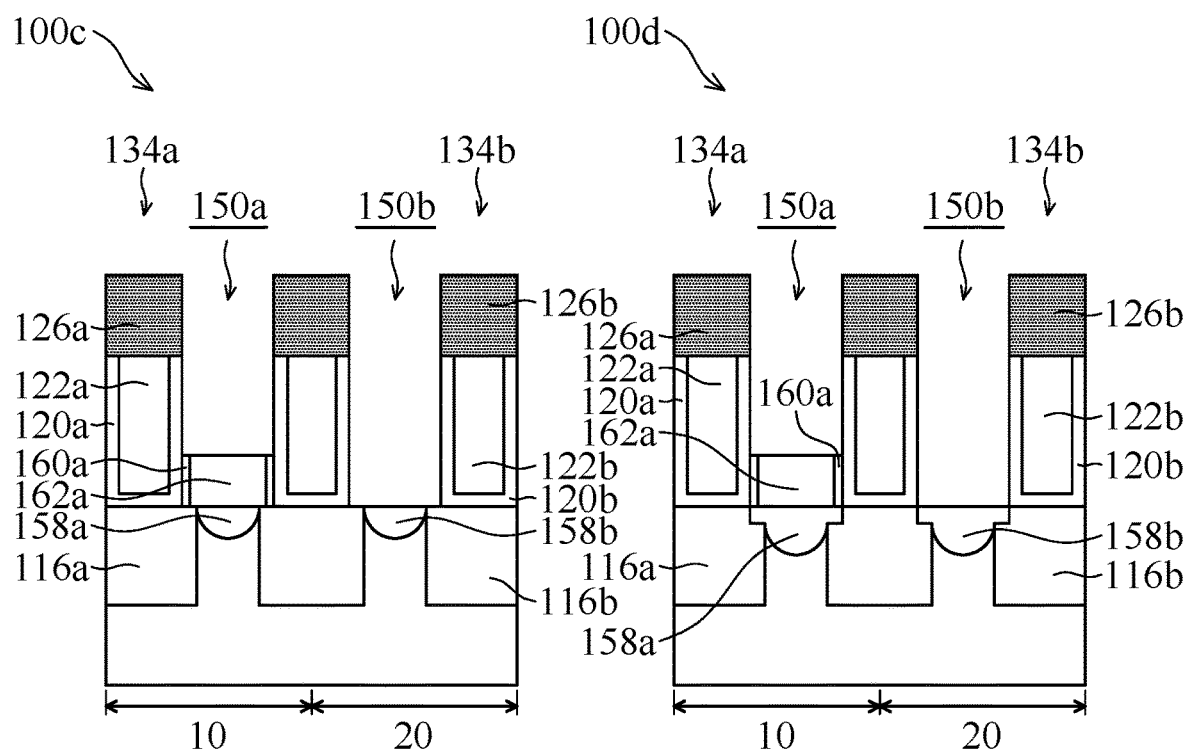
Figures 1, 4B:
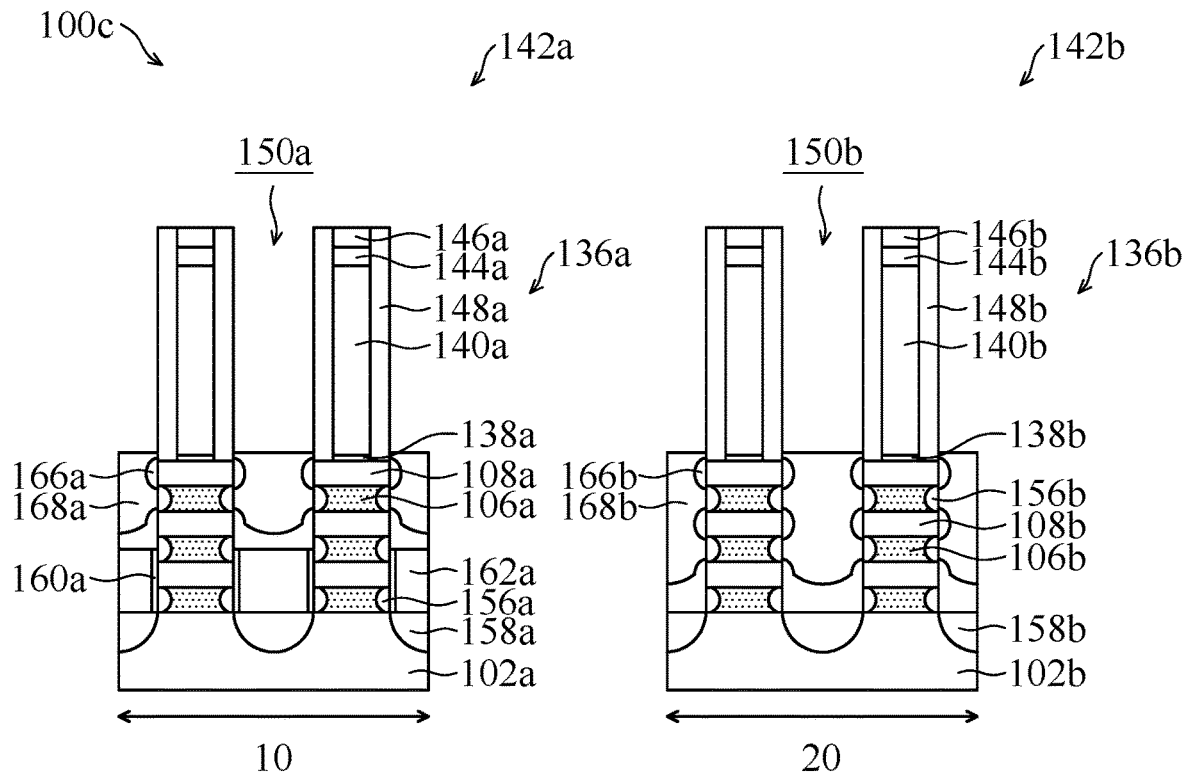
Figures 2, 4B:
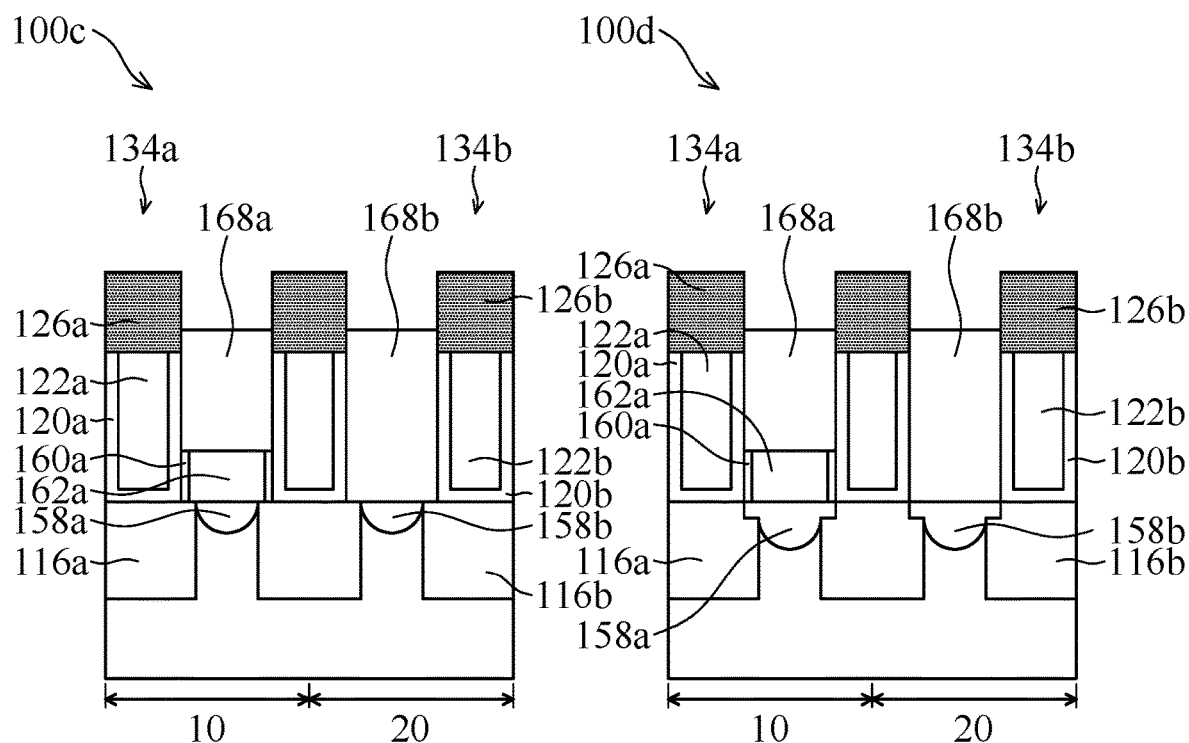
Figures 1, 4C:
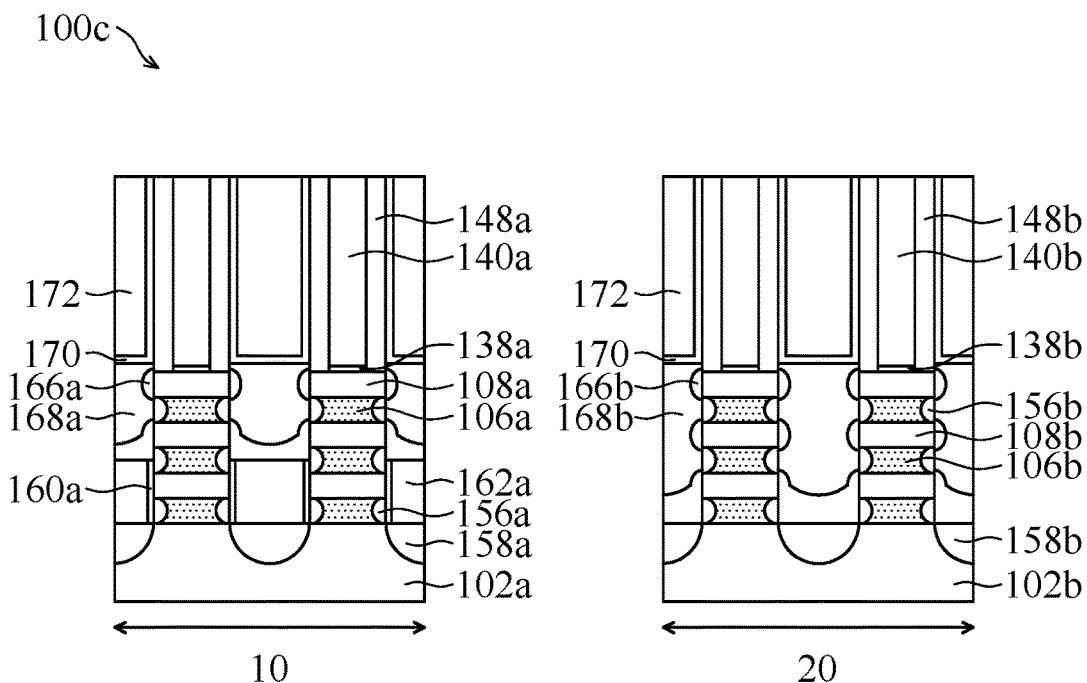
Figures 2, 4C:
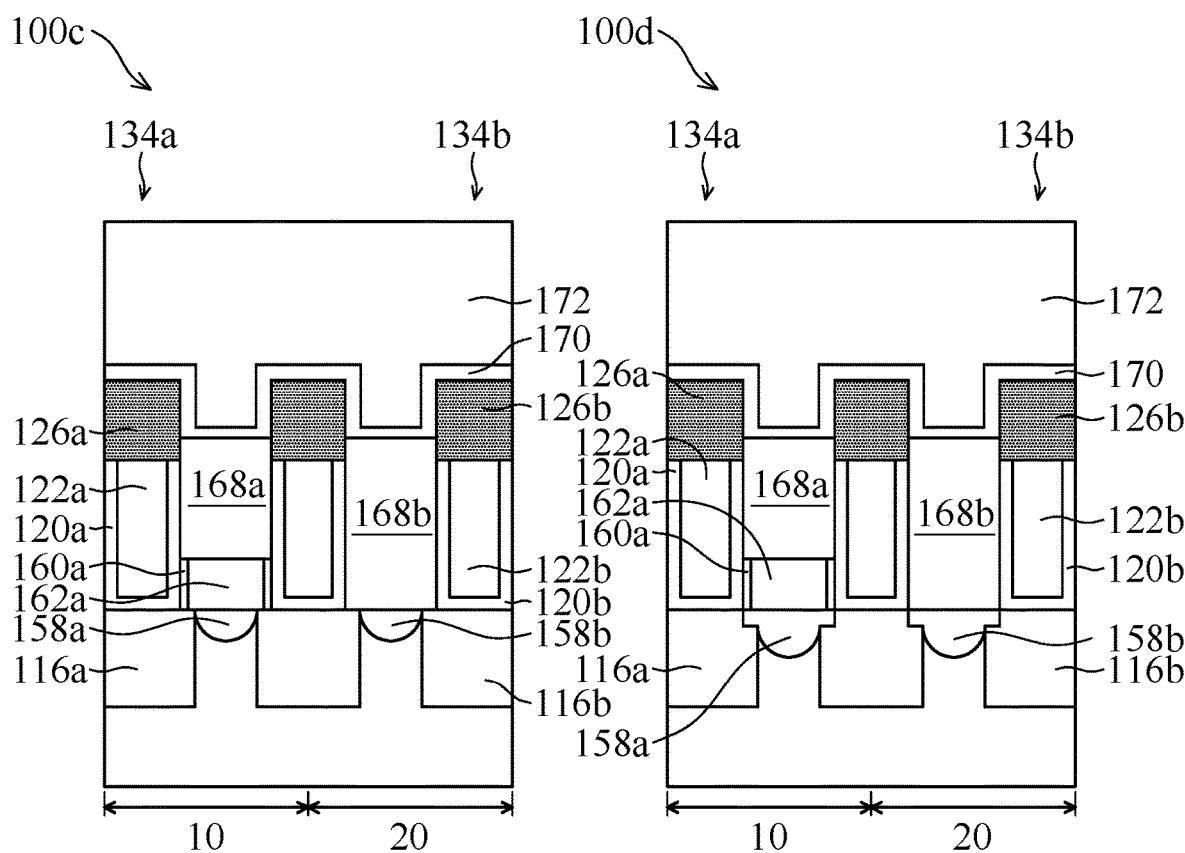
Figures 1, 4D:
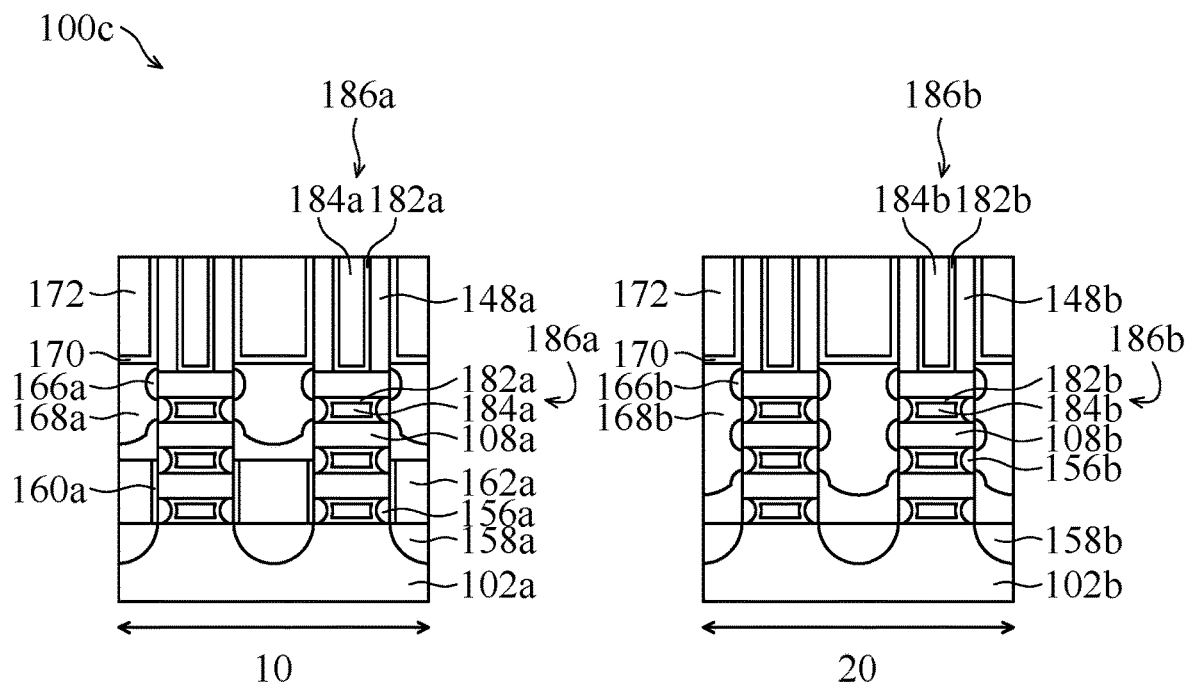
Figures 2, 4D:
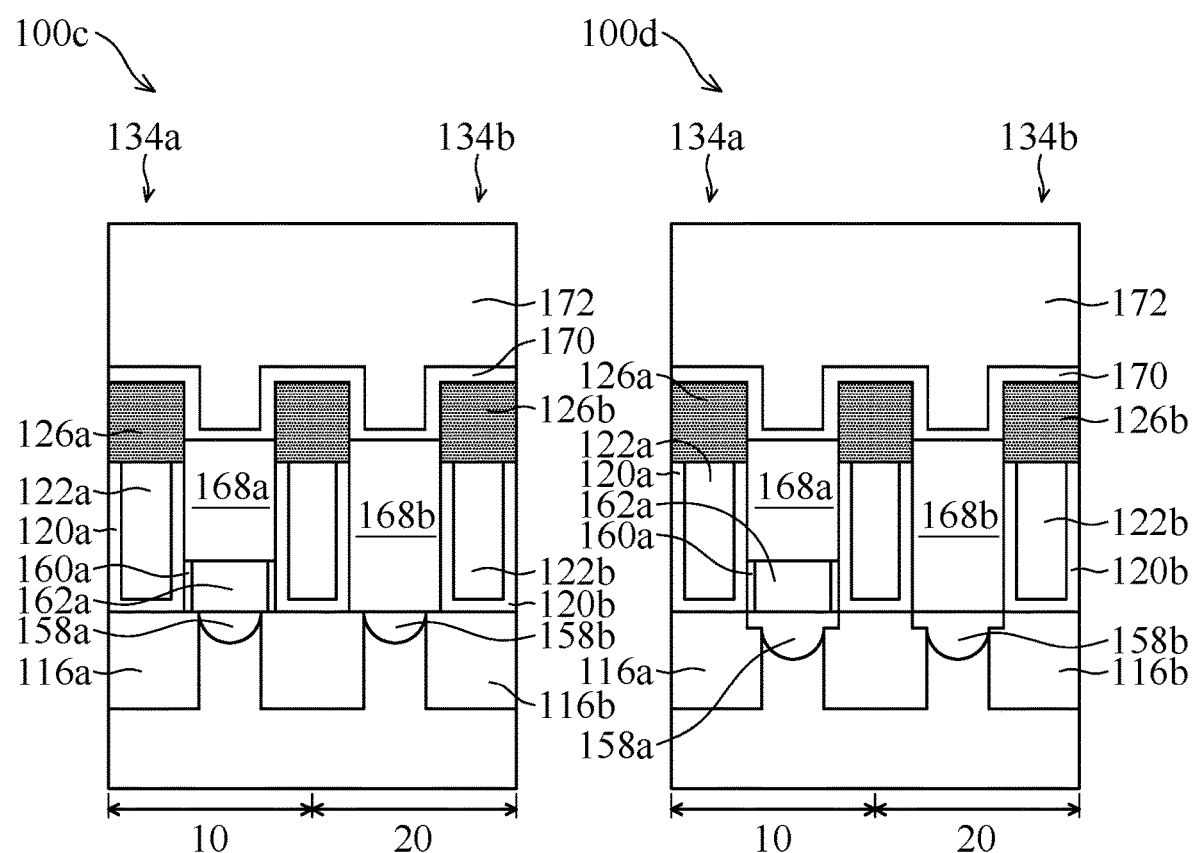

FIGS. 4A-1-4D-1 show cross-sectional representations of various stages of forming a semiconductor device structure 100c, in accordance with some embodiments of the disclosure. FIGS. 4A-2-4D-2 show cross-sectional representations of various stages of forming the semiconductor device structure 100c, in accordance with some embodiments of the disclosure. FIGS. 4A'-2-4D'-2 show cross-sectional representations of various stages of forming the semiconductor device structure 100d. The semiconductor structure 100c of FIG. 4D-1 is similar to, or the same as, the semiconductor structure 100a of FIG. 3O-1, the difference is that no insulating layer over the first top layer 162a, and no insulating layer is over the second bottom layer 158b in FIG. 4D-1.

As shown in FIG. 4A-1, the first top layer 162a is formed over the first bottom layer 158a, and the first dielectric liner layer 160a is formed on sidewalls of the first top layer 162a, in accordance with some embodiments of the disclosure. The top surface of the first top layer 162a is higher than the top surface of the second bottom layer 158b.

As shown in FIG. 4A-2, the first dielectric liner layer 160a is between the first top layer 162a and the first liner layer 120a of the first dielectric feature 134a, in accordance with some embodiments of the disclosure.

FIG. 4A'-2, is similar to, or the same as, FIG. 4A-2, the difference is that the first bottom layer 158a with the extending portion is below the first top layer 162a over the first region 10, and the second bottom layer 158b with the extending portion is over the second region 20.

Afterwards, as shown in FIG. 4B-1, the first S/D structures 166a, 168a are formed over the first top layer 162a, and the second S/D structures 166b, 168b are formed over the second bottom layer 158b, in accordance with some embodiments of the disclosure.

As shown in FIG. 4B-2, the first S/D structure 168a and the second S/D structure 168b respectively are formed over the first top layer 162a and the second bottom layer 158b. The top surface of the first S/D structure 168a is lower than the top surface of the first cap layer 126a of the first dielectric feature 134a and higher than the top surface of the first filling layer 122a of the first dielectric feature 134a. The top surface of the second S/D structure 168b is lower than the top surface of the second cap layer 126b of the second dielectric feature 134b and higher than the top surface of the second filling layer 122b of the second dielectric feature 134b.

FIG. 4B'-2, is similar to, or the same as, FIG. 4B-2, the difference is that the first S/D structure 168a is formed over the first bottom layer 158a with the extending portion, and the second S/D structure 168b is formed over the second bottom layer 158b with the extending portion.

Afterwards, as shown in FIG. 4C-1, the CESL 170 is formed over the first S/D structure 166a, 168a and the second S/D structure 166b, 168b, and the ILD layer 172 is formed over the CESL 170, in accordance with some embodiments.

As shown in FIG. 4C-2, the CESL 170 is formed over the first cap layer 126a of the first dielectric feature 134a and the second cap layer 126b of the second dielectric feature 134b, in accordance with some embodiments of the disclosure.

FIG. 4C'-2, is similar to, or the same as, FIG. 4C-2, the difference is that the CESL 170 is formed over the first bottom layer 158a with the extending portion and the second bottom layer 158b with the extending portion.

Next, as shown in FIG. 4D-1, the first gate structure 186a is formed over the first region 10, and the second gate structure 186b is formed over the second region 20, in accordance with some embodiments.

FIG. 4D-2, is similar to, or the same as, FIG. 4C-2. FIG. 4D'-2, is similar to, or the same as, FIG. 4C'-2, in accordance with some embodiments of the disclosure.

Figures 1, 5A:
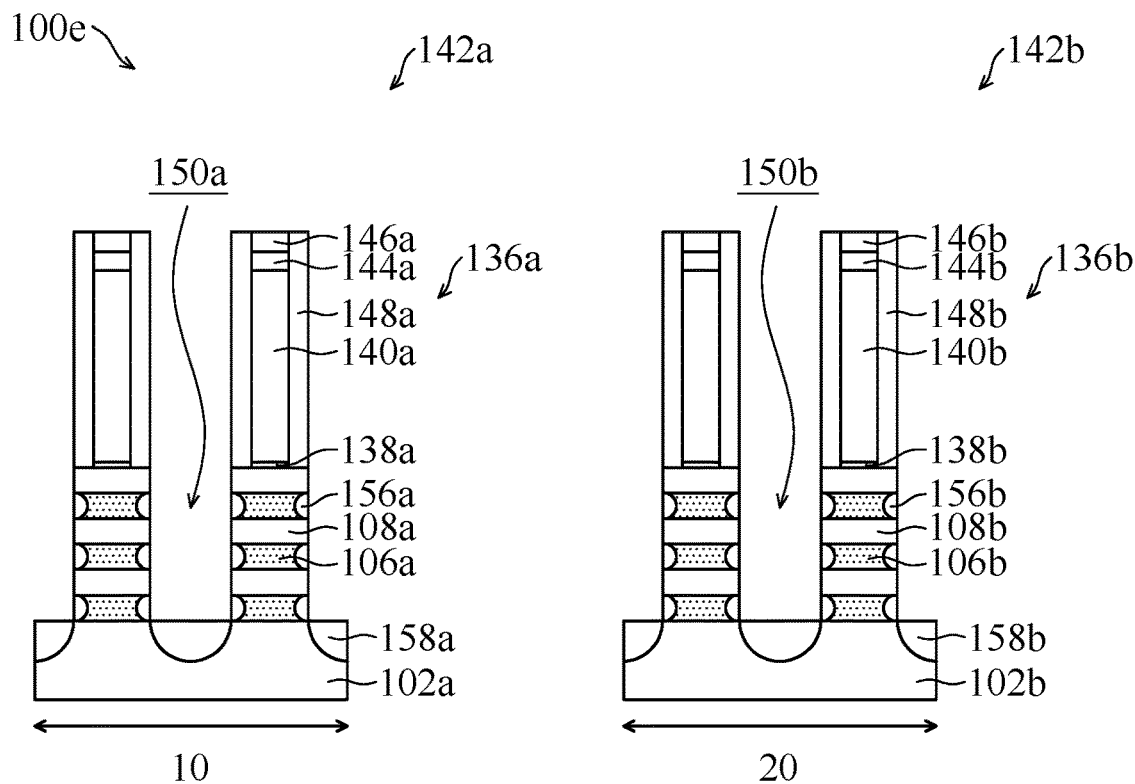
Figures 2, 5A:
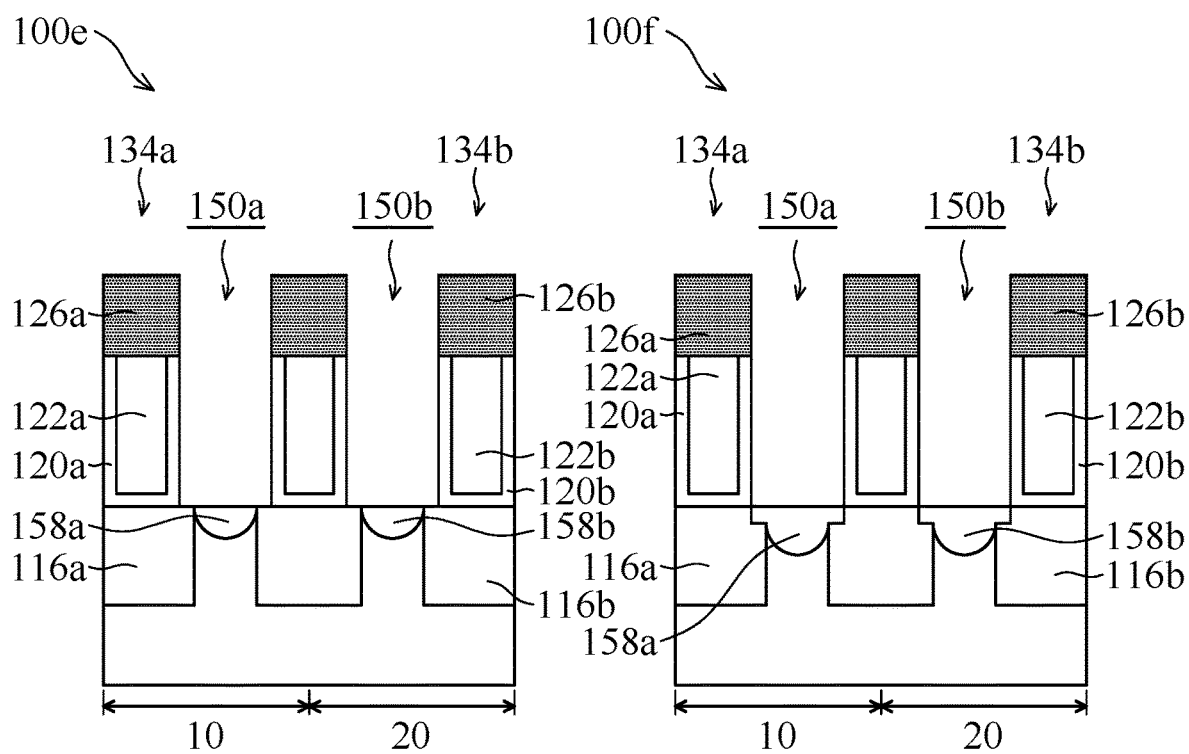
Figures 1, 5B:
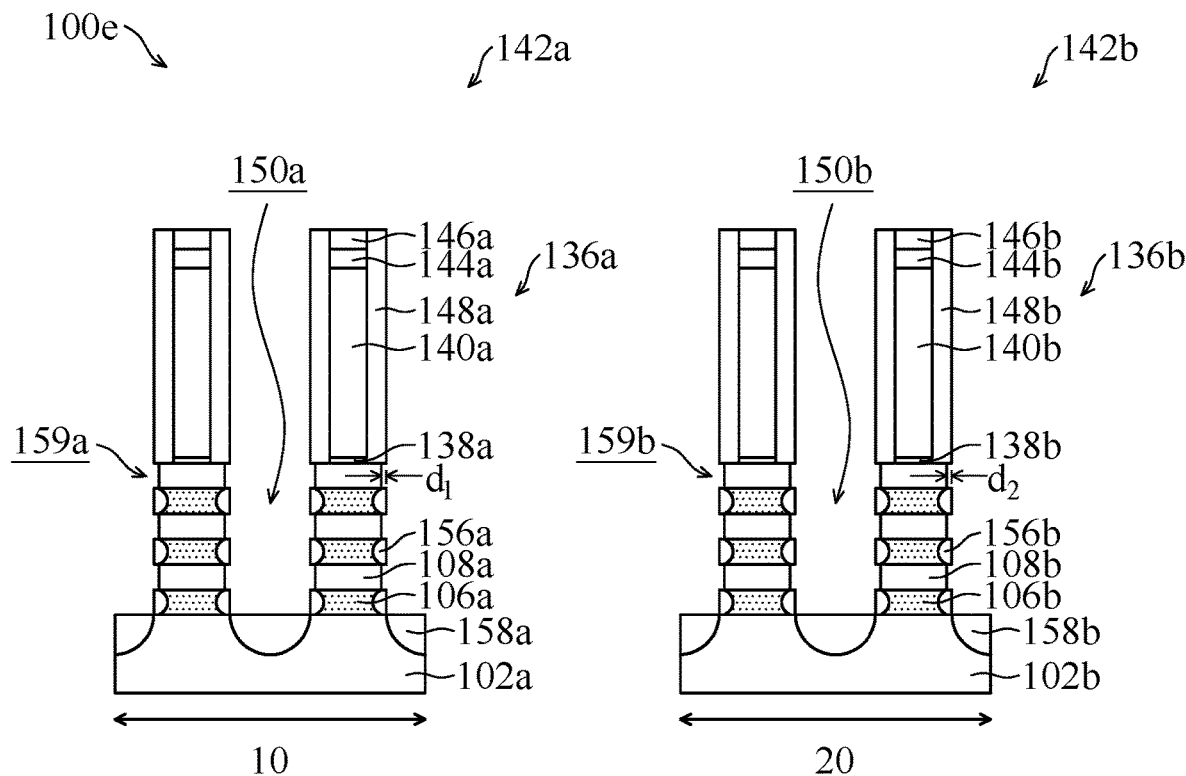
Figures 2, 5B:
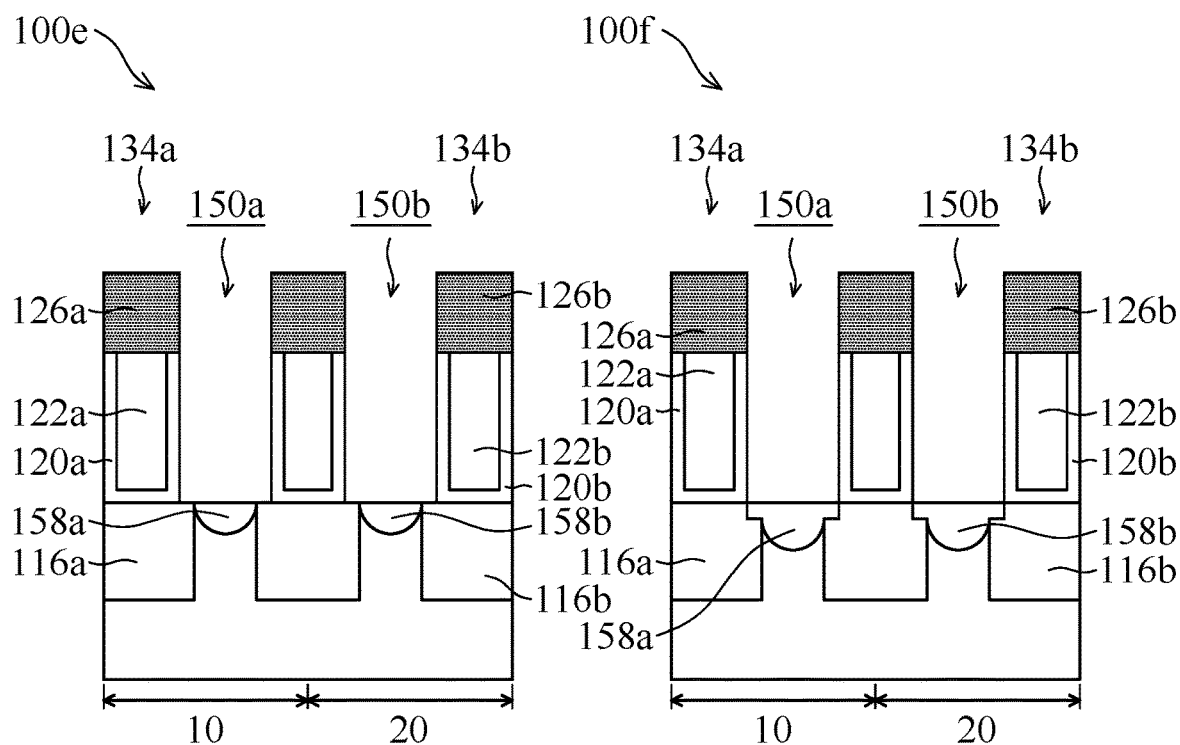
Figures 1, 5C:
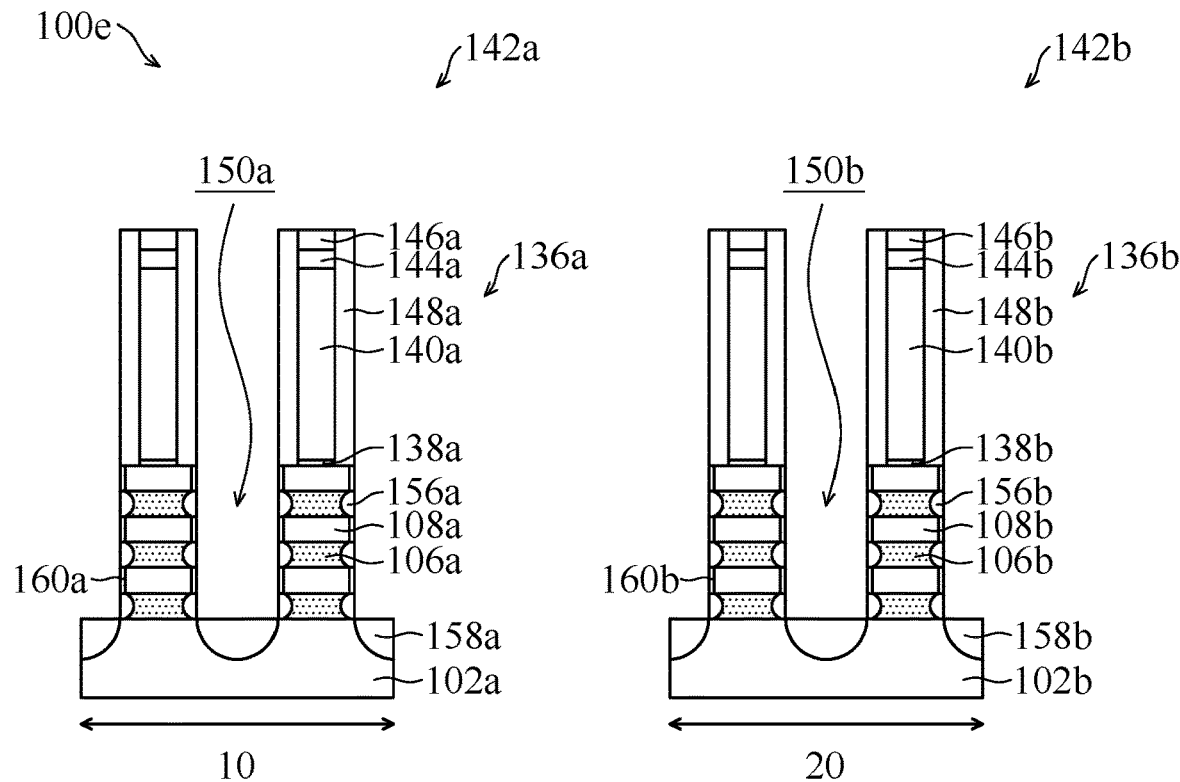
Figures 2, 5C:
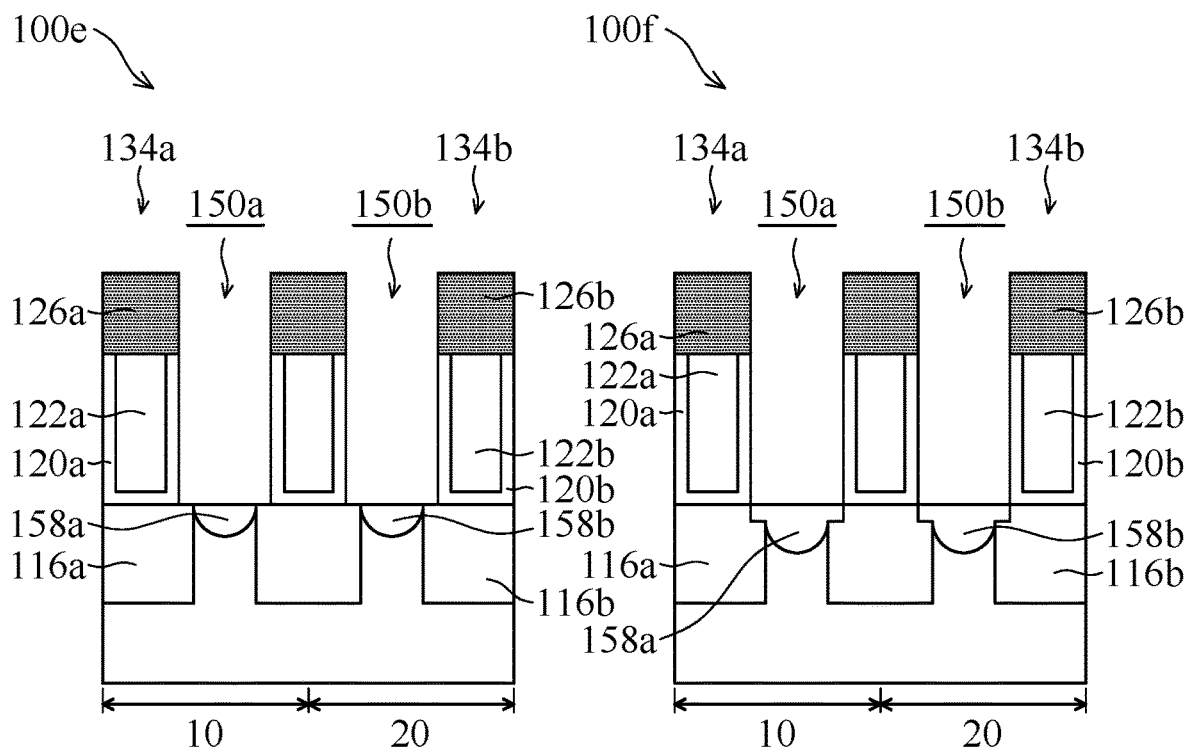
Figures 1, 5D:
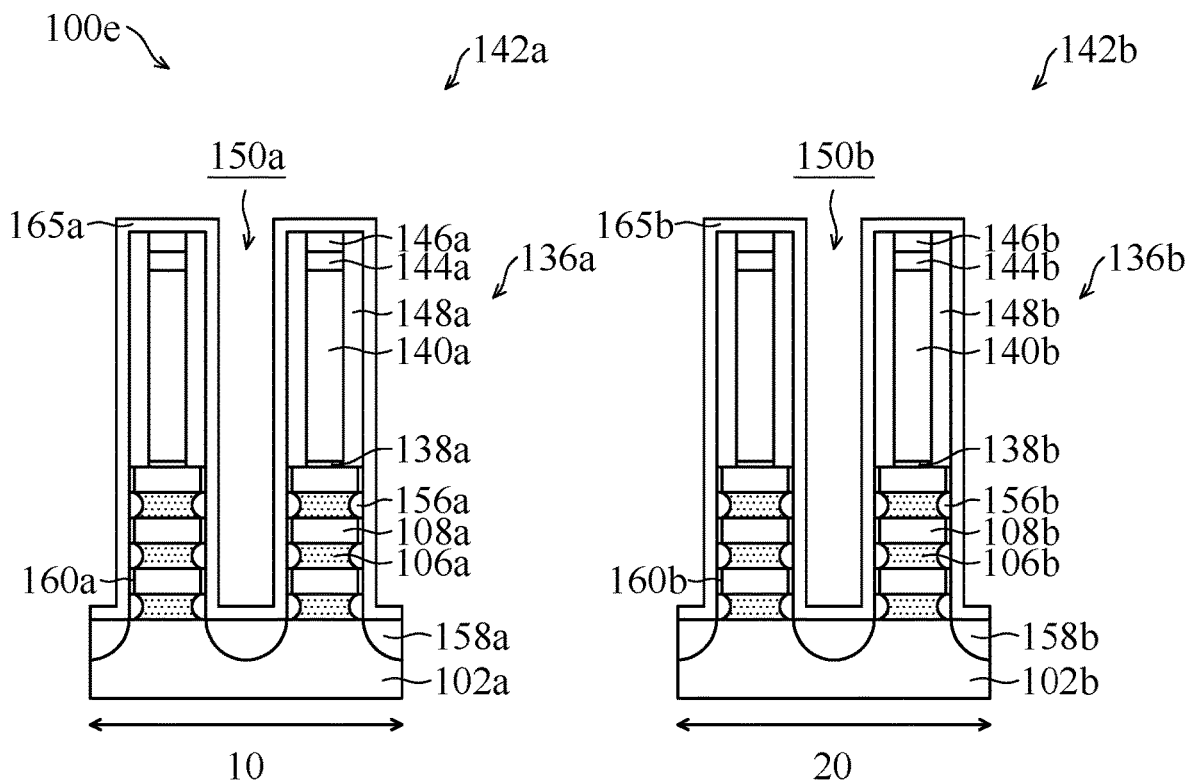
Figures 2, 5D:
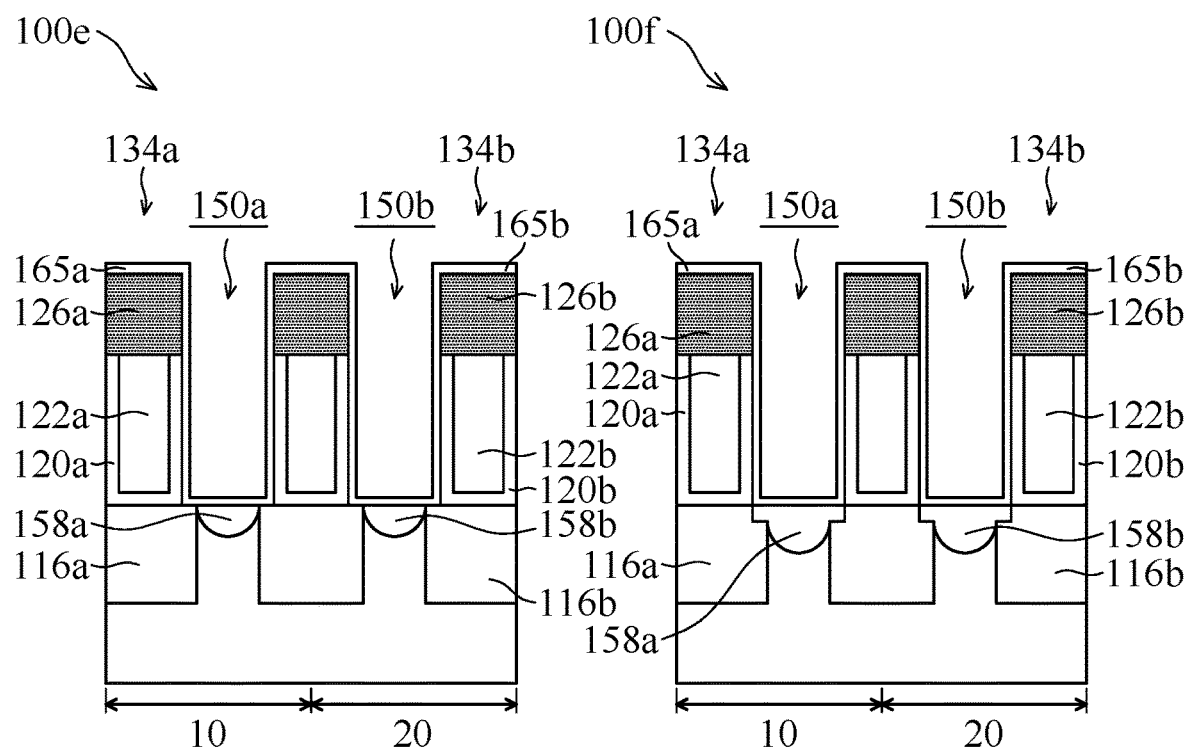
Figures 1, 5E:
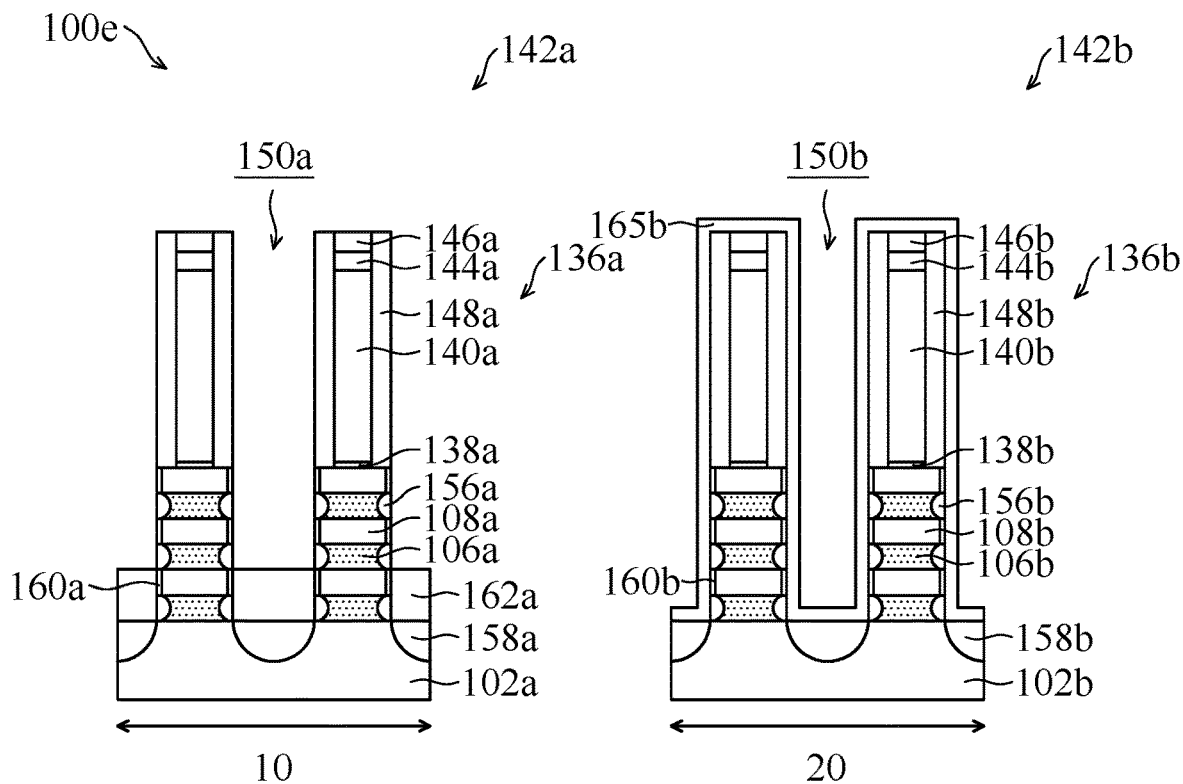
Figures 2, 5E:
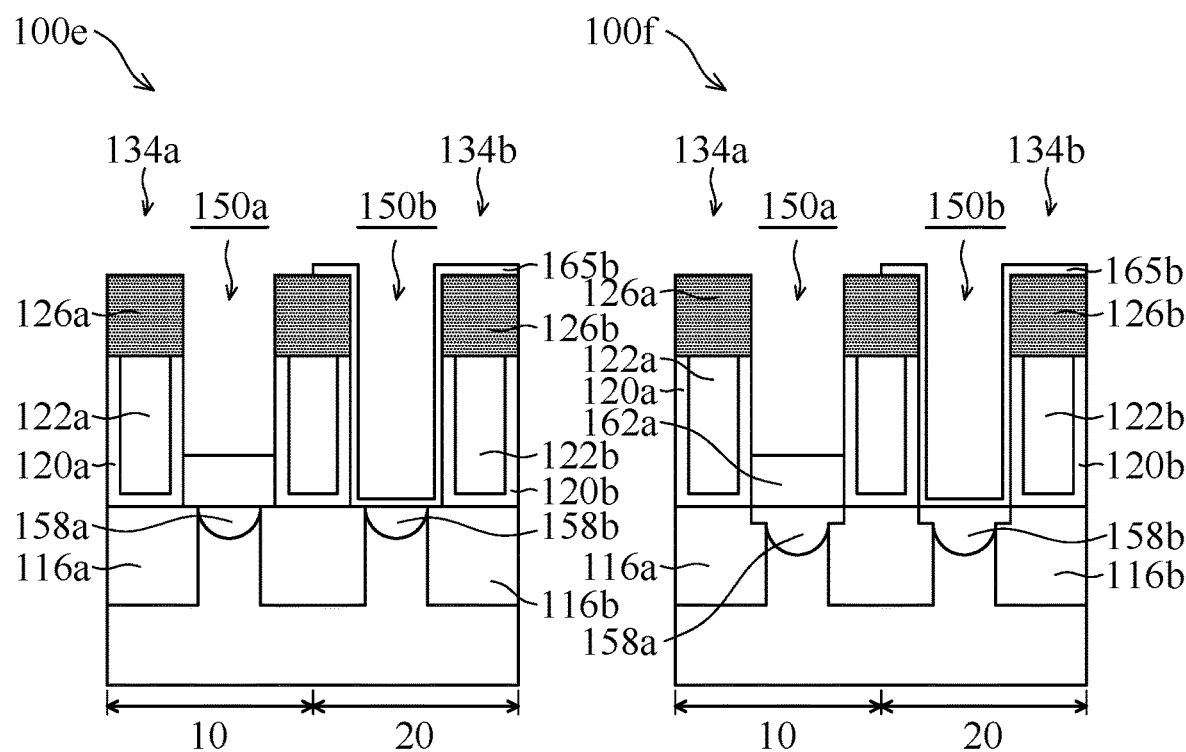
Figures 1, 5F:
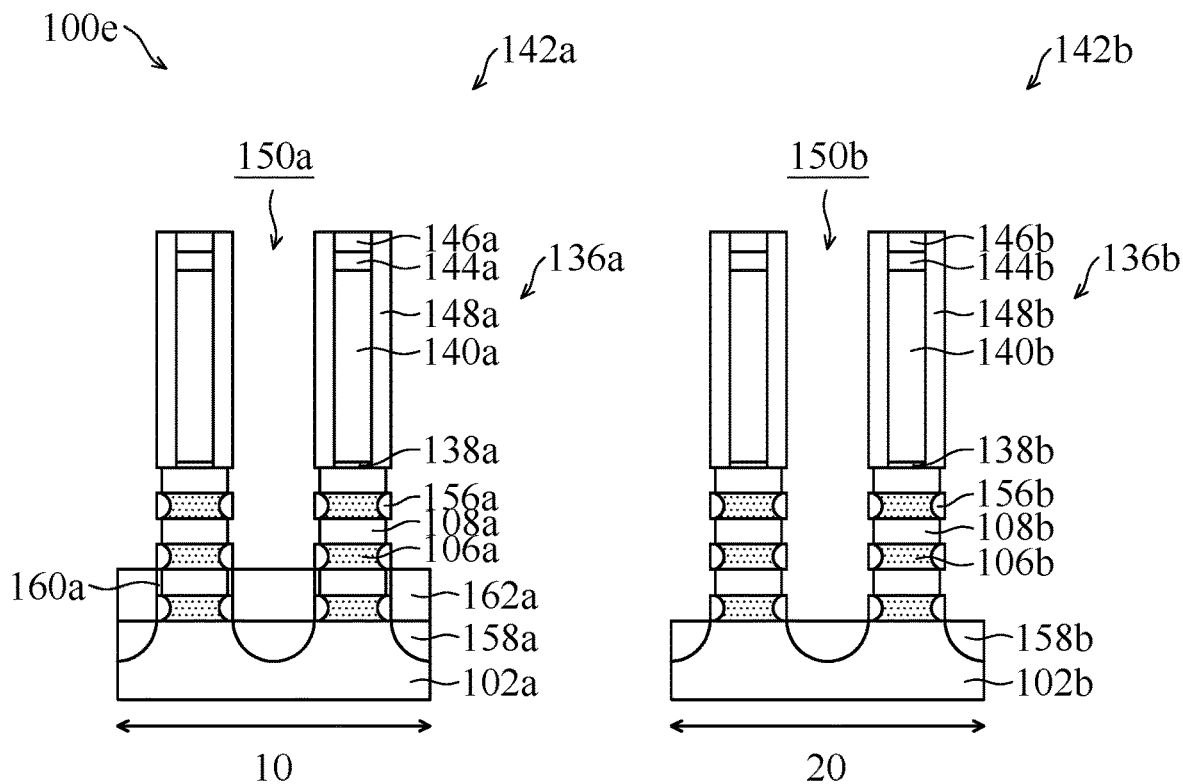
Figures 2, 5F:
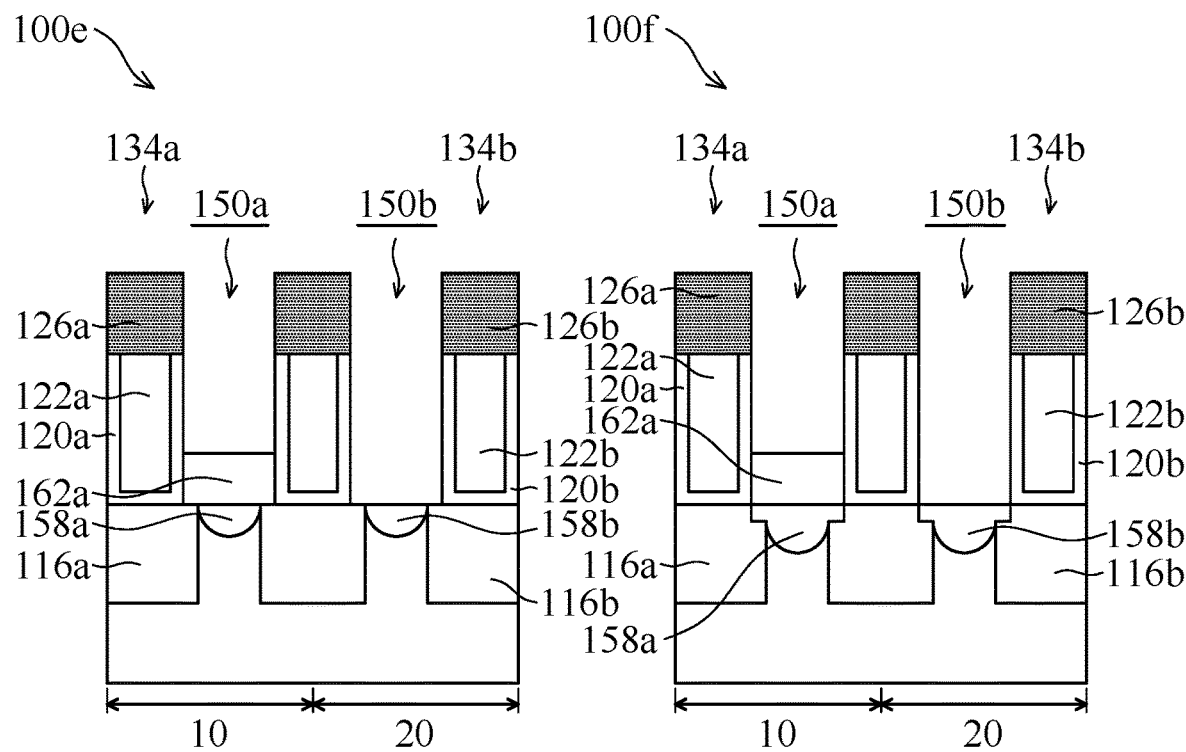
Figures 1, 5G:
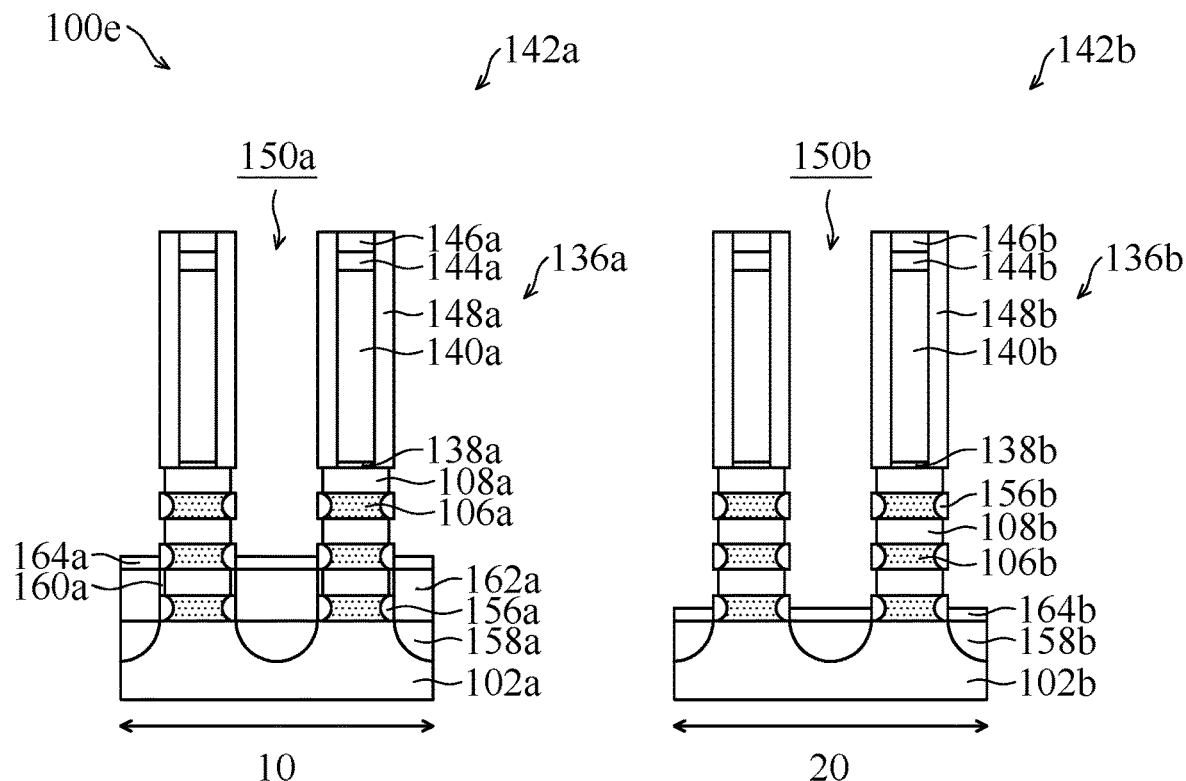
Figures 2, 5G:
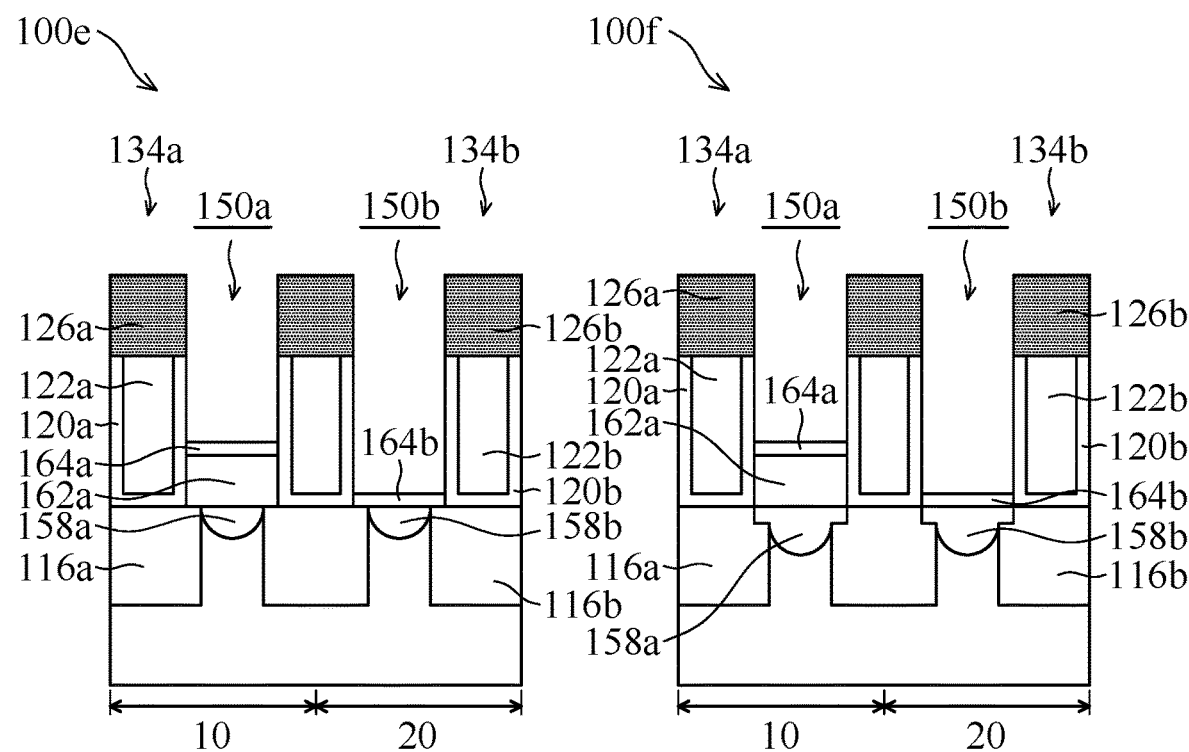
Figures 1, 5H:
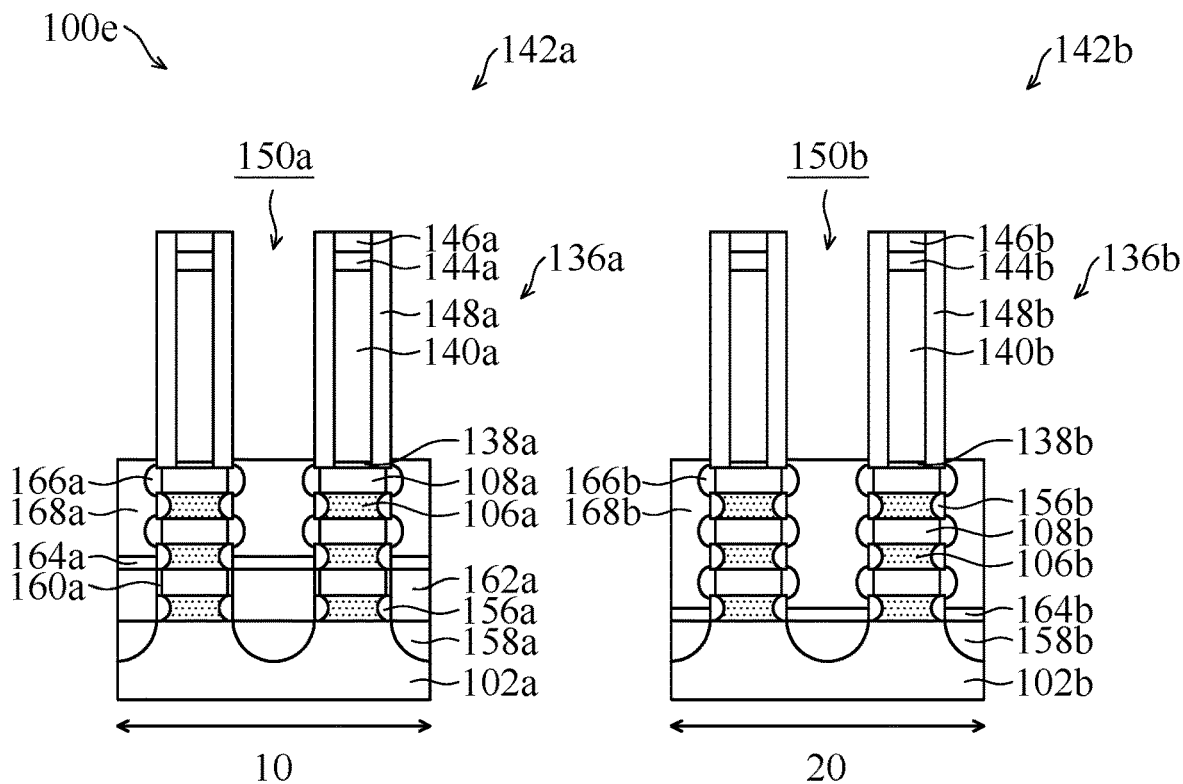
Figures 2, 5H:
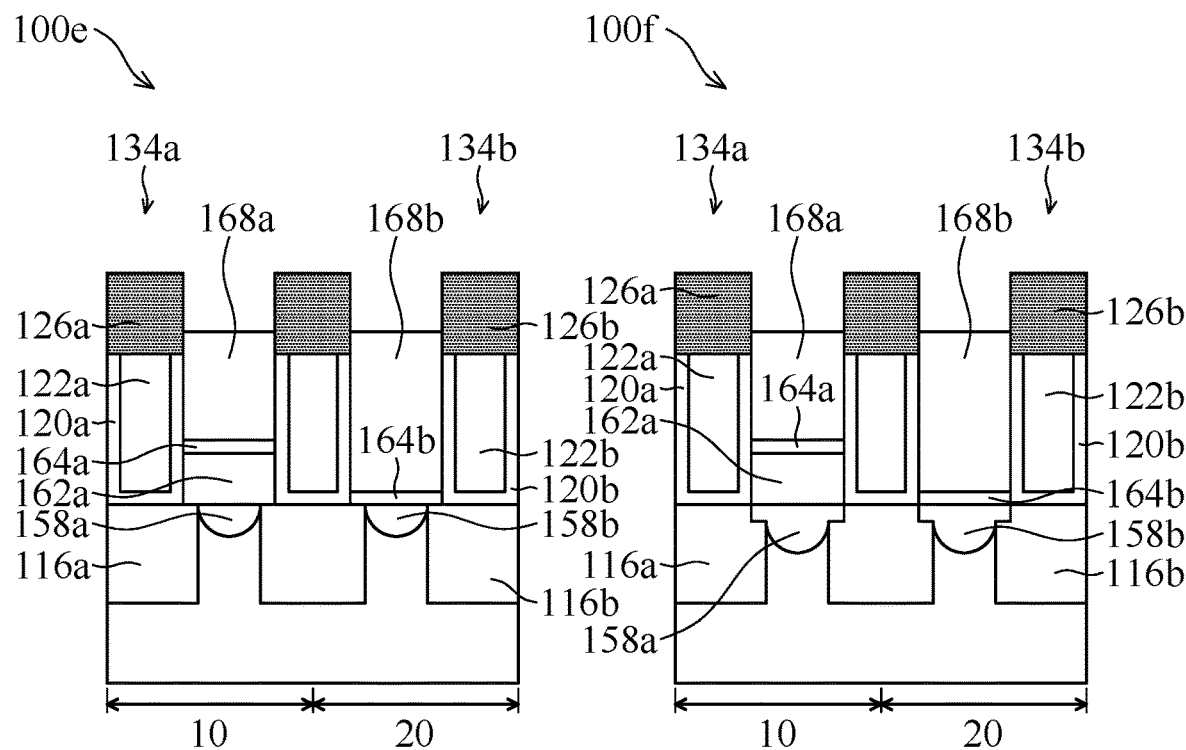
Figures 1, 5I:
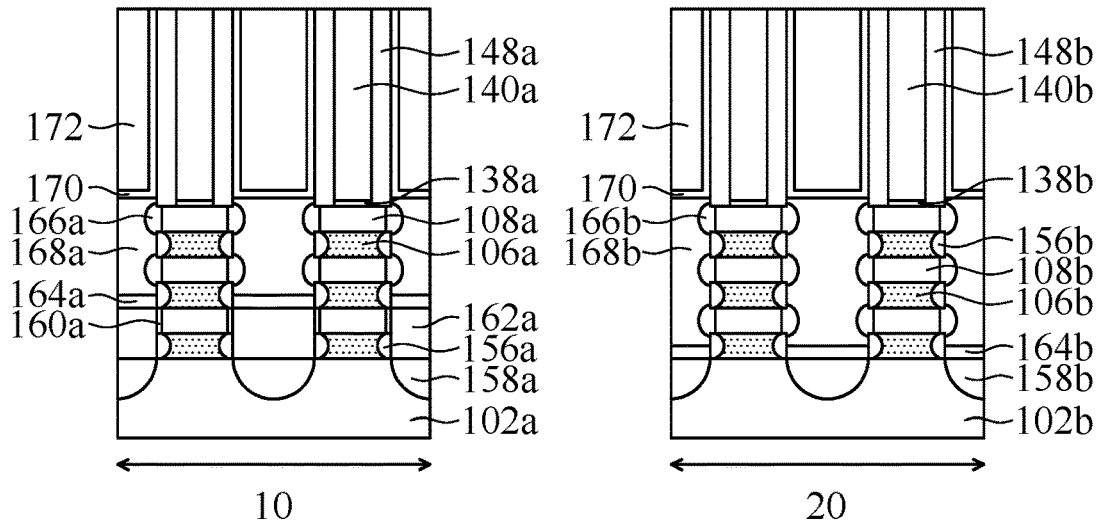
Figures 2, 5I:
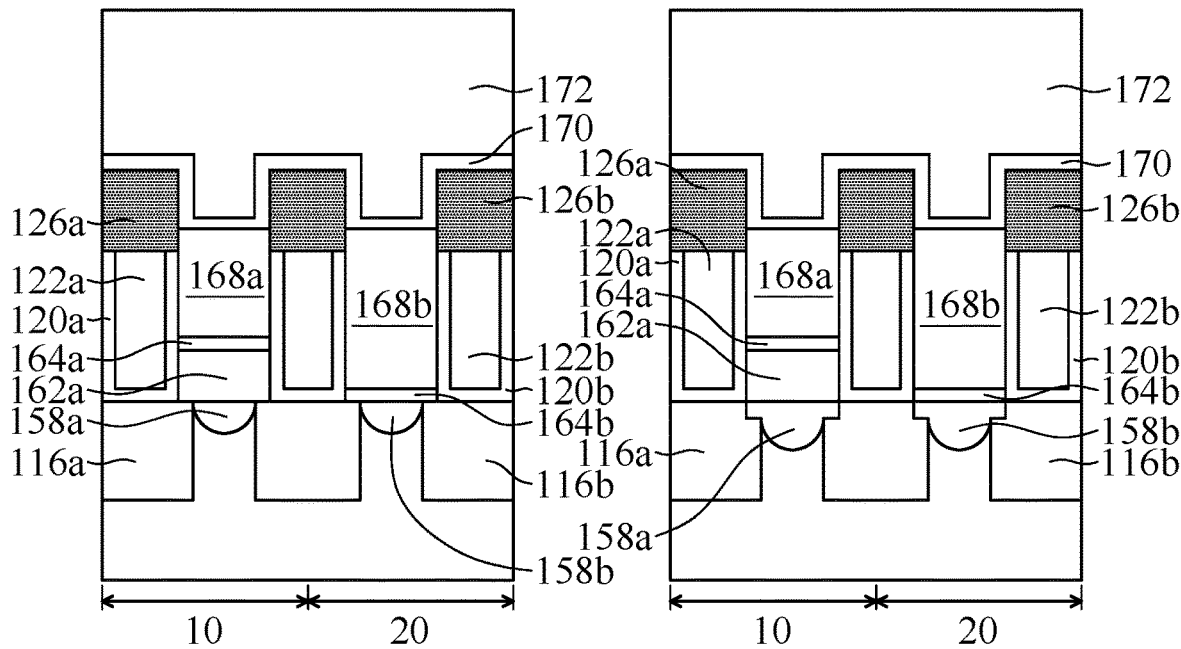
Figures 1, 5J:
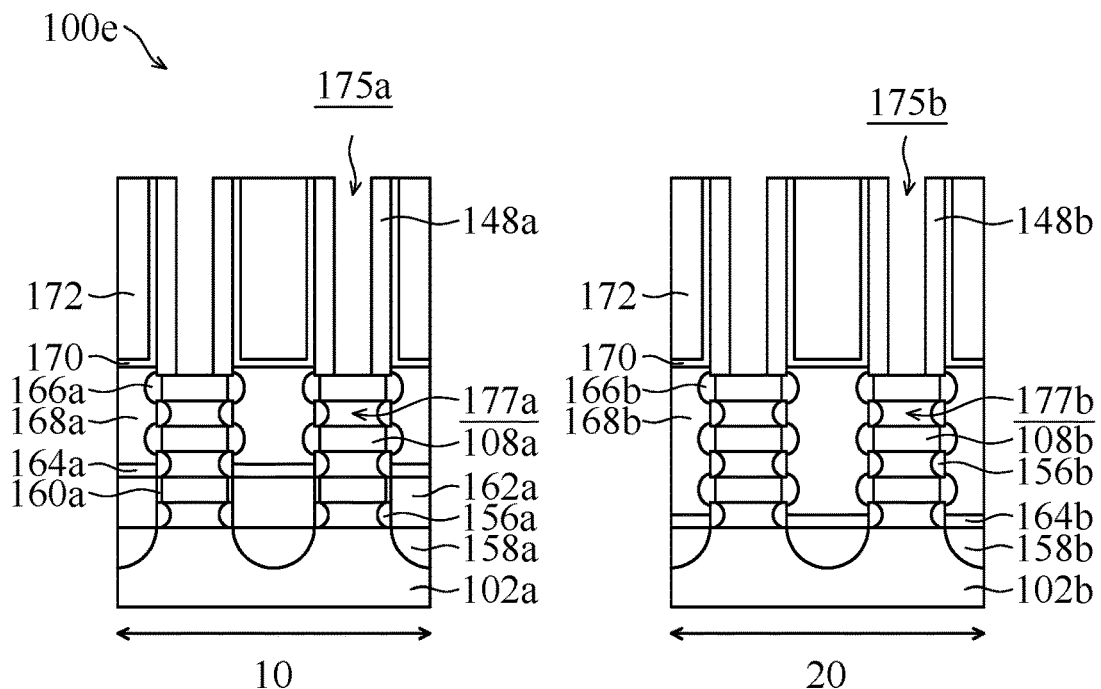
Figures 2, 5J:
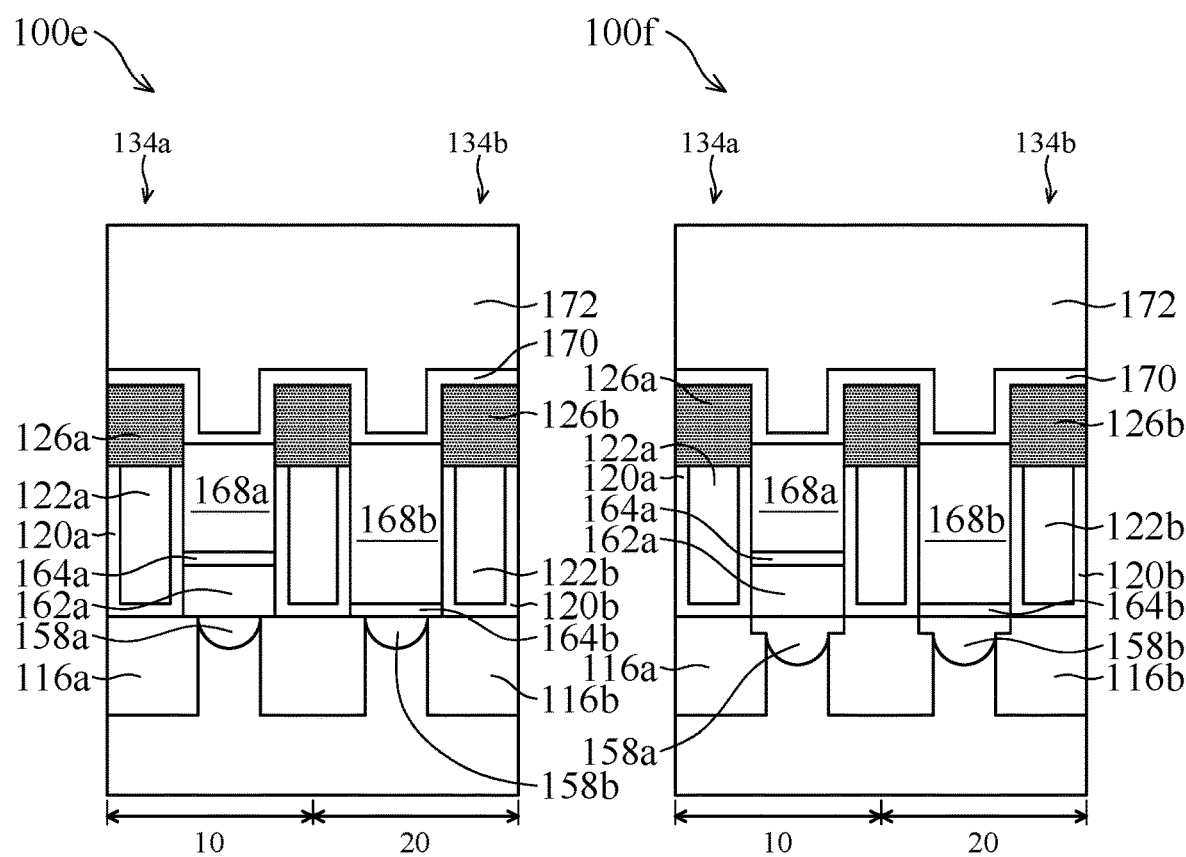
Figures 1, 5K:
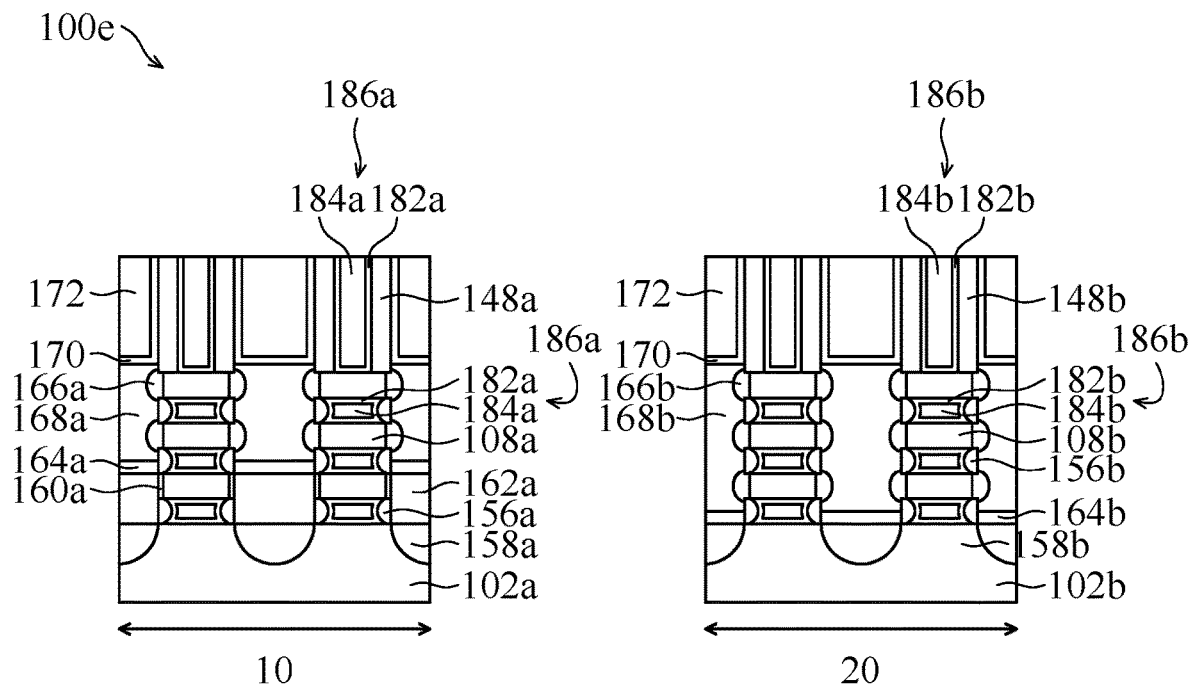
Figures 2, 5K:
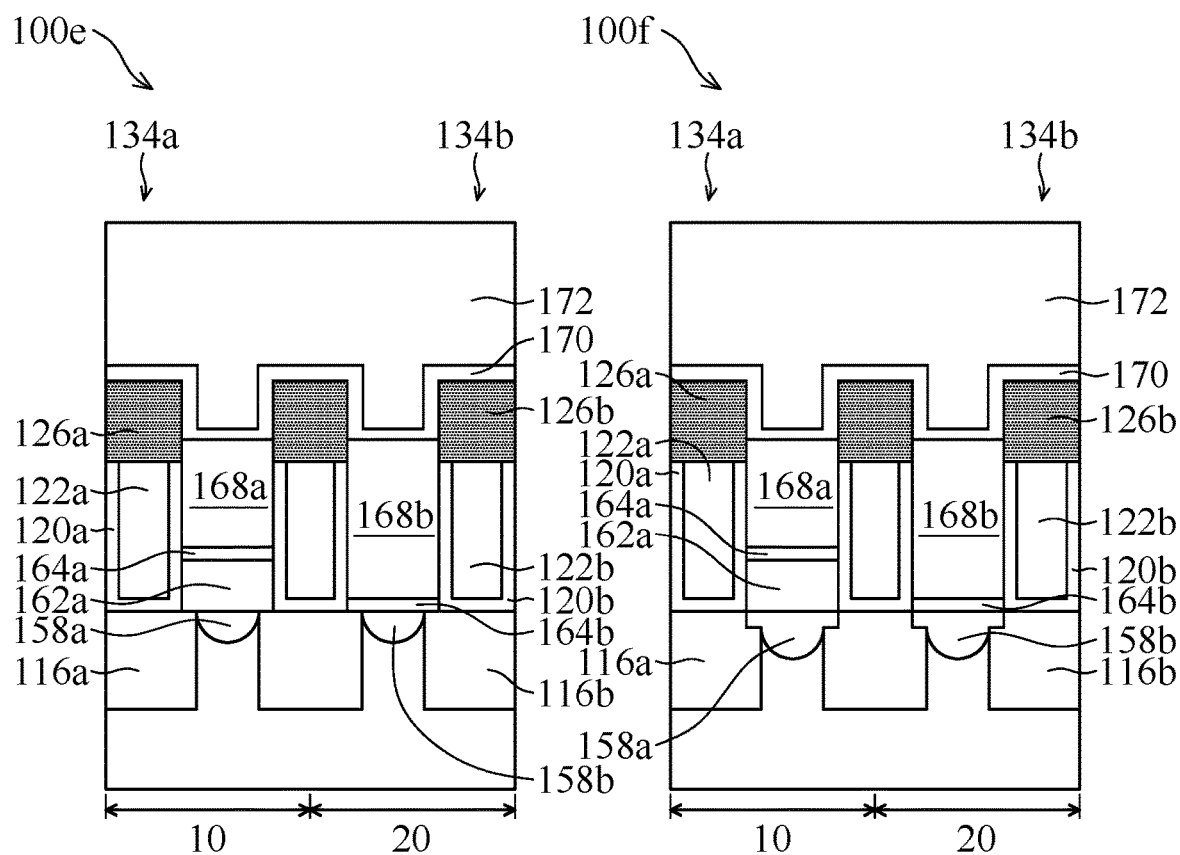

FIGS. 5A-1-5K-1 show cross-sectional representations of various stages of forming a semiconductor device structure 100e, in accordance with some embodiments of the disclosure. FIGS. 5A-2-5K-2 show cross-sectional representations of various stages of forming the semiconductor device structure 100e, in accordance with some embodiments of the disclosure. FIGS. 5A'-2-5K'-2 show cross-sectional representations of various stages of forming the semiconductor device structure 100f.

The semiconductor structure 100e of FIG. 5K-1 is similar to, or the same as, the semiconductor structure 100a of FIG. 3O-1, the difference is that the outer sidewall of the dielectric liner layer 160a is aligned with the outer sidewall of one of the first inner spacers 156a in FIG. 5K-1.

FIG. 5A-1 is similar to, or the same as, FIG. 3D-1, in accordance with some embodiments of the disclosure.

Next, as shown in FIG. 5A-1, the first bottom layer 158a is formed in the first S/D recess 150a over the first region 10, and the second bottom layer 158b is formed in the second S/D recess 150b over the second region 20.

As shown in FIG. 5A-2, the top surface of the first bottom layer 158a is substantially level with the bottom surface of the one first inner spacer 156a. In addition, the top surface of the second bottom layer 158b is substantially level with the bottom surface of the one second inner spacer 156b.

As shown in FIG. 5A'-2, the first bottom layer 158a has an extending portion that extends into a portion of the first isolation structure 116a, and the second bottom layer 158b also has an extending portion that extends into a portion of the second isolation structure 116b.

Next, as shown in FIG. 5B-1, a portion of the second semiconductor layers 108a over the first region 10 and a portion of the second semiconductor layers 108b over the second region 20 are removed to form a first recess 159a and a second recess 159b, in accordance with some embodiments of the disclosure.

A first recessed depth $d_1$ of the first recess 159a is measured from the outer sidewall of the first gate spacer 148a to the outer sidewall of the recessed second semiconductor layers 108b over the first region 10. A second recessed depth $d_2$ of the second recess 159b is measured from the outer sidewall of the second gate spacer 148b to the outer sidewall of the recessed second semiconductor layers 108b over the second region 20.

In some embodiments, the recessed depth $d_1$ of the first recess 159a over the first region 10 is in a range from about 1 nm to about 5 nm. In some embodiments, the recessed depth $d_2$ of the second recess 159b over the second region 20 is in a range from about 1 nm to about 5 nm. In some embodiments, the depth of one of the first inner spacers 156a is in a rage from about 4 nm to about 10 nm.

FIG. 5B-2 is similar to, or the same as, FIG. 5A-2. FIG. 5B'-2 is similar to, or the same as, FIG. 5A'-2, in accordance with some embodiments of the disclosure.

Next, as shown in FIG. 5C-1, the first dielectric liner layer 160a and the second dielectric liner layer 160b are formed over the first dummy gate structure 136a, the second dummy gate structure 136b, the first bottom layer 158a and the second bottom layer 158b, in accordance with some embodiments of the disclosure. Next, a portion of the first dielectric liner layer 160a and a portion of the second dielectric liner layer 160b outside of the first recess 159a and the second recess 159b are removed. As a result, the first dielectric liner layer 160a and the second dielectric liner layer 160b are remaining in the first recess 159a and the second recess 159b. The outer sidewall of the first dielectric liner layer 160a is aligned with the outer sidewall of one of the first inner spacers 156a.

FIG. 5C-2 is similar to, or the same as, FIG. 5B-2. FIG. 5C'-2 is similar to, or the same as, FIG. 5B'-2, in accordance with some embodiments of the disclosure.

Afterwards, as shown in FIG. 5D-1, a first hard mask layer 165a and a second hard mask layer 165b are respectively formed over the first dummy gate structure 136a, and the second dummy gate structure 136b, in accordance with some embodiments of the disclosure.

As shown in FIG. 5D-2, the first hard mask layer 165a and the second hard mask layer 165b are formed over the first cap layer 126a and the second cap layer 126b, in accordance with some embodiments of the disclosure.

FIG. 5D'-2 is similar to, or the same as, FIG. 5D-2, the difference is that the first hard mask layer 165a and the second hard mask layer 165b are formed over the first bottom layer 158a with the extending portion and the second bottom layer 158b with the extending portion.

Next, as shown in FIG. 5E-1, the first hard mask layer 165a is removed to expose the first dielectric liner layer 160a, and the second hard mask 165b is still left over the second region 20, in accordance with some embodiments of the disclosure. Next, the first top layer 162a is formed over the first dielectric liner layer 160a and the first bottom layer 158a. The first hard mask layer 165a is removed by an etching process, such as a wet etching process or a dry etching process.

As shown in FIG. 5E-2, the first top layer 162a is formed over the first liner layer 120a, and the second hard mask layer 165b is still over the second liner layer 120b.

FIG. 5E'-2 is similar to, or the same as, FIG. 5E-2, the difference is that the first top layer 162a is formed over the first bottom layer 158a with an extending portion.

Afterwards, as shown in FIG. 5F-1, a portion of the first dielectric liner layer 160a above the first top layer 162a over the first region 10 is removed, and the second hard mask layer 165b and the second dielectric liner layer 160b over the second region 20 are removed, in accordance with some embodiments of the disclosure.

As shown in FIG. 5F-2, the second hard mask layer 165b is removed. FIG. 5F'-2 is similar to, or the same as, FIG. 5F-2, in accordance with some embodiments of the disclosure.

Next, as shown in FIG. 5G-1, the first insulating layer 164a and the second insulating layer 164b are respectively formed over the first top layer 162a and the second bottom layer 158b, in accordance with some embodiments of the disclosure. The first insulating layer 164a and the first dielectric liner layer 160a are made of different materials.

As shown in FIG. 5G-2, the first insulating layer 164a is formed over the first top layer 162a, and the second insulating layer 164b is formed over the second bottom layer 158b, in accordance with some embodiments of the disclosure.

FIG. 5G'-2 is similar to, or the same as, FIG. 5F-2, the difference is that the first insulating layer 164a is formed over the first bottom layer 158b with the extending portion, in accordance with some embodiments of the disclosure.

Next, as shown in FIG. 5H-1, first S/D structures 166a, 168a are formed over the first insulating layer 164a, and second S/D structures 166b, 168b are formed over the second insulating layer 164b, in accordance with some embodiments of the disclosure.

As shown in FIG. 5H-2, the first S/D structure 168a and the second S/D structure 168b are formed over the first insulating layer 164a and the second insulating layer 164b. The top surface of the first S/D structure 168a is lower than the top surface of the first cap layer 126a and higher than the top surface of the first filling layer 122a. The top surface of the second S/D structure 168b is lower than the top surface of the second cap layer 126b and higher than the top surface of the second filling layer 122b.

FIG. 5H'-2, is similar to, or the same as, FIG. 5H-2, the difference is that the first insulating layer 164a is formed over the first bottom layer 158a with the extending portion, and the second insulating layer 164b is formed over the second bottom layer 158b with the extending portion.

Afterwards, as shown in FIG. 5I-1, the CESL 170 is formed over the first S/D structure 166a, 168a and the second S/D structure 166b, 168b, and the ILD layer 172 is formed over the CESL 170, in accordance with some embodiments.

As shown in FIG. 5I-2, the CESL 170 is formed over the first cap layer 126a and the second cap layer 126b, in accordance with some embodiments of the disclosure.

FIG. 5I'-2, is similar to, or the same as, FIG. 5I-2, the difference is that CESL 170 is formed over the first bottom layer 158a with the extending portion and the second bottom layer 158b with the extending portion.

Next, as shown in FIG. 5J-1, the first dummy gate structure 136a and the second dummy gate structure 136b are removed to form the first trench 175a and the second trench 175b, in accordance with some embodiments of the disclosure. Next, the first semiconductor layer 106a over the first region 10 and the first semiconductor layers 106b over the second region 20 are removed to form a number of first gaps 177a over the first region 10 and a number of second gaps 177b over the second region 20, FIG. 5J-2, is similar to, or the same as, FIG. 5I-2. FIG. 5J'-2, is similar to, or the same as, FIG. 5I'-2, in accordance with some embodiments of the disclosure.

Afterwards, as shown in FIG. 5K-1, the first gate structure 186a is formed in the first trench 175a and the first gaps 177a over the first region 10, the second gate structure 186b is formed in the second trench 175b and the second gaps 177b over the second region 20, in accordance with some embodiments.

FIG. 5K-2, is similar to, or the same as, FIG. 5J-2. FIG. 5K'-2, is similar to, or the same as, FIG. 5J'-2, in accordance with some embodiments of the disclosure.

Figures 1, 6A:
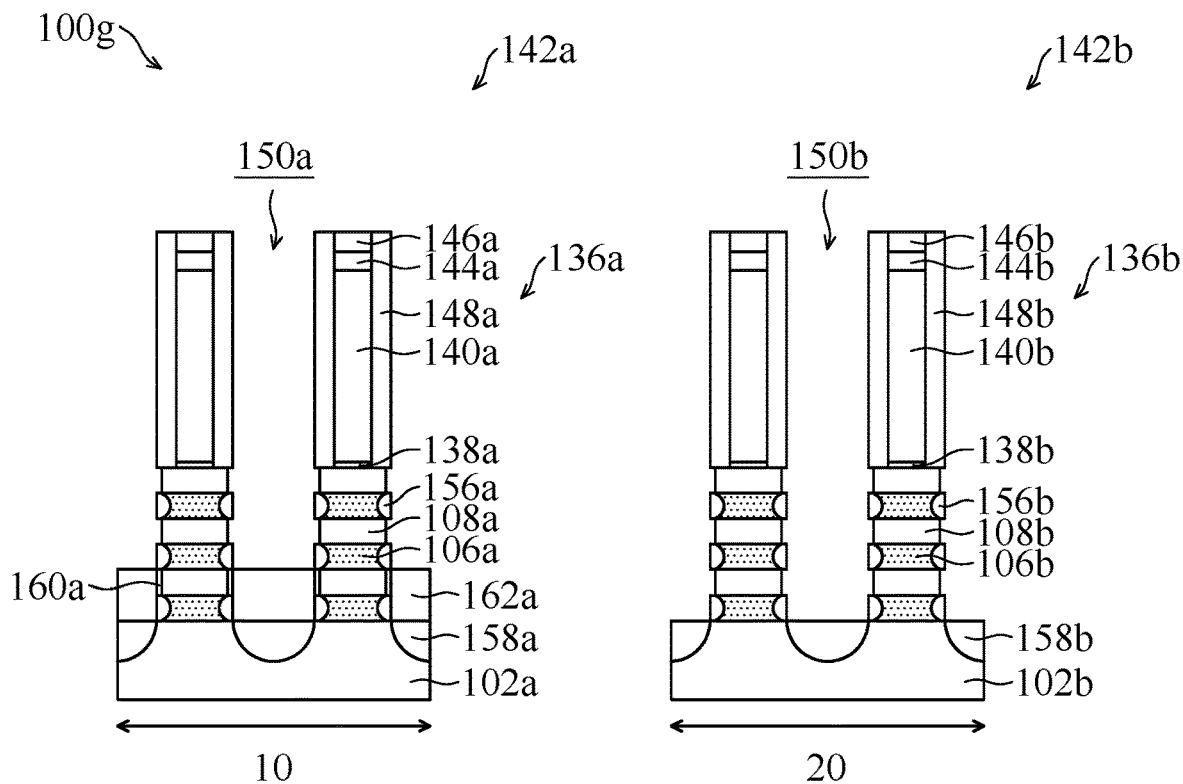
Figures 2, 6A:
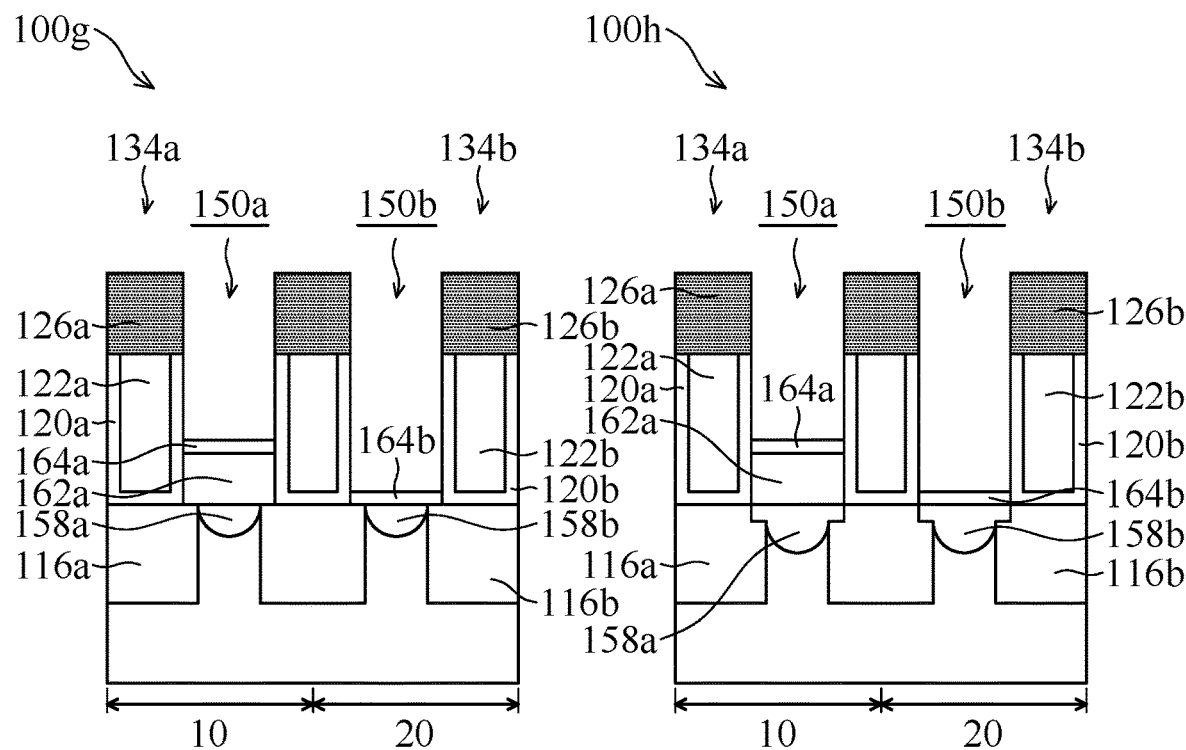
Figures 1, 6B:
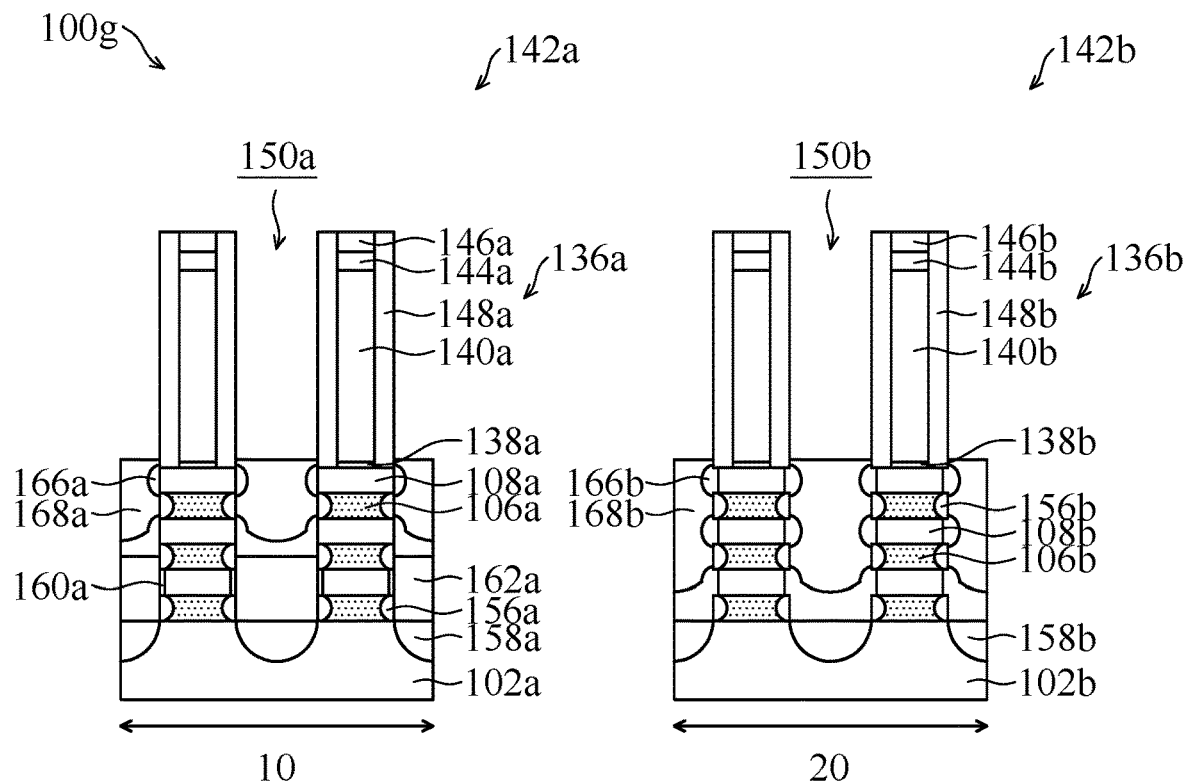
Figures 2, 6B:
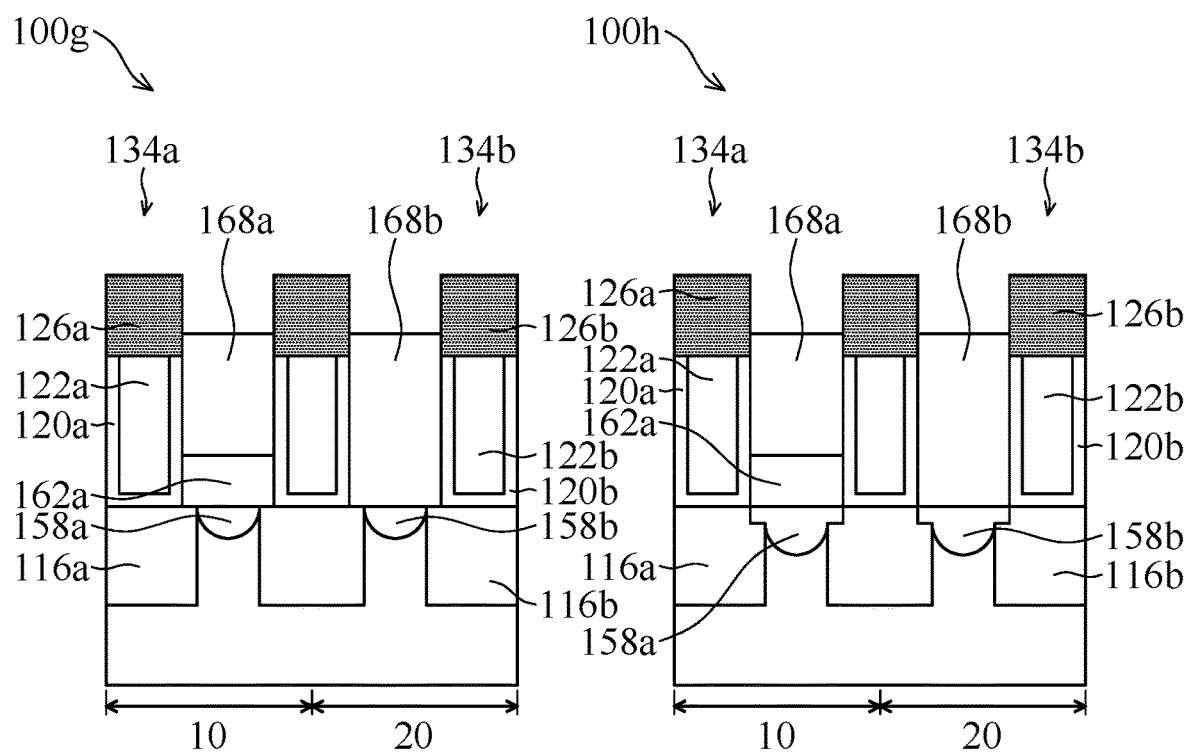
Figures 1, 2, 6C:
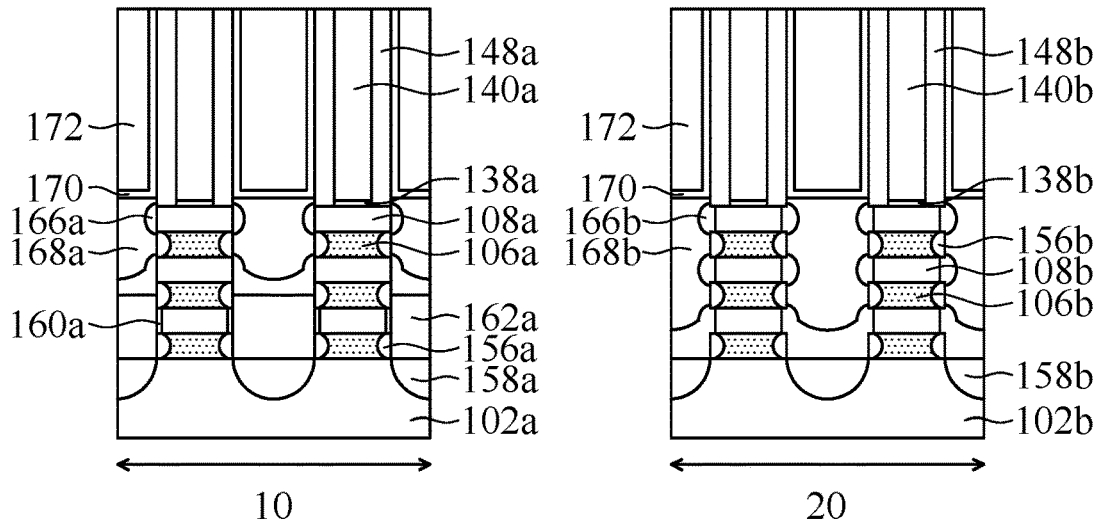
Figures 1, 6D:
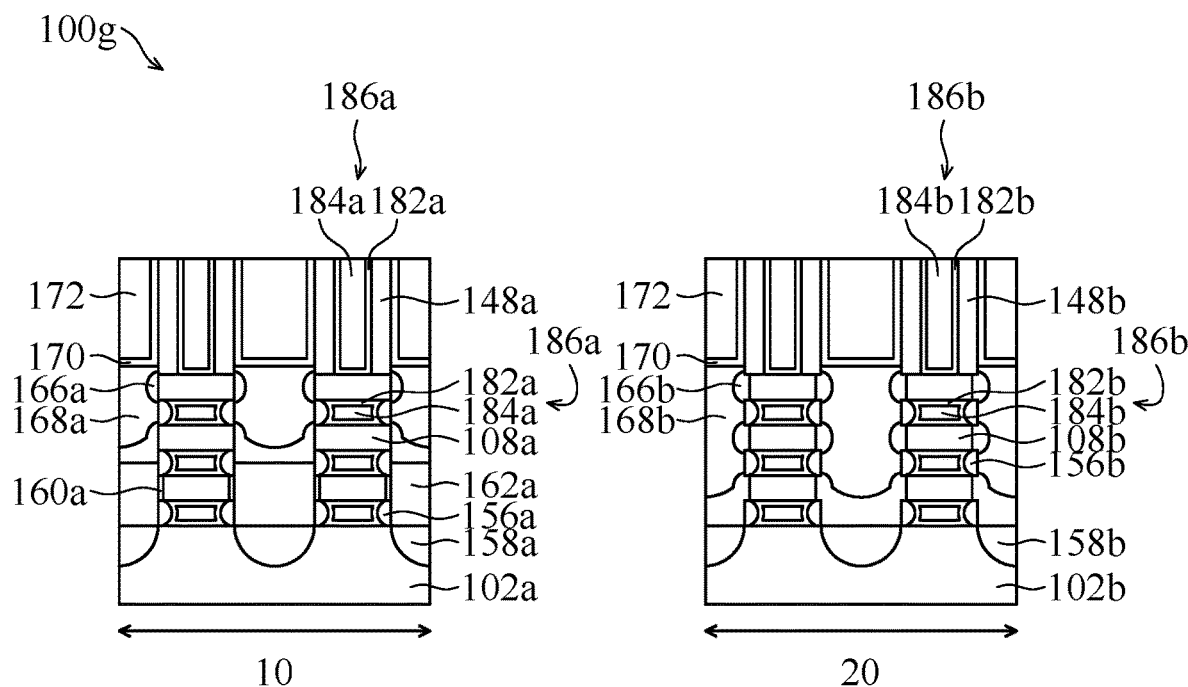
Figures 2, 6D:
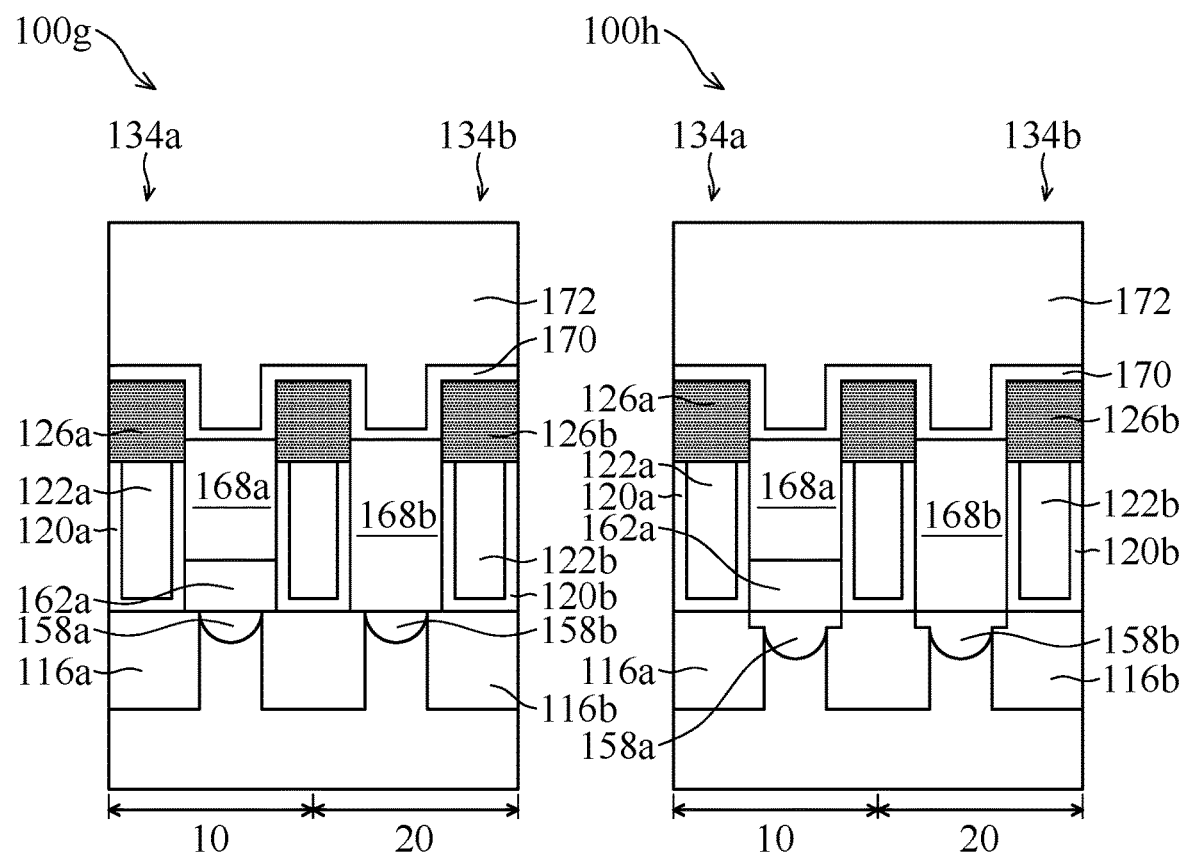

FIGS. 6A-1-6D-1 show cross-sectional representations of various stages of forming a semiconductor device structure 100g, in accordance with some embodiments of the disclosure. FIGS. 6A-2-6D-2 show cross-sectional representations of various stages of forming the semiconductor device structure 100g, in accordance with some embodiments of the disclosure. FIGS. 6A'-2-6D'-2 show cross-sectional representations of various stages of forming the semiconductor device structure 100h. The semiconductor structure 100g of FIG. 6D-1 is similar to, or the same as, the semiconductor structure 100e of FIG. 5K-1, the difference is that no insulating layer over the first top layer 162a, and no insulating layer is over the second bottom layer 158b in FIG. 6D-1.

FIG. 6A-1, is similar to, or the same as, FIG. 5F-1, in accordance with some embodiments of the disclosure. The first top layer 162a is formed over the first dielectric liner layer 160a. The second dielectric liner layer 160b over the second region 20 is completely removed.

FIG. 6A-2, is similar to, or the same as, FIG. 5F-2. FIG. 6A'-2, is similar to, or the same as, FIG. 5A'-2, in accordance with some embodiments of the disclosure.

Afterwards, as shown in FIG. 6B-1, the first S/D structures 166a, 168a are formed over the first insulating layer 164a, and the second S/D structures 166b, 168b are formed over the second insulating layer 164b, in accordance with some embodiments of the disclosure.

As shown in FIG. 6B-2, the first S/D structure 168a and the second S/D structure 168b are formed over the first top layer 162a and the second bottom layer 158b. The top surface of the first S/D structure 168a is lower than the top surface of the first cap layer 126a and higher than the top surface of the first filling layer 122a. The top surface of the second S/D structure 168b is lower than the top surface of the second cap layer 126b and higher than the top surface of the second filling layer 122b.

FIG. 6B'-2, is similar to, or the same as, FIG. 6B-2, the difference is that the first insulating layer 164a is formed over the first bottom layer 158a with the extending portion, and the second insulating layer 164b is formed over the second bottom layer 158b with the extending portion.

Next, as shown in FIG. 6C-1, the CESL 170 is formed over the first S/D structure 166a, 168a and the second S/D structure 166b, 168b, and the ILD layer 172 is formed over the CESL 170, in accordance with some embodiments.

As shown in FIG. 6C-2, the CESL 170 is formed over the first cap layer 126a and the second cap layer 126b, in accordance with some embodiments of the disclosure.

FIG. 6C'-2, is similar to, or the same as, FIG. 6C-2, the difference is that CESL 170 is formed over the first bottom layer 158a with the extending portion and the second bottom layer 158b with the extending portion.

Next, as shown in FIG. 6D-1, the first gate structure 186a is formed over the first region 10, and the second gate structure 186b is formed over the second region 20, in accordance with some embodiments.

FIG. 6D-2, is similar to, or the same as, FIG. 6C-2. FIG. 6D'-2, is similar to, or the same as, FIG. 6C'-2, in accordance with some embodiments of the disclosure.

Figure 7:
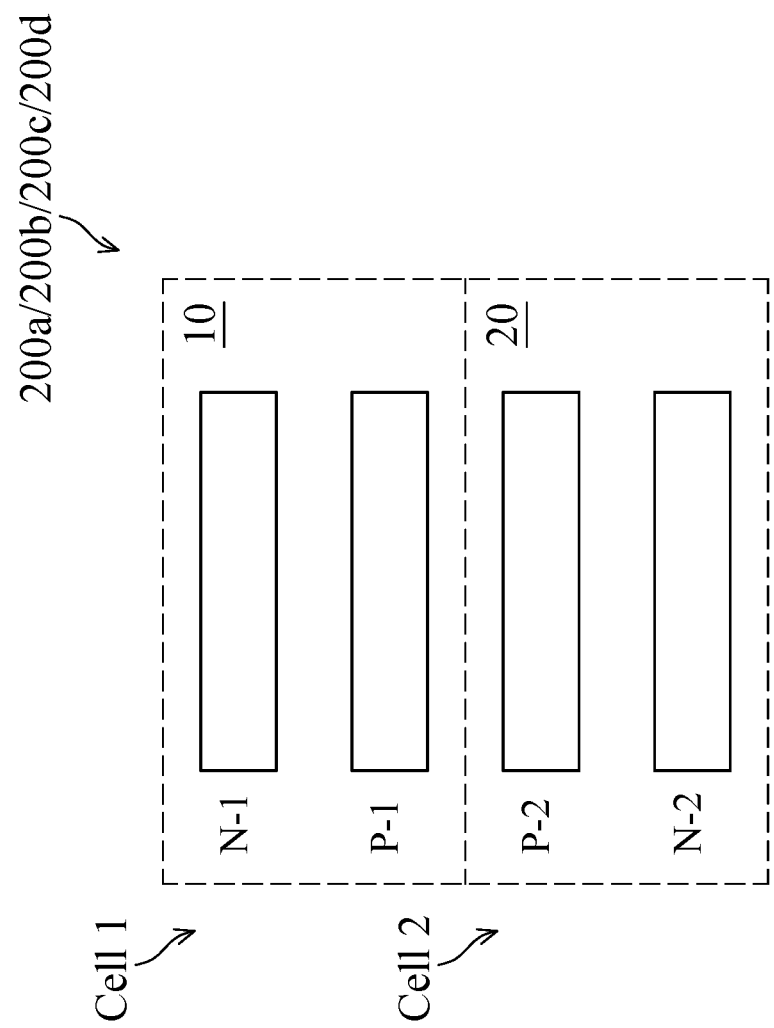
FIG. 7 shows a top view of a semiconductor structure, in accordance with some embodiments.

FIG. 7 shows a top view of a semiconductor structure 200a/200b/200c/200d, in accordance with some embodiments. FIG. 7 has been simplified for the sake of clarity to better understand the inventive concepts of the present disclosure. Additional features may be added in the semiconductor structure 200a/200b/200c/200d, and some of the features described below may be replaced, modified, or eliminated.

As shown in FIG. 7, there is a cell 1 in the first region 10, and a cell 2 in the second region 20. In the first region 10, there is a n-type field effect transistors (NFETs) N-1 and a p-type FET field effect transistors (PFETs) P-1. In the second region 20, there is a n-type field effect transistors (NFETs) N-2 and a p-type FET field effect transistors (PFETs) P-2.

Figure 8:
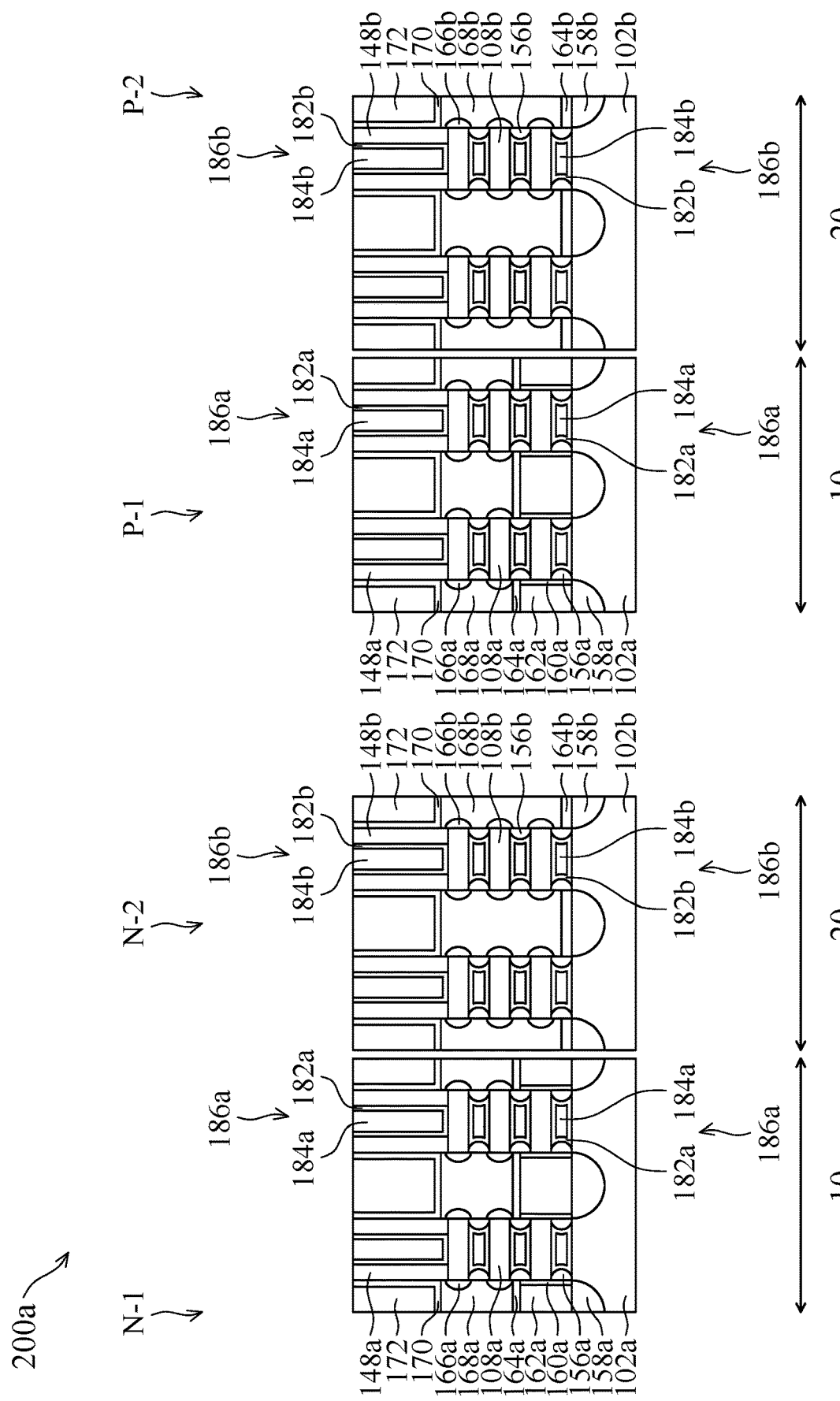
FIG. 8 shows a cross-sectional representation of a semiconductor device structure, in accordance with some embodiments.

FIG. 8 shows a cross-sectional representation of a semiconductor device structure 200a, in accordance with some embodiments. The semiconductor device structure 200a includes the transistor N-1 and the transistor P-1 over the first region 10, and the transistor N-2 and transistor P-2 over the second region 20. The transistor N-1 and transistor N-2 are similar to, or the same as, the semiconductor structure 100a of FIG. 3O-1. The transistor P-1 and transistor P-2 are similar to, or the same as, the semiconductor structure 100a of FIG. 3O-1.

The transistor N-1 has two effective (or active) nanostructures (e.g. second semiconductor layers 108) and the transistor P-1 also has two effective (or active) nanostructures (e.g. second semiconductor layers 108). Therefore, the cell 1 including the transistor N-1 and the transistor P-1 are formed for power efficiency consideration. The transistor N-2 has three effective (or active) nanostructures (e.g. second semiconductor layers 108) and the transistor P-2 also has three effective (or active) nanostructures (e.g. second semiconductor layers 108). Therefore, the cell 2 including the transistor N-2 and the transistor P-2 are formed for speed performance consideration.

In some embodiments, for p-type transistors, the S/D structure 166a, 166b, 168a, 168b include silicon germanium or germanium and can be doped with boron, other p-type dopant, or combinations thereof (for example, forming Si:Ge:B epitaxial S/D structures). In some embodiments, for n-type transistors, the S/D structure 166a, 166b, 168a, 168b include silicon and can be doped with carbon, phosphorous, arsenic, other n-type dopant, or combinations thereof (for example, forming Si:C epitaxial S/D structure, Si:P epitaxial S/D structures, or Si:C:P epitaxial S/D structures).

Figure 9:
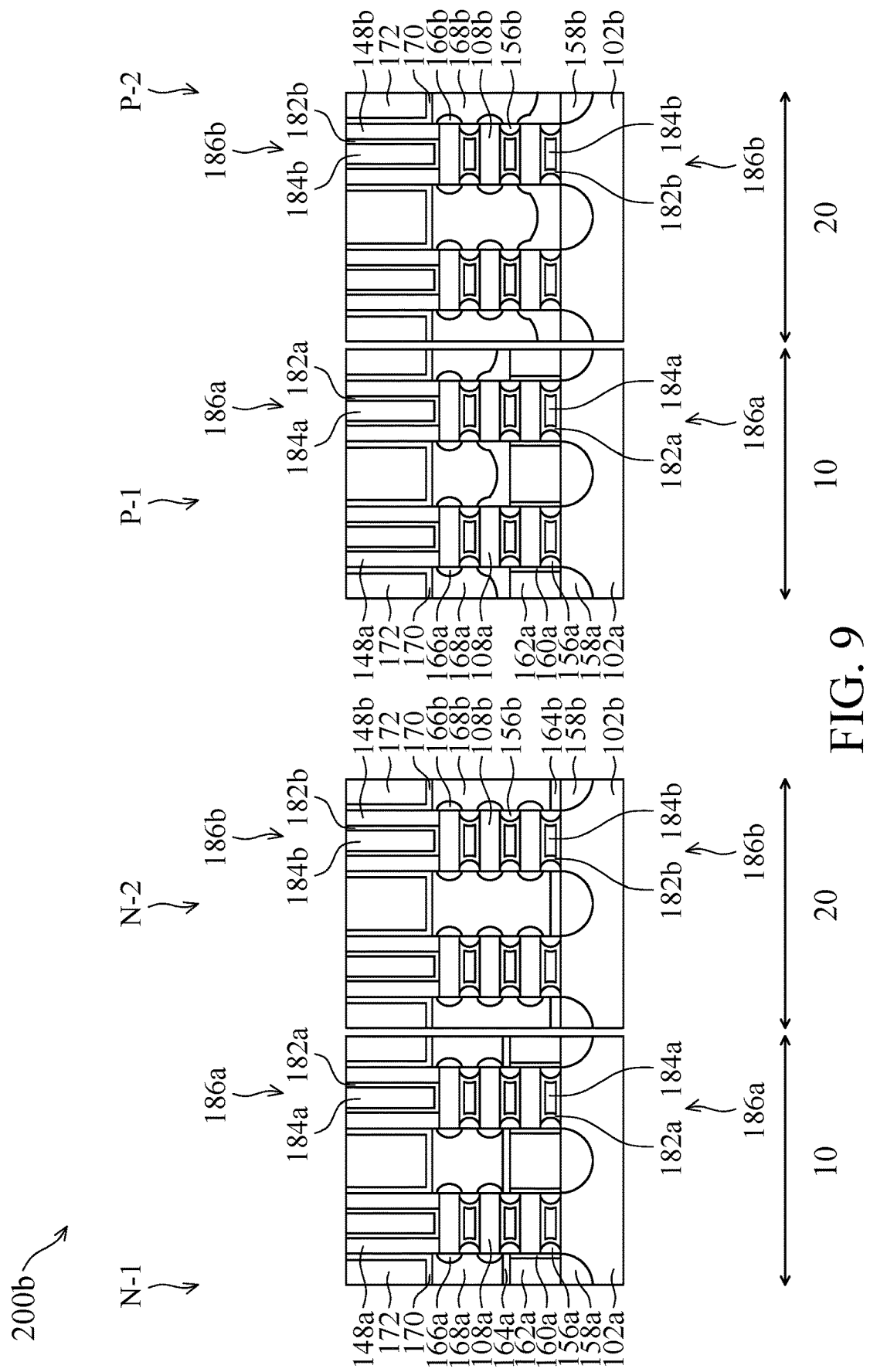
FIG. 9 shows a cross-sectional representation of a semiconductor device structure, in accordance with some embodiments.

FIG. 9 shows a cross-sectional representation of a semiconductor device structure 200b, in accordance with some embodiments. The semiconductor device structure 200b includes the transistor N-1 and the transistor P-1 over the first region 10, and the transistor N-2 and transistor P-2 over the second region 20. The transistor N-1 and transistor N-2 are similar to, or the same as, the semiconductor structure 100a of FIG. 3O-1. The transistor P-1 and transistor P-2 are similar to, or the same as, the semiconductor structure 100c of FIG. 4D-1.

The transistor N-1 has two effective (or active) nanostructures (e.g. second semiconductor layers 108) and the transistor P-1 also has two effective (or active) nanostructures (e.g. second semiconductor layers 108). Therefore, the cell 1 including the transistor N-1 and the transistor P-1 are formed for power efficiency consideration. The transistor N-2 has three effective (or active) nanostructures (e.g. second semiconductor layers 108) and the transistor P-2 also has three effective (or active) nanostructures (e.g. second semiconductor layers 108). Therefore, the cell 2 including the transistor N-2 and the transistor P-2 are formed for speed performance consideration.

Figure 10:
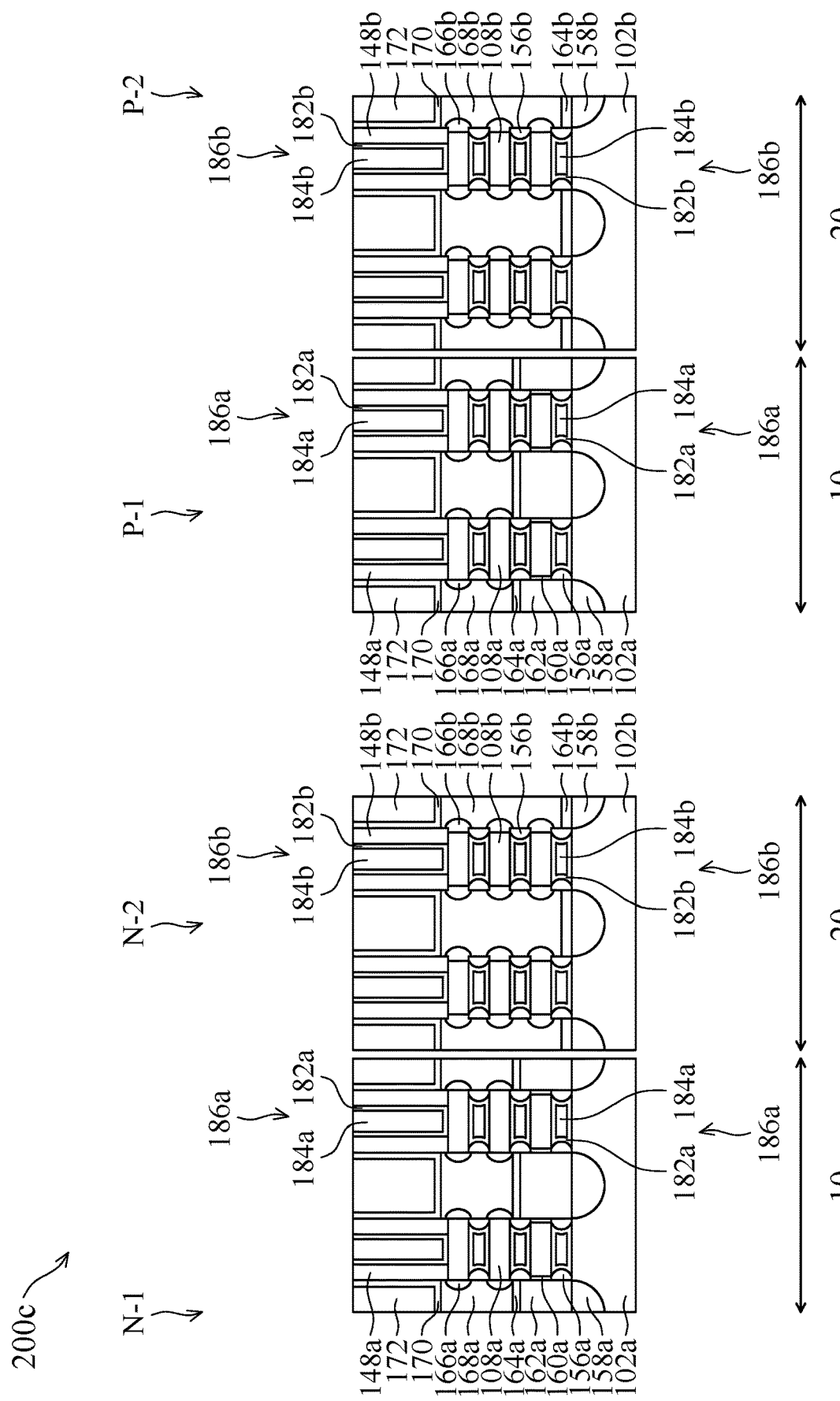
FIG. 10 shows a cross-sectional representation of a semiconductor device structure, in accordance with some embodiments.

FIG. 10 shows a cross-sectional representation of a semiconductor device structure 200c, in accordance with some embodiments. The semiconductor device structure 200c includes the transistor N-1 and the transistor P-1 over the first region 10, and the transistor N-2 and transistor P-2 over the second region 20. The transistor N-1 and transistor N-2 are similar to, or the same as, the semiconductor structure 100a of FIG. 5K-1. The transistor P-1 and transistor P-2 are similar to, or the same as, the semiconductor structure 100e of FIG. 5K-1.

The transistor N-1 has two effective (or active) nanostructures (e.g. second semiconductor layers 108) and the transistor P-1 also has two effective (or active) nanostructures (e.g. second semiconductor layers 108). Therefore, the cell 1 including the transistor N-1 and the transistor P-1 are formed for power efficiency consideration. The transistor N-2 has three effective (or active) nanostructures (e.g. second semiconductor layers 108) and the transistor P-2 also has three effective (or active) nanostructures (e.g. second semiconductor layers 108). Therefore, the cell 2 including the transistor N-2 and the transistor P-2 are formed for speed performance consideration.

Figure 11:
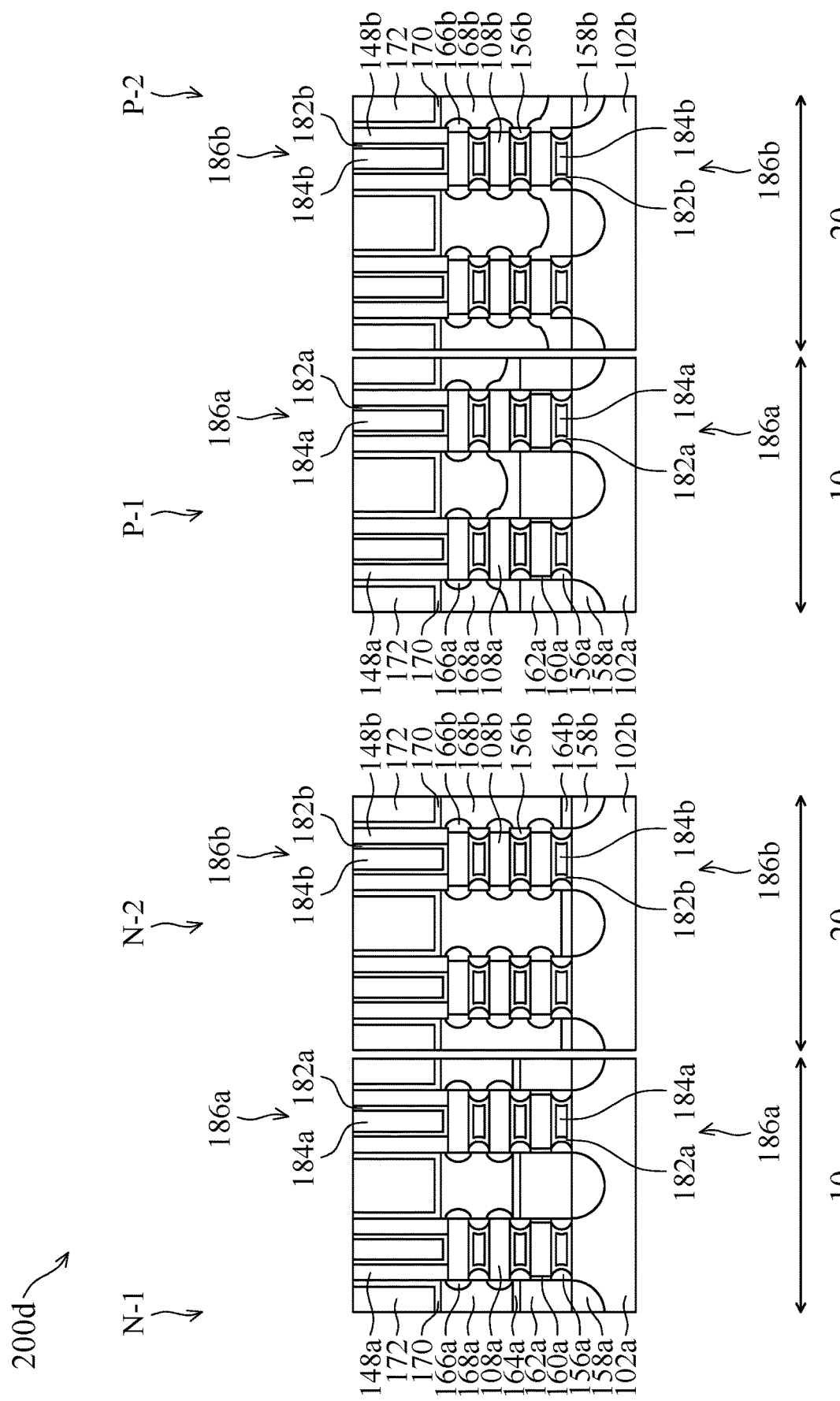
FIG. 11 shows a cross-sectional representation of a semiconductor device structure, in accordance with some embodiments.

FIG. 11 shows a cross-sectional representation of a semiconductor device structure 200d, in accordance with some embodiments. The semiconductor device structure 200d includes the transistor N-1 and the transistor P-1 over the first region 10, and the transistor N-2 and transistor P-2 over the second region 20. The transistor N-1 and transistor N-2 are similar to, or the same as, the semiconductor structure 100a of FIG. 5K-1. The transistor P-1 and transistor P-2 are similar to, or the same as, the semiconductor structure 100g of FIG. 6D-1.

Embodiments for forming a semiconductor device structure and method for formation the same are provided. The first fin structure formed over a substrate, and the first fin structure includes a number of nanostructures. A first bottom layer adjacent to the first fin structure, and a first dielectric liner layer formed over the first bottom layer. The inner sidewall or the outer sidewall of the first dielectric liner layer may be aligned with the outer sidewall of an inner spacer. A first S/D structure formed over the first dielectric liner layer. The top surface of the first dielectric liner layer is higher than the bottommost nanostructure. In addition, an insulting layer formed over the first dielectric liner layer.

The effective (or active) nanostructures are controlled by defining the location of the first dielectric liner layer and the first insulating layer. The multi-nanostructures co-exist by controlling the locations of the first dielectric liner layer and the first insulating layer. More effective (or active) nanostructures can improve the speed of the semiconductor device structure, fewer effective (or active) nanostructures can increase the power efficiency. Therefore, the semiconductor device structure can include more effective (or active) nanostructures in a region for speed performance consideration and fewer effective (or active) nanostructures in another region for power efficiency consideration. Therefore, the performance of semiconductor device structure is improved.

In some embodiments, a semiconductor device structure is provided. The semiconductor device structure includes a plurality of first nanostructures stacked over a substrate in a vertical direction. The semiconductor device structure also includes a first bottom layer formed adjacent to the first nanostructures, and a first dielectric liner layer formed over the first bottom layer and adjacent to the first nanostructures. The semiconductor device structure further includes a first source/drain (S/D) structure formed over the dielectric liner layer, and the first S/D structure is isolated from the first bottom layer by the first dielectric liner layer.

In some embodiments, a semiconductor device structure is provided. The semiconductor device structure includes a substrate, and the substrate comprises a first region and a second region. The semiconductor device structure includes a plurality of first nanostructures stacked over the first region in a vertical direction. The semiconductor device structure includes a plurality of second nanostructures stacked over the second region in a vertical direction. The semiconductor device structure includes a first dielectric liner layer adjacent to the first nanostructures, and a first insulating layer formed over the dielectric liner layer. The semiconductor device structure also includes a first S/D structure formed over the first insulating layer, and a second insulating layer formed adjacent to the second nanostructures. The semiconductor device structure includes a second S/D structure formed over the second insulating layer, and the top surface of the first insulating layer is higher than the top surface of the second insulating layer.

In some embodiments, a method for forming a semiconductor device structure is provided. The method includes forming a first fin structure and a second fin structure over a substrate, and the first fin structure includes a plurality of first nanostructures stacked in a vertical direction, and the second fin structure includes a plurality of second nanostructures stacked in a vertical direction. The method includes forming a dummy gate structure over the first fin structure and the second fin structure, and removing a portion of the first fin structure and a second fin structure to form a first recess and a second recess. The method includes forming a first bottom layer in the first recess and a second bottom layer in the second recesses. The method includes forming a first dielectric liner layer over the first bottom layer, and forming a first top layer over the first dielectric liner layer. The method includes forming a first source/drain (S/D) structure over the first top layer and a second S/D structure over the second bottom layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a plurality of first nanostructures stacked over a substrate in a vertical direction;
   a first bottom layer formed adjacent to the plurality of first nanostructures;
   a first dielectric liner layer formed over the first bottom layer and adjacent to the plurality of first nanostructures, wherein the first dielectric liner layer covers a sidewall surface of a bottommost first nanostructure; and
   a first source/drain (S/D) structure formed over the first dielectric liner layer, wherein the first S/D structure is isolated from the first bottom layer by the first dielectric liner layer.

2. The semiconductor device structure as claimed in claim 1, further comprising:
   a first top layer formed over the first bottom layer, wherein the first dielectric liner layer is formed on opposite sidewalls of the first top layer.

3. The semiconductor device structure as claimed in claim 1, further comprising:
   a gate structure surrounding the plurality of first nanostructures; and
   an inner spacer between the gate structure and the first S/D structure, wherein the inner spacer is in direct contact with the first dielectric liner layer.

4. The semiconductor device structure as claimed in claim 3, wherein a top surface of the first dielectric liner layer is lower than a top surface of the inner spacer.

5. The semiconductor device structure as claimed in claim 3, wherein an outer surface of the first dielectric liner layer is aligned with an outer surface of the inner spacer.

6. The semiconductor device structure as claimed in claim 1, further comprising:
a first insulating layer formed over the first dielectric liner layer, and the first S/D structure is isolated from the first bottom layer by the first insulating layer.

7. The semiconductor device structure as claimed in claim 6, wherein the first insulating layer is higher than a top surface of a bottommost nanostructure of the plurality of first nanostructures.

8. The semiconductor device structure as claimed in claim 1, further comprising:
a plurality of second nanostructures stacked over the substrate in a vertical direction;
a second bottom layer formed adjacent to the plurality of second nanostructures; and
a second insulating layer formed over the second bottom layer, wherein the second insulating layer is lower than a top surface of a bottommost second nanostructure.

9. The semiconductor device structure as claimed in claim 8, further comprising:
a dielectric feature between the plurality of first nanostructures and the plurality of second nanostructures, wherein the dielectric feature comprises a liner layer and a filling layer formed over the liner layer, wherein the first dielectric liner layer is in direct contact with the liner layer of the dielectric feature.

10. A semiconductor device structure, comprising:
a substrate, wherein the substrate comprises a first region and a second region;
a plurality of first nanostructures stacked over the first region in a vertical direction;
a plurality of second nanostructures stacked over the second region in the vertical direction
a first dielectric liner layer adjacent to the plurality of first nanostructures;
a first insulating layer formed over the first dielectric liner layer;
a first S/D structure formed over the first insulating layer;
a second insulating layer formed adjacent to the plurality of second nanostructures; and
a second S/D structure formed over the second insulating layer, wherein a top surface of the first insulating layer is higher than a top surface of the second insulating layer.

11. The semiconductor device structure as claimed in claim 10, wherein a first height of the first S/D structure is smaller than a second height of the second S/D structure.

12. The semiconductor device structure as claimed in claim 10, further comprising:
a first gate structure surrounding the plurality of first nanostructures; and
an inner spacer between the first gate structure and the first S/D structure, wherein the inner spacer is in direct contact with the first dielectric liner layer.

13. The semiconductor device structure as claimed in claim 12, wherein an outer surface of the first dielectric liner layer is aligned with an outer surface of the inner spacer.

14. The semiconductor device structure as claimed in claim 10, further comprising:
a first bottom layer formed below the first dielectric liner layer; and
a first top layer formed over the first bottom layer, wherein the first dielectric liner layer is formed on opposite sidewalls of the first top layer.

15. The semiconductor device structure as claimed in claim 10, further comprising:
a dielectric feature between the plurality of first nanostructures and the plurality of second nanostructures, wherein the dielectric feature comprises a liner layer and a filling layer formed over the liner layer, and a cap layer formed over the liner layer and the filling layer, wherein a top surface of the cap layer is higher than a top surface of the first S/D structure.

16. The semiconductor device structure as claimed in claim 14, wherein the first bottom layer is made of un-doped Si, un-doped SiGe or a combination thereof.

17. A semiconductor device structure, comprising;
a substrate, wherein the substrate comprises a first region and a second region;
a plurality of first nanostructures stacked over the first region in a vertical direction;
a plurality of second nanostructures stacked over the second region in the vertical direction;
a first bottom layer adjacent to the plurality of first nanostructures;
a first dielectric liner layer formed on the first bottom layer, wherein the first dielectric liner layer is in direct contact with a bottommost first nanostructure;
a first S/D structure formed over the first dielectric liner layer;
a second bottom layer formed adjacent to the plurality of second nanostructures; and
a second S/D structure formed over the second bottom layer, wherein a bottom surface of the first S/D structure is higher than a bottom surface of the second S/D structure.

18. The semiconductor device structure as claimed in claim 17, further comprising:
a first gate structure surrounding the plurality of first nanostructures; and
an inner spacer between the first gate structure and the first S/D structure, wherein the inner spacer is in direct contact with the first dielectric liner layer.

19. The semiconductor device structure as claimed in claim 17, further comprising:
a dielectric feature between the plurality of first nanostructures and the plurality of second nanostructures, wherein the dielectric feature is in direct contact with the first dielectric liner layer.

20. The semiconductor device structure as claimed in claim 17, further comprising:
a first top layer formed over the first bottom layer, wherein the first dielectric liner layer is between the first bottom layer and the first top layer.

* * * * *